United States Patent [19]

Stich et al.

[11] Patent Number: 5,182,518
[45] Date of Patent: Jan. 26, 1993

[54] INVERTER AND BATTERY TESTING FOR UNINTERRUPTIBLE POWER SYSTEMS

[75] Inventors: Frederick A. Stich, Wisconsin Rapids; Richard V. Baxter, Jr., Neenah; Herbert A. Podewils, Sparta; David L. Layden, New Lisbon, all of Wis.

[73] Assignee: Best Power Technology, Inc., Necedah, Wis.

[21] Appl. No.: 685,068

[22] Filed: Apr. 11, 1991

[51] Int. Cl.[5] ............... G01R 31/02; G01R 31/36; H02J 9/04

[52] U.S. Cl. .................. 324/511; 324/427; 307/66

[58] Field of Search ........... 324/426, 427, 511, 510, 324/537; 307/66

[56] References Cited

U.S. PATENT DOCUMENTS

| | | |
|---|---|---|
| 3,925,772 | 12/1975 | Miller et al. |
| 4,388,615 | 6/1983 | Ford et al. ............ 307/66 X |
| 4,528,458 | 7/1985 | Nelson et al. ............ 307/66 X |
| 4,692,854 | 9/1987 | Baxter, Jr. et al. |
| 4,703,193 | 10/1987 | Kawabata ............ 307/66 |
| 4,709,318 | 11/1987 | Gephart et al. ............ 307/66 |
| 4,876,513 | 10/1989 | Brilmyer et al. ............ 324/427 |
| 5,057,697 | 10/1991 | Hammond et al. ............ 307/66 X |
| 5,117,324 | 5/1992 | Johnson, Jr. ............ 307/66 X |

*Primary Examiner*—Gerard R. Strecker
*Assistant Examiner*—Diep Do
*Attorney, Agent, or Firm*—Foley & Lardner

[57] ABSTRACT

The inverter of an uninterruptible power system is tested by turning on switches in the inverter at a selected test phase in each half-cycle of the AC input waveform so that the inverter provides a voltage which opposes the AC input voltage waveform during part of each half-cycle of the waveform. The resulting current drawn from the inverter battery, if any, is measured and its peak may be found. The peak battery current during each half-cycle is compared to maximum allowable peak currents to determine if an inverter failure has occurred. If the peak currents are lower than a maximum acceptable value, the test is repeated on a subsequent AC input waveform at a decreased test phase (a shorter time delay from the zero crossing of each half-cycle of the waveform) until the peak current in the first half-cycle is at a selected value, at which time the peak in the second half-cycle is checked to determine if it is within an acceptable range. If not, an inverter test failure is indicated. Inverter test failure is also indicated if repeated cycles during which the test phase is reduced fail to cause the first peak to reach the proper value and the test phase is finally reduced to a minimum allowable test phase. If the inverter has been tested and is found to be operating properly, a battery test can be conducted by selectively disconnecting the AC power system from the load, turning on the inverter for a selected period of time, and detrmining remaining available run time based on the battery voltage while the inverter was running.

43 Claims, 42 Drawing Sheets

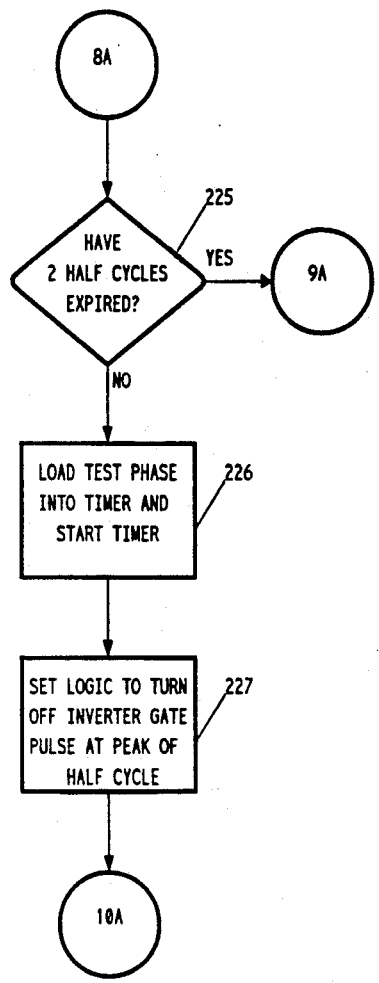
FIG. 8
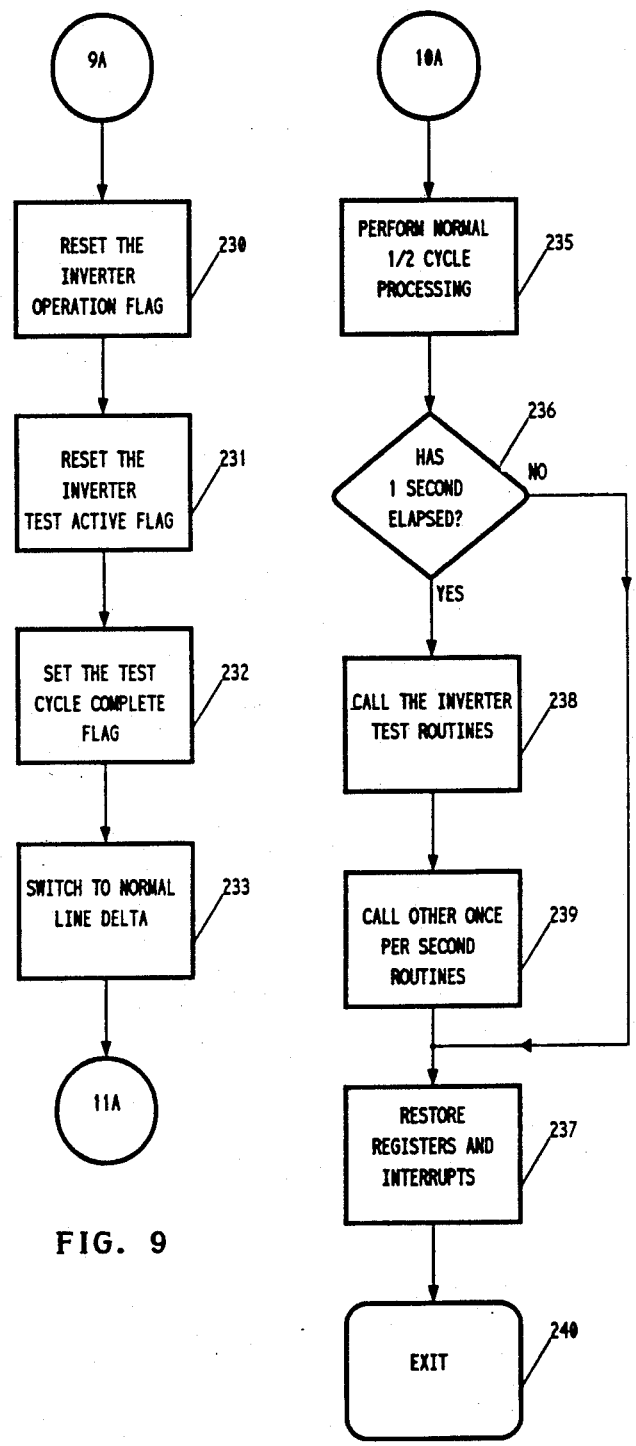
FIG. 9
FIG. 10

INVERTER AND BATTERY TESTING FOR UNINTERRUPTIBLE POWER SYSTEMS

FIELD OF THE INVENTION

This invention pertains generally to the field of power systems and particularly to uninterruptible power supplies or systems and the operation and monitoring of the components thereof.

BACKGROUND OF THE INVENTION

Uninterruptible power supplies or systems (commonly referred to as UPS) are used to provide back-up power to critical loads such as computer systems where a loss of line power can result in the interruption of programs and the loss of valuable data. Uninterruptible power supplies may also provide a line power conditioning function to ensure that transient spikes, low voltage conditions, or distorted power waveforms on the AC power system do not disturb the operation of the computer which is supplied with power through the UPS. Typically, the UPS includes a battery which is interfaced through an inverter to the AC output line. One type of UPS operates such that when a fault occurs in the input AC power, the inverter is controlled to provide power from the battery to the AC output line at the same frequency and with substantially the same waveform as the normal input AC power. Preferably, the switching at the time of fault is accomplished as smoothly as possible so that substantial transient spikes or dips in the waveform supplied to the AC output line do not occur. The coupling of the converter to the AC output may be through a ferroresonant transformer as illustrated in U.S. Pat. No. 4,692,854 to Richard V. Baxter. et al. entitled Method and Apparatus for Modulating Inverter Pulse Width, the disclosure of which is incorporated herein by reference.

In double conversion UPS systems, the AC power is rectified to a DC voltage which is applied, in parallel with the battery voltage, to a constantly running inverter. If the inverter switching elements or the controls for the inverter fail, the consequence is an immediate failure (or distortion) of the power supplied to the critical load. In such cases, a bypass is usually provided around the UPS which is switched to supply line power directly to the load upon detection of failure of the inverter. In UPS systems which utilize a ferroresonant transformer and in certain other types of UPS systems, the inverter need not be running constantly and a failure of the inverter or its control circuitry will not result in an immediate disruption of power to the load as long as line power is available. Consequently, a failure of the inverter circuitry, or of ancillary circuitry such as the fuses provided in the inverter system, or of the battery, may not become apparent until a power outage occurs and power from the inverter is required. The operation of the inverter and the other circuitry of the UPS can, of course, be tested by periodically cutting off the line power and switching on the inverter to verify that the inverter is properly supplying power to the load. However, if the inverter or other components are not properly functioning, the result can be an unnecessary power interruption to the load. Consequently, it is desirable to test the inverter while the load is still being provided with power from the AC power system and without creating voltage transients or other waveform distortions in the power supplied to the load while the inverter is being tested.

SUMMARY OF THE INVENTION

In accordance with the present invention an uninterruptible power system is provided with adaptive inverter testing to verify proper operation of the inverter during normal supply of power from the AC power line to the critical load without interruption of power or distortion of the waveform provided to the load. Further, after the verification of proper operation of the inverter, the system can determine the remaining run time available from the battery by periodically cutting off power from the power lines and supplying power from the battery, through the inverter, to the load in a controlled manner for a limited period of time. The rate of discharge of the battery is monitored over the short period of time that power is supplied from the battery to allow determination of the remaining run time available from the battery if interruption of the commercial power occurs. The inverter test operates adaptively, so that changes in the actual voltage level on the input line, changes in the battery voltage, and variations in system component characteristics are well accommodated, and a consistent determination of the operation of the inverter and the battery can be made despite such variations.

Inverter testing is carried out periodically under the control of a microprocessor controller by selectively switching on one of the inverter switches at a precisely determined point in time after the zero crossing of the input voltage waveform from the commercial power line. The power from the battery is provided across a transformer winding which is coupled to the input or primary winding connected to the commercial power system. The voltage applied by the battery across the transformer is opposed by the voltage coupled to the winding from the AC source. If the voltage from the source across the winding exceeds the battery voltage, no current flows from the battery because of back-biasing of diodes in the inverter circuit, but if the battery voltage exceeds the supply voltage across the winding a current will flow through the winding which will generally reach a peak and then decline as the AC input voltage waveform continues to increase. The current through the winding is limited by the AC line impedance, the transformer impedance, battery impedance, and the impedance of the inverter circuit, including a shunt resistance connected in series with the battery. The battery current (or equivalently, the voltage across the shunt) is monitored by the controller which converts the analog input data to digital data which is stored for later evaluation. The controller also controls the inverter to turn on the other inverter switch on the negative going portion of the AC input waveform to measure the current flowing through the other side of the inverter, and the data corresponding to battery current is digitized and stored by the microprocessor controller.

After acquisition of data at a particular test phase, corresponding to a particular selected time delay between the zero crossing of the input waveform and the turn-on of the inverter switches, the current flowing from the battery during the inverter turn on time is examined by the controller. Preferably, the peak current is found by the controller for the test on each side of the inverter. Other characteristics of the inverter current, which may be examined by the controller are average or RMS (root-mean-square) current. In general, the controller determines if any one of several limit conditions are met at this point which would indicate that the test should be terminated. One limit condition indicates that all tests have been passed, while the others indicate a failure. If a limit condition is not found, the test procedure is repeated using a decreased test phase. For example, if either of the two current peaks exceeds a preselected percentage of maximum allowable inverter current, an error is determined, which is preferably verified by a similar result in a repeat of the test at the same test phase, and a message advising of the failure is provided to an operator. Assuming that the peak battery currents do not exceed selected maximum acceptable limits (e.g., 75% of the maximum allowable inverter current), the test phase is then decreased incrementally and the inverter test procedure described above is repeated until the peak during the first half cycle of the input waveform is above a selected percentage (e.g., 50%) of the maximum allowable inverter current. At this point, the peak of battery current in the second half cycle must be greater than a selected minimum level and less than a selected maximum. If not, an error is determined and a message to that effect is provided to the operator, preferably after the test has been repeated and a similar result obtained. For example, the allowable range of the second current peak may be 50% plus or minus 25% of the maximum allowable inverter current. If the controller determines that this range is exceeded at selected levels of the first half-cycle and second half-cycle peaks, an error is determined because an excessive spread between the current flowing during the first half cycle and second half cycle through the battery and the switches is indicative of a failure of components or controls for the components. During normal operation the two sides of the inverter should be substantially symmetrical in their operating characteristics.

Because the inverter test in accordance with the present invention is carried out by adaptively controlling the test phase at which inverter turn-on occurs, the testing is insensitive to normal variations in the absolute level of the input line voltage, in the level of battery voltage, or of the power drawn by the load.

Because the inverter turn-on occurs in synchrony with the input waveform from the power system and applies only small, controlled amounts of battery power to the transformer which can be coupled to the load, substantially no waveform disturbances or transients are seen by the load. Moreover, with a ferroresonant transformer utilized as the coupling medium between the power system, the inverter, and the load, the ferroresonant transformer by itself serves to smooth out any peaks in power which would be provided to the system from the inverter during testing.

Once the inverter has been tested and is verified to be working properly, which also serves to test the fundamental adequacy of the battery to supply power to the system under load conditions, the AC power system may then be disconnected from the coupling transformer and the inverter turned on to supply power, for a controlled period of time, from the battery to the load. During the relatively short time that the battery provides power to the load, the drain on the battery is measured by determining the drop in voltage across the battery under known load conditions, and the remaining usable run time of the battery for powering the load under emergency power conditions can be determined. This remaining battery run time is then made available for display to the operator.

Further objects, features and advantages of the invention will be apparent from the following detailed description when taken in conjunction with the accompanying drawings.

BRIEF DESCRIPTION OF THE DRAWINGS

In the drawings:

FIGS. 5–30 are illustrative flow charts showing the operation of the microprocessor controller during the inverter test of the present invention.

DETAILED DESCRIPTION OF THE INVENTION

Figure 1:
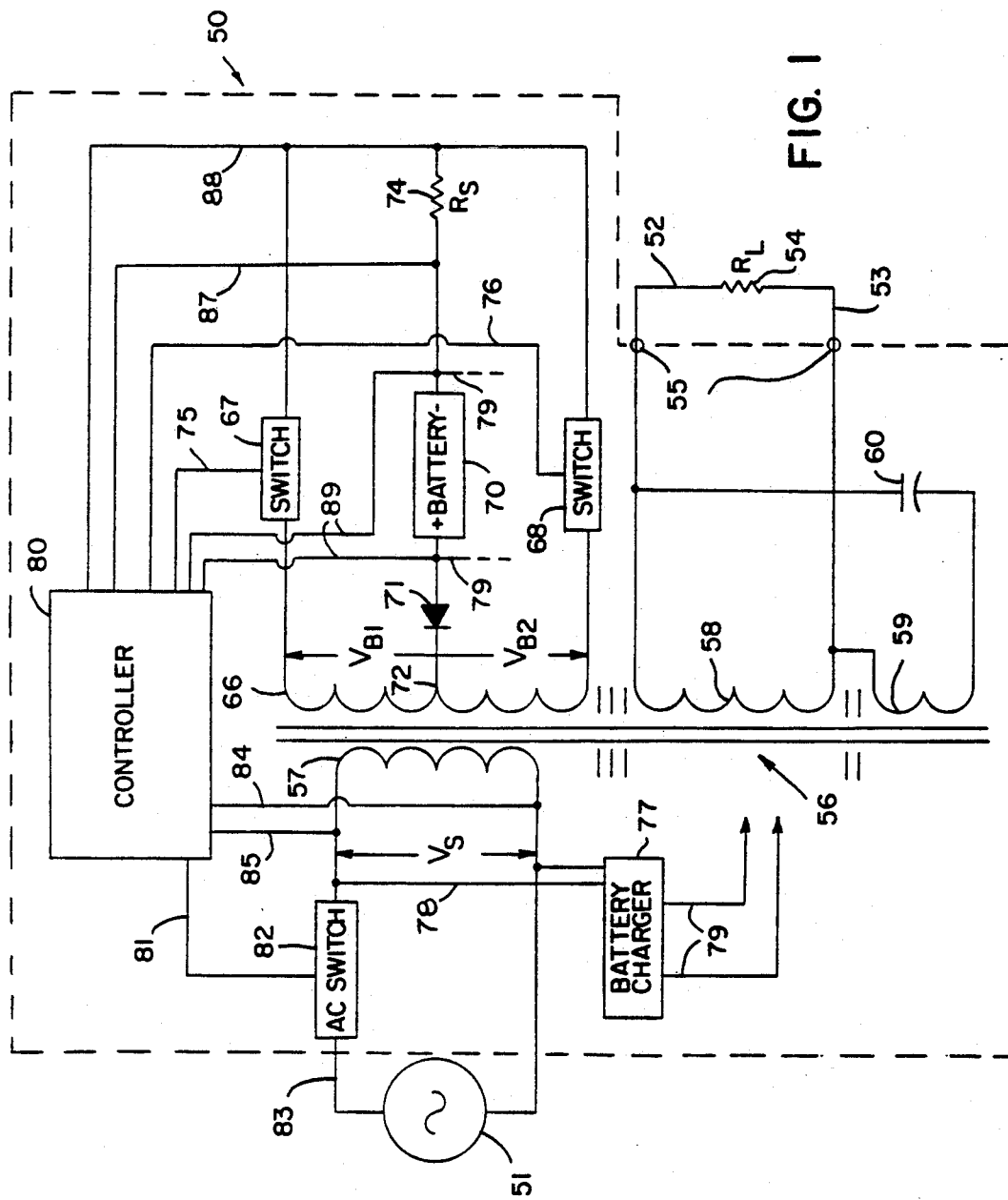
FIG. 1 is a schematic circuit diagram of an exemplary uninterruptible power system incorporating the inverter test and battery test of the present invention.

With reference to the drawings, a schematic block diagram of an uninterruptible power system carrying out the inverter test and battery test of the present invention is shown generally within the dashed lines labeled 50 in FIG. 1. The system 50 receives AC power from an AC power source 51, such as a commercial power system, and provides AC output power on lines 52 and 53 from output terminals 55 to a critical load, illustratively shown as the resistor 54 in FIG. 1. While the present invention may be particularly utilized with various types of uninterruptible power systems (UPS) which incorporate an inverter which is not constantly running, it is particularly well suited to UPS systems which incorporate a ferroresonant transformer. The exemplary UPS 50 includes a ferroresonant transformer 56 which has a primary 57 connected to the power system 51, secondaries 58 and 59, across which a capacitor 60 is connected, with these secondaries connected to the load 54, and an auxiliary primary 66 to which the inverter of the UPS is connected. The inverter is comprised of switching elements 67 and 68 which are connected to the two ends of the primary 66, and a battery 70 which may be connected, for example, through a diode 71 to a center tap 72 of the auxiliary primary 66. The battery current $I_b$ in the inverter is returned through a low resistance shunt 74. The blocking diode 71 prevents uncontrollable charging of the battery 70 from the transformer 56, although charging may also be controlled satisfactorily by suitable selection of the transformer turns ratio. The switches 67 and 68 may be any of various types of power switching devices such as bipolar transistors, MOSFETs, thyristors, MOS controlled thyristors (MCT), and the like. The switch 67 has a gate line 75 to which a gating signal can be applied to turn the switch 67 on, and preferably also to turn the switch off. Similarly, the switch 68 has a gate line 76 to which a signal may be applied to turn the switch on and, preferably, off. Although the switches 67 and 68 have been shown as being controlled at their gate lines for both turn-on and turn-off, it is apparent to those of ordinary skill that switching devices such as thyristors (SCRs) may be used by incorporating appropriate commutation means well known in the art. The battery is charged by a battery charger 77 which receives AC power from the AC source 51 on input line 78, and provides DC charging current to the battery on output lines 79.

A controller 80 supplies the control signals on lines 75 and 76 to control the switching of the switches 67 and 68. Further, the controller provides a control signal on a line 81 to an AC switch 82 connected in the input line 83 from the power source 51 to control the application of power from the source 51 to the transformer primary 57. The voltage $V_s$ across the primary of the transformer is monitored by the controller through lines 84 and 85 which are connected across the primary. The controller 80 also receives the voltage across the shunt 74 from lines 87 and 88, which are connected to opposite sides of the shunt 74, and from lines 89 connected across the battery to monitor battery voltage. The voltage between the lines 87 and 88 will be proportional to the current $I_b$ flowing through the shunt 74 and the battery 70. The resistance $R_s$ of the shunt 74 is preferably relatively small and precisely known so that the current through the shunt can be determined accurately. As is typical for ferroresonant transformers, the winding 58 acts as the output or secondary winding, providing power to the load 54, with the winding 59 acting as a harmonic compensating winding and forming a tank circuit with the capacitor 60. Such ferroresonant transformers are well known in the art and are commonly utilized to provide compensation for harmonic distortion.

When power fails from the AC power system 51, the controller 80 causes the switch 82 to be opened, to disconnect the primary from the power source, and operates the switches 67 and 68 to provide an alternating current across the auxiliary primary winding 66 to supply an AC output voltage at the output winding 58 of the ferroresonant transformer. Techniques for determining when line failure occurs are well known in the art, an exemplary preferred method and system being shown in U.S. patent application Ser. No. 07/404,902, filed Sep. 8, 1990, for Method and Apparatus for Line Power Monitoring for Uninterruptible Power Supplies, incorporated herein by reference. Various constructions may be used for the inverter, such as that described in U.S. Pat. No. 4,692,855, incorporated by reference.

Figure 2:
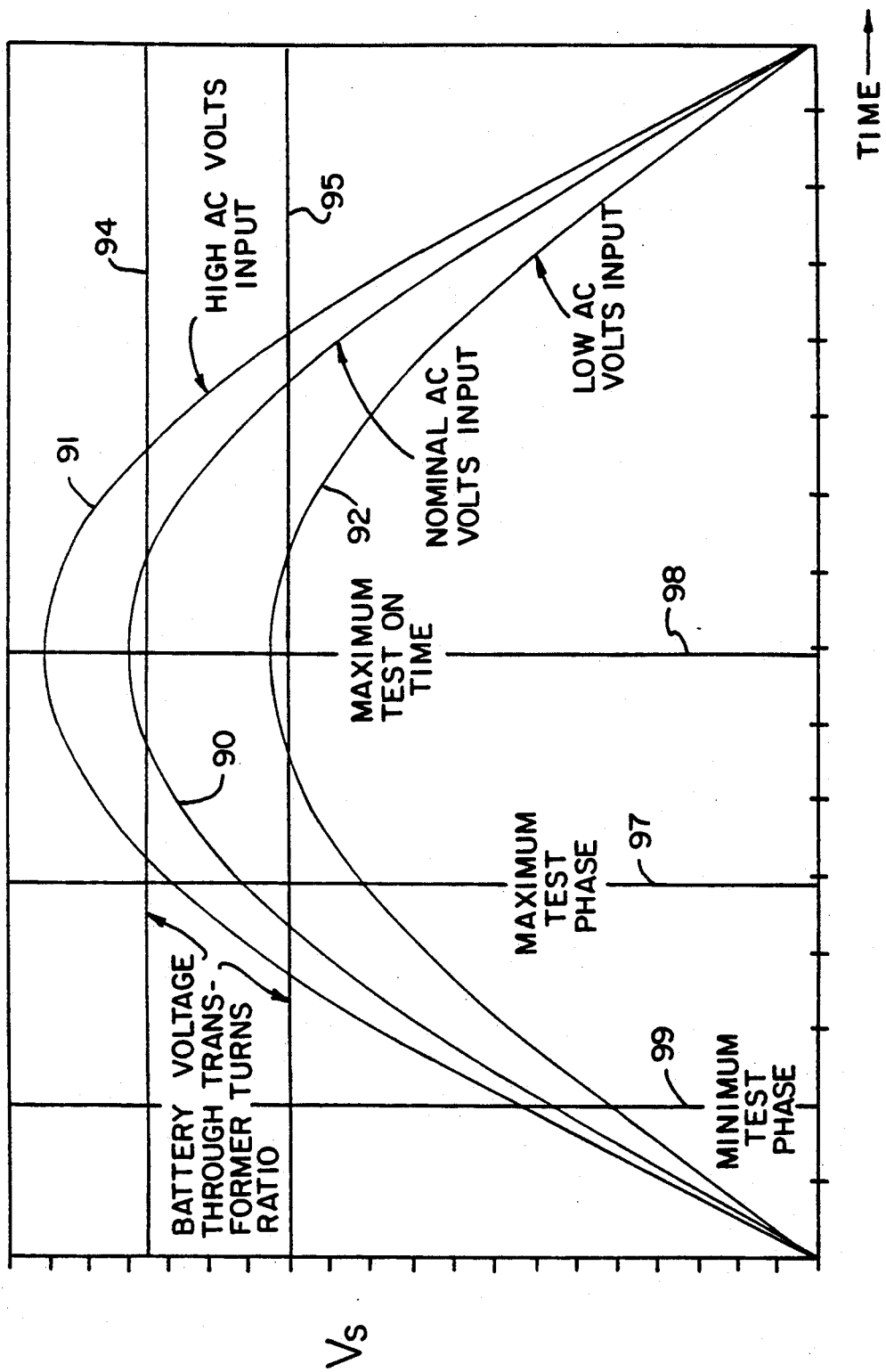
FIG. 2 are graphs of illustrative waveforms for AC input power showing the range of voltages which may be encountered on the input line and the battery voltage levels.

The present invention operates the UPS 50 in such a way as to determine whether the switches 67 and 68 are operating effectively and whether the battery 70 is capable of providing power to the load. Other components of the inverter may also be checked, such as fuses (not shown) which will conventionally be incorporated in the inverter, as well as the connections between these components, the ferroresonant transformer and harmonic compensation component, and the operation of the controller 80 in providing the control signals to control the switching of the switches 67 and 68. To illustrate the various conditions that may be encountered as the inverter is turned on while power is still being supplied from the power system 51 to the transformer primary 57, illustrative graphs are shown in FIG. 2 of one cycle of the input voltage waveform $V_s$ across the primary 57. The anticipated waveforms include a nominal waveform 90 which is at the proper AC input voltage, a high voltage waveform 91, and a low voltage waveform 92. For illustrative purposes, the relative voltage level of the battery (as reflected through the transformer turns ratio to the primary of the transformer) may be relatively high (as illustrated by the line 94) or relatively low (as illustrated by the line 95). Consequently, it is not sufficient to simply determine whether or not the battery voltage is an adequate percentage of the AC input voltage since both voltages can be variable, and the transformer 56 may itself change in characteristics because of temperature changes, potential magnetic saturation and so forth.

To test the operation of the inverter, the inverter switches 67 and 68 are turned-on separately during appropriate half-cycles of the input waveform at a point in time precisely delayed from the zero crossing of the input waveform. This delay time or angle (with respect to a 360° full cycle) is referred to herein as the "test phase". The line 97 in FIG. 2 indicates an illustrative position for the maximum test phase, that is, the maximum delay from the zero crossing. If the switch 67 or 68 (depending on which half-cycle of the input waveform is received) is turned on at the maximum test phase 97, it can be seen from examining FIG. 2 that if the battery voltage is at the level 95 and the input voltage waveforms are as shown at 90 or 91, no battery current will flow since the voltage at the primary of the transformer 57 reflected back to each half of the inverter primary 66 will back bias the DC circuit in the inverter so that no reverse current will flow through the battery. If, however, the AC input voltage is at the level 92, a small amount of forward current will flow through the battery during the time that the battery voltage, at the level 95, exceeds the voltage on the waveform 92. When the waveform voltage 92 exceeds the battery voltage, no further current will flow. Similarly, if the battery voltage is at the level 95 and the waveform voltage is at the level 92, a much larger current will flow through the battery and the current will continue to flow and will never be cut off by the input voltage 92. However, the inverter on-time is limited to the maximum test on-time, which occurs at the quarter cycle point 98, at which the controller turns off the switch 67 or 68. Under the foregoing conditions, a relatively large peak current will flow through the battery. Other possible situations are a battery voltage at the level 94 and the input voltage as shown by the waveform 91, in which case only a small amount of battery current will flow for a short period of time, and a battery voltage at the level 94 and the waveform as shown at 90, wherein an intermediate level of battery current will flow which reaches a peak and then drops to zero, before the quarter-wavelength point 98, as the waveform voltage 90 exceeds the battery voltage 94.

Figure 3:
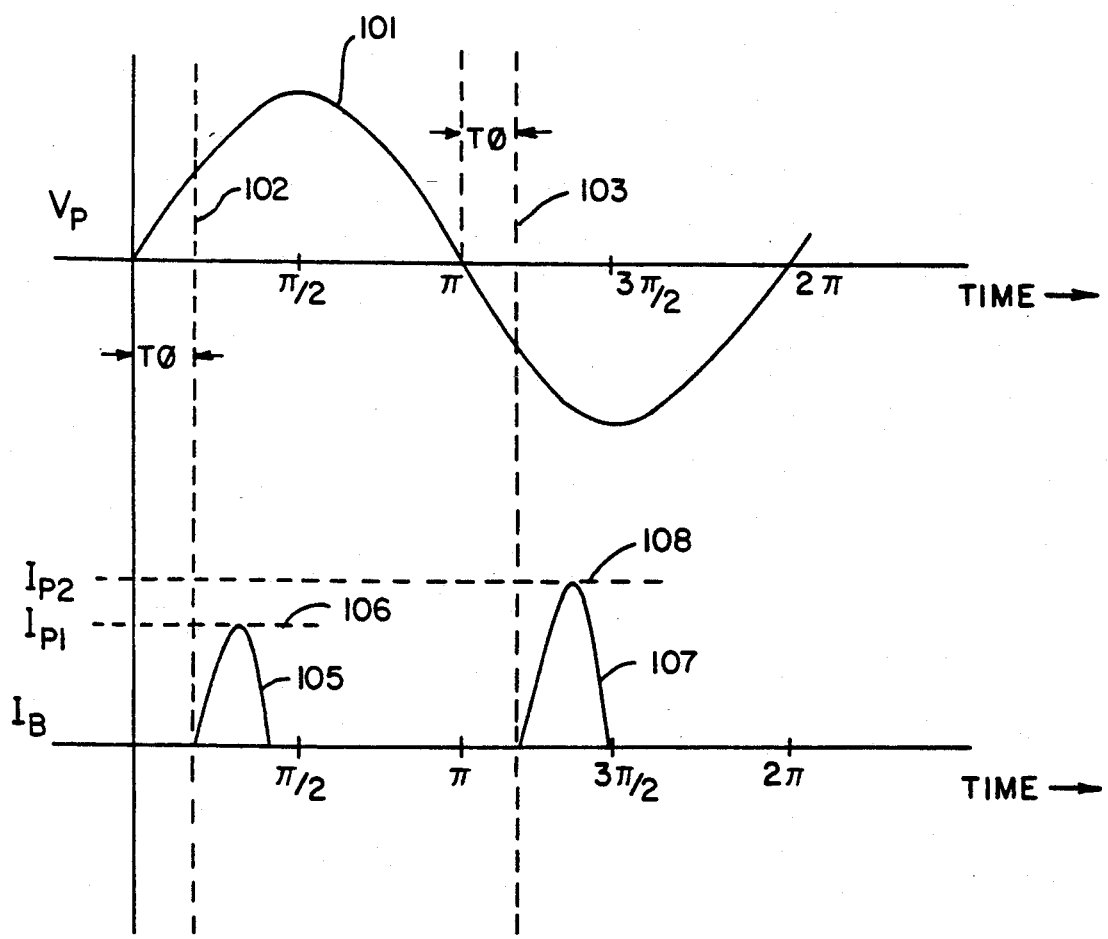
FIG. 3 are illustrative graphs of the input voltage waveform and the battery current during inverter tests.

Because of possible asymmetries in the windings of the transformer 56, in the switching devices 67 and 68, and in other parts of the system, characteristics of the current (e.g., peak current) flowing during the turn-on of the first switch 67 may be different from the characteristics of the current flowing during the turn-on of the second switch 68. For example, the peak of the current in the second half-cycle may be either greater or lesser than the first peak. The relationship between the battery current flowing when the inverter switches are turned-on is illustrated in FIG. 3. As shown therein, the waveform 101 of the input voltage $V_s$ across the primary includes a positive going and a negative going half-cycle. During the positive half-cycle, the switch 67 (for example) may be turned on whereas during the negative half-cycle the other switch 68 may be turned on. For illustrative purposes, the test phase or turn-on time for the first switch 67 is shown at the time point 102 in FIG. 3, resulting in a battery current $I_b$ having a waveform 105 which reaches a peak current value $I_{p1}$ at the current level 106 in FIG. 3. During the negative half-cycle, the switch 68 is turned on at the test phase 103 which is delayed from the zero crossing point ($\pi$ radians) an equal amount as the test phase 102 was delayed from the initial zero crossing (0 radians). The resulting battery current $I_b$ is shown by the graph 107 and reaches a peak battery current $I_{p2}$ at the current level 108. The peak currents $I_{p1}$ and $I_{p2}$ are shown at different levels in FIG. 3 to illustrate the possible differences between these currents. It is understood, of course, that the peak current $I_{p2}$ may be smaller than the peak current $I_{p1}$, or they may be substantially identical. Further, it is also understood that the current waveforms illustrated in FIG. 3 are not necessarily representative of the exact shape of the waveform that will be encountered in all situations. For example, in some cases, the current will continue to increase during turn-on and will not be shut off until the maximum on-time of the switching devices 67 and 68 (at $\pi/2$ or $3\pi/2$ radians, respectively) or until a maximum current level is exceeded. The UPS preferably incorporates current limiting circuitry.

From an examination of FIG. 2 and the corresponding illustrative current waveforms of FIG. 3, it can be seen that if the inverter is operating properly, a test phase can be found at which battery current flows and reaches a peak and then decreases to zero before a quarter cycle point. For example, even if the battery voltage is very low, the test phase angle can be decreased until there is at least some part of the waveform during which the battery voltage exceeds the incoming AC line voltage. If, however, this test phase is less than the selected minimum test phase as represented by the line 99 in FIG. 2, then it is known that there is some malfunction in the inverter or DC circuit, for example, that the battery voltage is so low that it cannot adequately provide power to the load if the inverter were turned on. Thus, a test phase below the minimum test phase is an indication of inverter or DC power system malfunction or inability of the battery to support the load. Further, it can also be seen that at the maximum test phase, the battery current should be shut off before the quarter-wavelength point. If the battery current does not shut off at this maximum test phase, this is also an indication of inverter failure, or possibly line failure in that the input line is too low. However, the UPS system would ordinarily detect a low line condition and would operate the inverter to supplement or replace the AC power line under such conditions. Thus, as long as a low input condition is not detected on the AC input line, the AC input voltage should be sufficient to shut off the battery current at the maximum test phase if the inverter is operating properly.

Further, as illustrated in FIG. 3, because the two switches 67 and 68 are turned on at identical time delays from the zero crossing (identical test phases) and may also preferably be turned off at the same time, their current waveforms should be substantially similar, both in shape and in peak value. If only one of the inverter switches is operating properly, the difference between the peak values $I_{p1}$ and $I_{p2}$ will be greater than a predetermined limit which is indicative of an inverter failure. For example, when the test phase is selected to center the first peak $I_{p1}$ at about 50% of maximum current, a value of $I_{p2}$ greater than 75% or less than 25% of maximum current may be considered indicative of failure of one of the switches.

Figure 4:
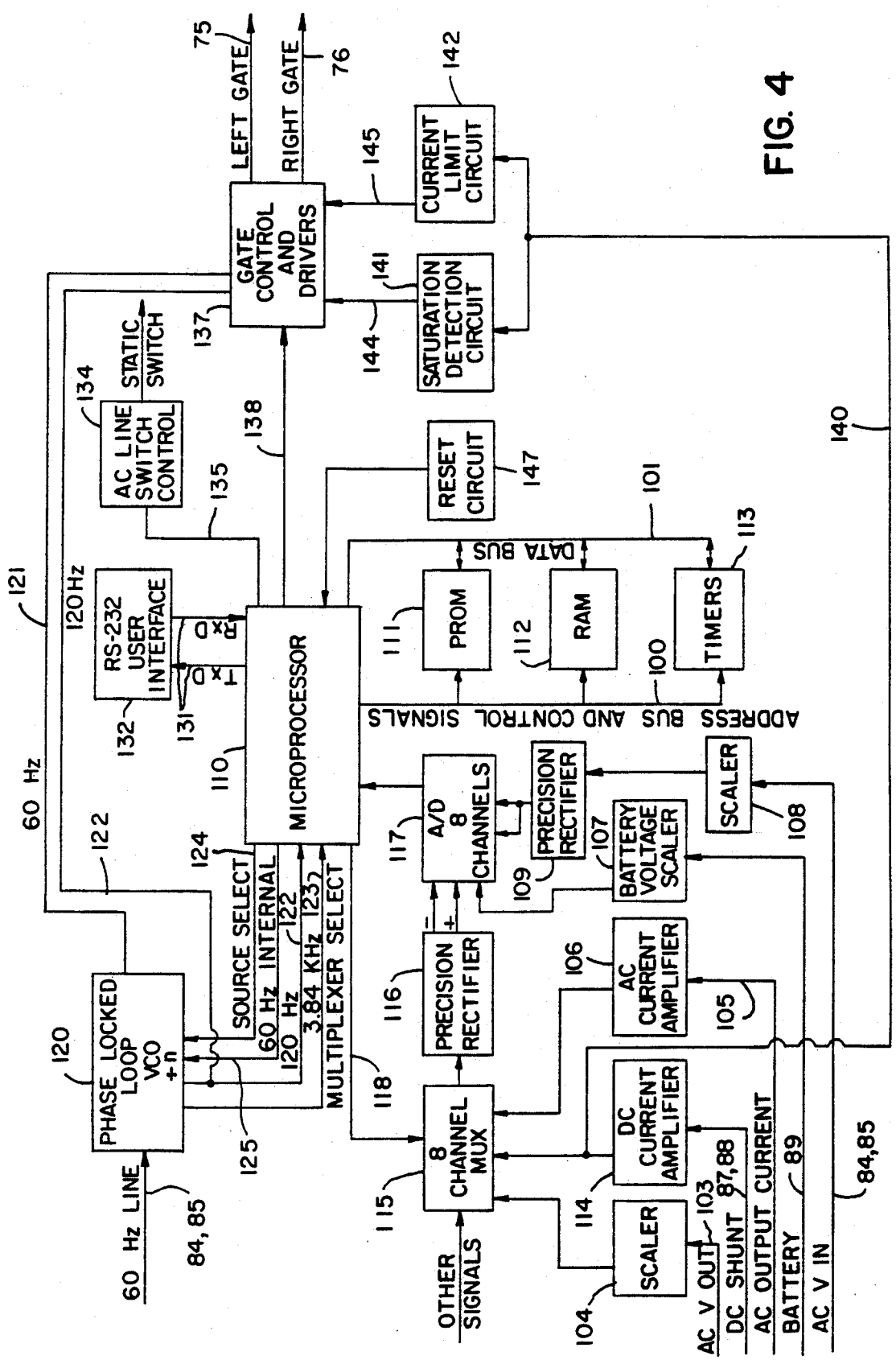
FIG. 4 is a schematic block diagram of the controller for carrying out the inverter test and the battery test of the present invention.
Figure 5:
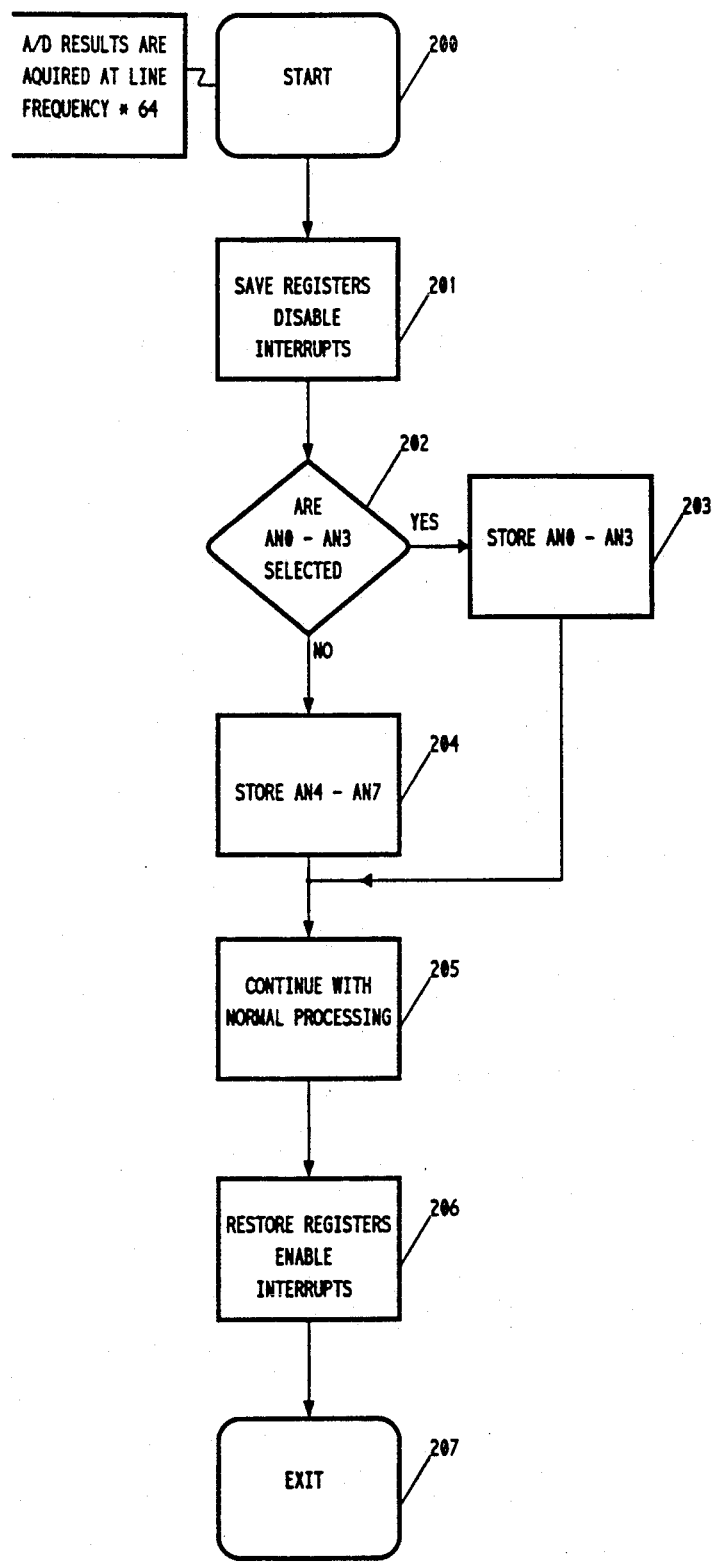

A block diagram of the controller 80 which controls the operation of the UPS, including the operation of the inverter testing and battery testing, is shown in FIG. 4. The controller 80 includes a software controlled microprocessor 110 (e.g., NEC 78C10 microprocessor) having conventional programmable read only memory (PROM) 111 (e.g., National 27C256), random access memory (RAM) 112 (e.g., Hitachi 6116), and timers 113 connected to the microprocessor by control and address lines 100 and data bus lines 101 as illustratively shown in FIG. 4. The voltage across the DC shunt 74, as provided on the lines 87 and 88, is amplified by an amplifier 114 and provided to a multiplexer 115 which has several inputs, one of which is the output of the amplifier 114. When properly selected, the multiplexer 115 provides the amplifier output to a precision rectifier 116 which supplies its output to an analog-to-digital converter 17 (which may be incorporated on the microprocessor chip, e.g., using a 78C10 microprocessor) which in turn provides digital data to the microprocessor 110. The microprocessor provides control signals on lines 118 to the multiplexer 115 to control the inputs provided to the microprocessor, thus allowing the microprocessor to determine when it wishes to receive the DC current amplifier data. Other inputs to the multiplexer include AC output voltage provided on lines 103 extending from the output terminals 55 through a scaler 104, and AC output current from lines 105 through an amplifier 106. The A to D converter 117 also receives the battery voltage on the lines 89 through a battery voltage scaler 107, and the AC input voltage on the lines 84 and 85 through a scaler 108 and a precision rectifier 109.

The 60 Hz input voltage from the power system is provided on the lines 84 and 85 to a phase locked loop circuit 120, which may be of conventional construction well known in the art, which includes a voltage controlled oscillator which locks to the 60 Hz input line and provides output signals which are frequency multiples of 60 Hz but synchronized in phase to the input line signal. A 60 Hz signal is provided on an output line 121, a 120 Hz signal is provided on a output line 122 to the microprocessor 110, and a 3.84 KHz signal is provided on an output line 123 to the microprocessor. The microprocessor, in turn, provides a select signal on a line 124 and a 60 Hz internal signal on a line 125 to the phase locked loop circuit, used when the 60 Hz input power signal on the lines 84, 85 is absent.

The microprocessor communicates with an operator through a user interface 130, connected to the microprocessor by input and output lines 131. The user interface will typically include a keyboard to allow the user to provide instructions to the microprocessor, and a display such as a vacuum fluorescent alphanumeric display. Timers 113 connected to the microprocessor provide various timing signals. The microprocessor controls the operation of an AC line switch and control circuit 134 by output signals on lines 135. The switch and control circuit 134 provides the signal on the line 81 to the static switch (or relay) 82 to control the connection between the primary 57 of the transformer and the AC power source 51. The microprocessor also provides output signals to a gate control and driver circuit 137 on a line 138. The DC shunt voltage is also provided on lines 140 to a saturation detection circuit 141 and to a current limit circuit 142, which provide control signals on lines 144 and 145, respectively, to control the driving of the inverter switches. The circuit 141 provides a signal which causes the switches 67 and 68 to be opened when saturation is reached and the circuit 142 causes the switches to be opened when the maximum inverter current is reached. The circuit 142 prevents overloading of the switching devices on an (almost) instantaneous basis. The current limit threshold is set based on the size of the inverter unit. A current limit based on unit size is also programmed into the software for the microprocessor and is used, as described further below, to determine the thresholds for inverter test. The output of the gate control circuit 137 includes signals provided on the gate line 75 to the switch 67 and on the gate line 76 to the switch 68 to control turn-on and turn-off of these switches. A reset circuit 147 is connected to the microprocessor to provide appropriate reset signals.

The circuit 120 which includes the phase locked loop, voltage controlled oscillator, and divide by N counter, provides the microprocessor with two timing signals: with a nominal 60 Hz power line input signal, one timing signal is generated at 120 Hz and the other at 3.84 KHz. Each of these timing signals provides an interrupt to the microprocessor 110. On the rising edge of the 3.84 KHz signal, program flow is vectored to the analog acquisition routines. The analog-to-digital converter 117 may have two banks of 4 channels, as in a 78C10 microprocessor, with the first bank containing data AN0 through AN3 and the second bank containing data AN4 through AN7. Each bank can be selected by the microprocessor, allowing the microprocessor under its program control to store samples at the proper locations in the RAM 112.

The multiplexer 115 (e.g., an 8 channel multiplexer) allows various signals to be applied to the input of the precision rectifier under the control of the microprocessor. The precision rectifier provides a positive signal and an inverted signal to the analog-to-digital converter 117.

Figure 47:
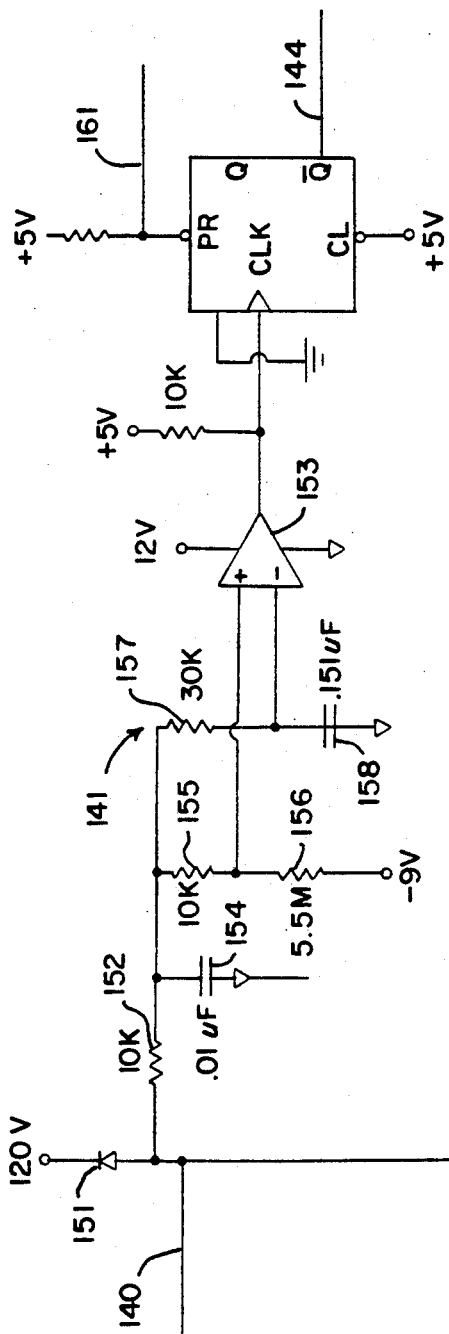
FIG. 47 is a schematic circuit diagram of the saturation detection and current limit circuits.
Figure 47:
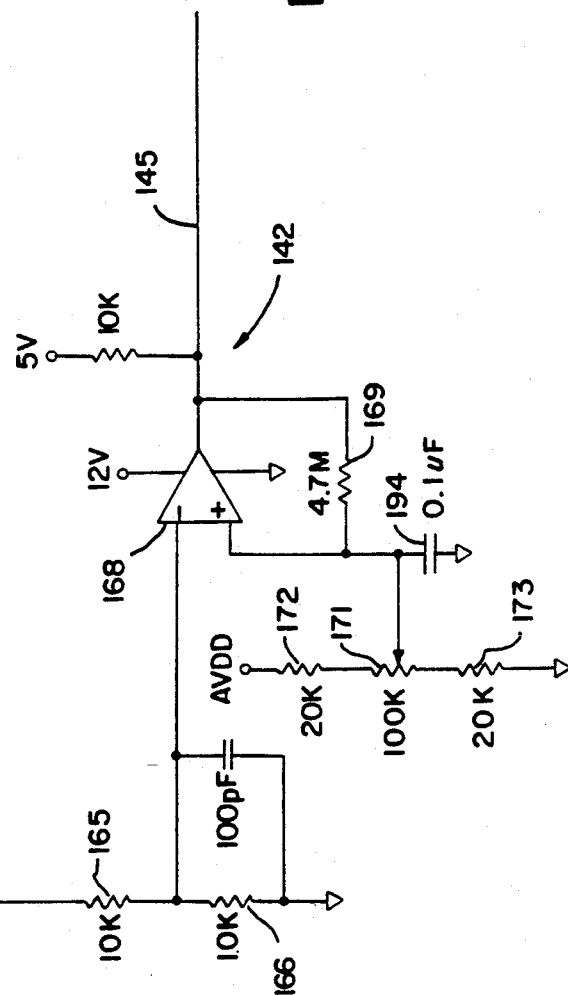

A schematic circuit diagram of the saturation detection circuit 141 and current limiting circuit 142 is shown in FIG. 47 with both circuits receiving the output signal from the DC current amplifier 114 on the line 140. The saturation detection circuit 141 receives the signal on the line 140, limited to the maximum voltage by a back-biased diode 151, through a series resistor 152 to an input circuit to a comparator 153. The input circuit includes a capacitor 154 connected to common, resistors 155 and 156 connected from the output of the resistor 152 to a negative voltage (e.g., −9 v), with the connection between the resistors 155 and 156 connected to the non-inverting input of the comparator 153, and a resistor 157 and capacitor 158 connected to common, with the connection between the capacitor and the resistor connected to the inverting input of the comparator 153. The output of the comparator 153 will change state when the signal on the line 140, corresponding to inverter current, has a positive slope of sufficiently long duration, e.g., 100 microseconds, at which point the output of the comparator 153 changes state to provide a clock signal to a flip-flop 160, which causes the state of the inverting output of the flip-flop 160 on the line 144 to change, providing a disable signal which the mircoprocessor can selectively use to disable the gate drivers, until reset by a signal on a line from the microprocessor. Under normal operation, the inverter current will have a positive slope when first enabled. This will clock the saturation detect flip-flop. In normal operation, the flip-flop is reset either by the microprocessor or the output of the phase locked loop at or slightlyl after the peak of the half-cycle. If controlled by the microprocessor, it is not reset at the peak of the half-cycle, allowing an instant turn-off once the line controlling the AND gate 178 is made "true".

The current limiting circuit 142 receives the signal on the line 140 to input resistors 165 and 166 connected to common, with the connection between the resistors connected to the inverting input of a comparator 168. A feedback resistor 169 is connected between the output and a non-inverting input of the comparator 168. The non-inverting input of the comparator 168 is also connected to receive a voltage from a voltage divider circuit composed of a potentiometer 171 and resistors 172 and 173 connected between a selected supply voltage AVDD and common with the wiper of the potentiometer connected to the non-inverting input. A capacitor 174 is also connected between the wiper of the potentiometer and common. The output of the comparator 168 changes state when the voltage at the non-inverting input exceeds the voltage at the inverting input, which is set manually by setting the position of the wiper of the potentiometer 171, which can be set at the factory to cause the comparator 168 to change state when a selected inverter current level is reached, corresponding to the chosen maximum allowable inverter current, at which time a signal will be provided on the line 145 to disable the gate inputs to the inverter switches.

Figure 48:
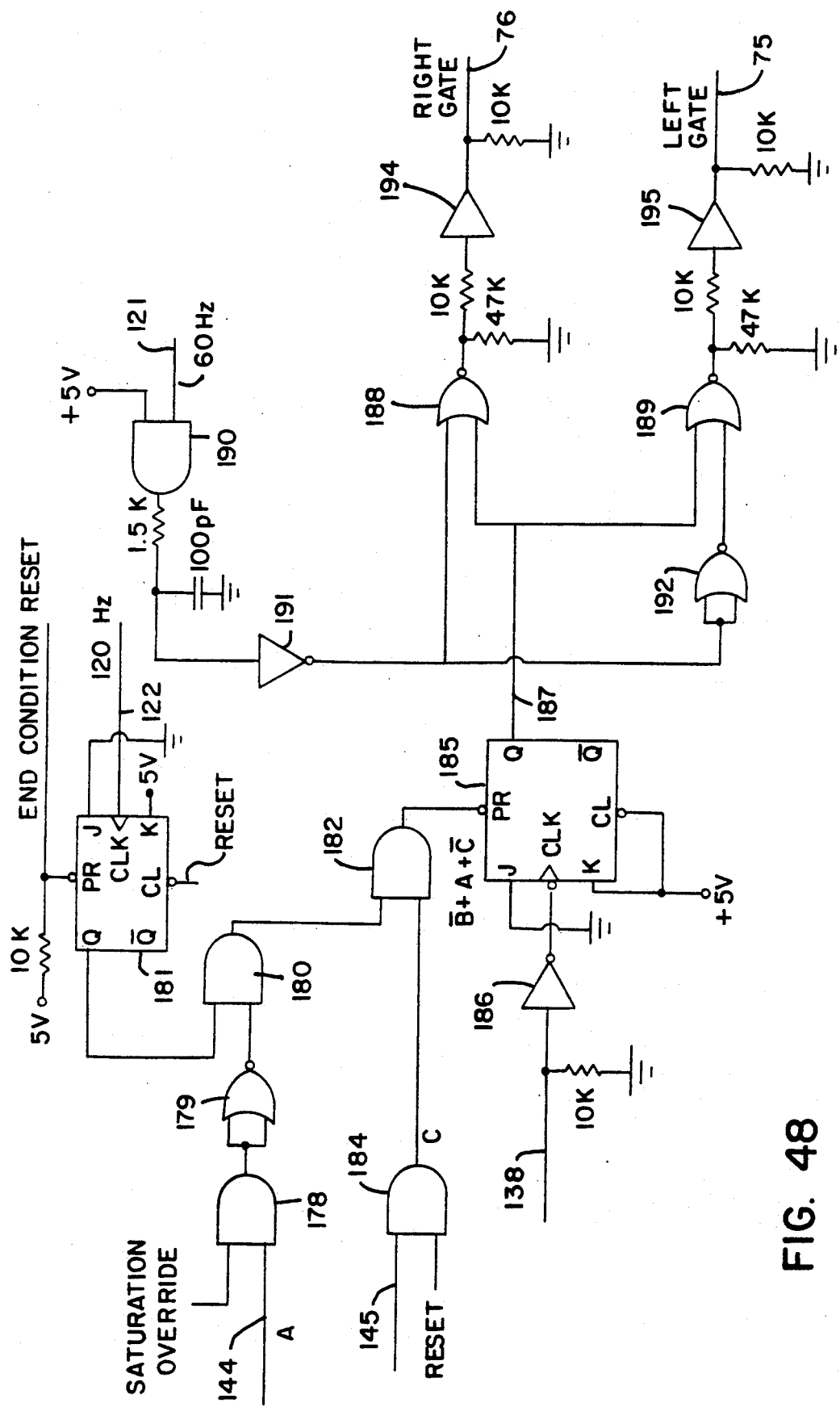
FIG. 48 is a schematic circuit diagram of the gate control and driver circuits.

The inverter gating and driver circuit is shown in FIG. 48. The saturation detect signal is received on the line 144 to an AND gate 178 which also receives a saturation over ride input signal from the microprocessor or other suitable source. The output of the AND gate 178 is provided to a NOR gate 179 connected as an inverter and then to an input of an AND gate 180. The AND gate 180 receives the output of a flip-flop 181 which receives as its clock signal the 120 Hz signal on the line 122 from the phase locked loop, providing a maximum on time for each gate. The flip-flop 181 may also receive reset signals from the microprocessor to reset the flip-flop to a known state at a particular point in time. Thus, any change in the state of the output of the AND gate 180 will be synchronized to a change in state of the 120 Hz signal from the phase locked loop. The output of the AND gate 180 is provided as one input to an AND gate 182, the other input of which is received from an AND gate 184 which receives the current limit signal on the line 145 and receives a reset signal preventing operation during microprocessor reset. The output of the AND gate 182 is received at the (inverting) reset input of a flip-flop 185. The inverter gating signal from the microprocessor is provided on the line 138 through an inverter 186 to the clock input of the flip-flop 185. Thus, the output of the flip-flop 185 will change state when the microprocessor inverter gating signal changes state and the output will be reset to the NULL state either when there is a saturation detect signal on the line 144 and the over-ride signal is true, when there is an inverter overcurrent signal on the line 145, or when the output of the flip-flop 181 changes state at the one-half wavelength points on the 60 Hz power system waveform (when the output of the flip-flop 181 is enabled by signals from the microprocessor). The output of a flip-flop 185 on a line 187 is provided as an input to NOR gates 188 and 189. The 60 Hz on the line 121 from the phase locked loop is provided to an AND gate 190 which has a "high" value voltage provided to its other input. The output of the AND gate 190 is inverted by an inverter 191 and provided to the second input of the NOR gate 188. The output of the inverter 191 is also provided through an inverting NOR gate 192, the output of which is provided as the other input to the NOR gate 189. The output of the NOR gate 188 is provided to a gate driver amplifier 194 which provides the driving signal on the line 76 to the gate of the "right" switch 68 of the inverter, and the output of the NOR gate 189 is provided as the input to a driver amplifier 195 which provides the output drive signal on a line 75 to the gate of the "left" switch 67 of the inverter.

The 3.84 KHz interrupt rate provides adequate time between interrupts for all four analog-to-digital channels in a selected bank to be converted and stored in internal registers on the analog-to-digital converter.

Upon entry into the analog acquisition routines, the microprocessor, under its program control, first saves all of the registers, allowing program flow to resume at the point it was at before the interrupt occurred after the interrupt processing is completed. Next, the interrupts are selectively masked or disabled, allowing only those interrupts which have a higher priority to further interrupt the analog acquisition routines. The microprocessor then determines which of the two banks of the analog-to-digital converter has just completed its conversion. This provides an index to the base RAM locations at which the converter data is to be stored. The index and two offsets are summed together to provide an absolute address for each of the four analog-to-digital channels. The converted data is then retrieved from the analog-to-digital converter registers and stored at the proper location in RAM. One of the two offsets is the channel number, and the other offset is a counter for the number of samples to be acquired from a channel for a full cycle. The counter also determines when the next multiplexer channel is to be selected.

Once the samples are saved at the proper RAM location the analog-to-digital bank control is then switched and a new conversion is started. The analog-to-digital samples which require processing in real time are then dealt with by the microprocessor (for example, low-line detection routines), the microprocessor registers are then restored, interrupts are unmasked (re-enabled), and the program flow is returned to the point it was at prior to the 3.84 KHz interrupt occurrence.

The acquired samples that are not processed during the interrupt from the 3.84 KHz signal are processed during an interrupt caused by the falling edge of the 120 Hz signal. One function of the 120 Hz interrupt routines is the accumulation of time intervals using counters. One such counter expires at the one-half second point, causing the stored digital samples from the analog-to-digital converter to be analyzed, RMS or average values to be computed, and calibrated results to be stored at the proper locations in RAM. Another counter is used to perform the once-per-second routines which include calculating output load and run time used in an adaptive battery test.

The operation of the uninterruptible power system incorporating inverter test and battery test in accordance with the present invention is carried out under software control in the microprocessor 110. Flow charts which detail the operation of the software for data acquisition, inverter test and battery test are shown in the FIGS. 5–46 and will be discussed further below. The following summarizes the operation of the uninterruptible power system 50 as controlled by the microprocessor controller 80.

Inverter Test Procedure

As noted above, the falling edge of the 120 Hz signal triggers a microprocessor interrupt which causes software flow to enter the data processing routines. Because the microprocessor is thus interrupted at points in time related to the zero crossing or start of each half-cycle, a controlled inverter test cycle, one line cycle in length, can be performed to test each half of the inverter.

When the microprocessor begins the first inverter test cycle after a microprocessor reset, the test phase (corresponding to a selected delay time or delay angle after the zero crossing) is at a maximum value, thereby ensuring that a controlled DC current should flow even with a relatively low voltage on the input line (e.g., as illustrated by the waveform 92 in FIG. 2). On the falling edge of the 120 Hz signal, the microprocessor determines if an inverter test is in operation. If it is, then the microprocessor 110 loads a timer 128 with the current test phase value, and continues with normal processing. When the timer expires, the microprocessor enables the inverter gate signal. The gate signal is steered to the proper switch in the gate control and driver circuit 137 by the phase locked 60 Hz signal provided on the line 121. If the battery voltage reflected through the transformer to the primary is greater than the line voltage, battery current will flow through the DC shunt 74, and through the enabled one of the switches 67 or 68, to complete the circuit. The battery current will be determined by the voltage difference between the incoming AC line and the battery and by the impedance of the circuit. Current will continue to flow through the closed switch until one of the following conditions occurs: 1) the line voltage exceeds the battery voltage through the transformer and the diodes associated with the inverter become reverse biased, 2) a saturation detection circuit is enabled at the maximum test-on time, the quarter-cycle point 98 as shown in FIG. 2, which may comprise the switching control circuit shown in U.S. Pat. No. 4,692,854 entitled Method and Apparatus for Modulating Inverter Pulse Width, the disclosure of which is incorporated herein by reference, or, 3) the inverter current limit is reached. The switch which was on is turned off by either the saturation detection circuit or the current limit detection, and one-half of the test cycle is complete. When the next half-cycle of the line voltage begins, the other switch is turned-on at the same point (test phase) after the zero crossing. At the time that the inverter test cycle was started, the microprocessor selected DC current as the output of the multiplexer 115. Thus, the DC current values are acquired from the analog-to-digital converter synchronized to the start of the test cycle, and after acquisition are stored in the RAM 112. When the inverter test cycle is complete, control of the multiplexer is returned to the normal program flow and a flag is set which is used to control the processing of the acquired samples corresponding to battery current. The falling edge of the 120 Hz signal also controls the seconds counter. Once each second, the inverter test software control routines are entered and the first decision performed in the inverter test is to determine whether a test cycle has been completed; that is, whether there are digital samples to be analyzed. Because the test cycle is synchronized to the start of the analog-to-digital sampling, each one-half cycle of the test can be separated from the other by counting samples. For example, with 32 samples taken over the entire cycle, the first half-cycle samples are those numbered 0–15 and the second half-cycle samples are numbered 16–31. Preferably, the largest digital data or peak values found in each group of samples are calibrated using a factor which accounts for amplifier errors, multiplexer losses, and analog-to-digital conversion errors. This calibration factor may be preprogrammed using the user interface. Also programmable through the user interface is the unit size, which preferably is used by the controller to determine the current limit value.

With the currents flowing from the inverter having been measured during each of the two half cycles, and the data corresponding thereto available to the microprocessor, various criteria can be used by the microprocessor to determine if the measured current shows proper inverter operation. For example, the microprocessor can calculate average or RMS values for the half cycle currents and compare these to acceptable minimum and maximum levels, and the values for each half-cycle can be compared to each other. Other criteria included the time at which inverter current starts and stops (measured from the zero crossing), and other current waveform characteristics such as rise time. Under most operating conditions, a particularly useful inverter current criteria has been found to be peak current during each half-cycle. The peak current values may be compared to acceptable minimum and maxiumum values and to each others to determine whether the inverter is operating satisfactorily.

Assuming that the first test cycle is occurring, the peak current for the first one-half test cycle is compared against 50% of the preprogrammed inverter current limit. If the first peak is equal to or greater than this set point, a flag is set to show that 50% of current limit was reached. If conditions are normal it is expected that the 50% value will not be reached. The second peak is then tested to ensure that it is within the control limits. A value of, e.g., 75% of the programmed current limit set point may be used as the maximum acceptable value of the current flow during the test while the first peak is less than 50% of the maximum inverter current. Again, assuming that the operation of the system is normal, this test will be passed. To avoid having the program always set the test phase to the maximum value, a flag is set when the test phase is set to the maximum so this operation can be avoided on subsequent test cycles under the same inverter test operation. When the test passes or fails, this flag is cleared so later tests can restore a known starting point, if needed. Assuming that the peak during the first half-cycle (Peak 1) was less than 50% of current limit and the peak current during the second half-cycle (Peak 2) was less than 75% of the current limit, the test phase is reduced by one test phase incremental step (e.g., this may a length of time equal to 1/16 of a half-cycle and synchronized with the timing of the samples, or it may be some other selected time increment). The test phase after this reduction is then compared to a predetermined minimum allowable value. If the test phase is larger than the allowed minimum, a software seconds timer is started. This timer has a default value of 10 seconds but is programmable through the user interface. The hold-off provided by this timer allows battery recovery (recharging) after each test cycle. A battery charging circuit of any suitable design (not shown in FIG. 1) will conventionally be used to charge the battery when the inverter is not in operation.

Periodically, e.g., once per second, program flow is redirected to the inverter test routines by the interrupt occurring on the falling edge of the 120 Hz signal. While the software timer is in operation, line voltage is tested for a minimum threshold value below which the DC current can not be properly controlled. If the line voltage fails this test, the test routine is suspended. Assuming that the line voltage is greater than the threshold value, program flow continues and the microprocessor tests for the delay timer operation. If the delay timer is operating, software control is returned to the normal 120 Hz interrupt processing. When the delay has expired, system conditions are tested. If the inverter is not armed, that is, cannot be operated, the software routines for inverter test are suspended. Assuming that the inverter is armed, the program flow continues and the interrupt structure for the microprocessor is turned-off, preventing improper operation if an interrupt were to occur while the control flags and registers for the inverter test cycle are being updated. Once these controls are set, software once again re-enables the interrupts. The timer which controls the starting of the inverter test automatically is reset to zero, and the current test phase is converted to a value which can be displayed on the user interface. Program control is then returned to the normal 120 Hz interrupt processing. When the next zero crossing occurs, the microprocessor starts this process over by setting the timer, selecting DC current as the input to the analog-to-digital converter, firing the inverter gates, collecting digital samples from the analog-to-digital converter, and finally ending the test cycle. When the inverter test routines are entered, data is present in the RAM memory which is available for processing. The data are processed and the loop is repeated, each time reducing the test phase by one test phase increment, until (1) a value equal to or greater than 50% of the programmed current limit is found for Peak 1 or (2) Peak 2 exceeds 75% of the programmed current limit and Peak 1 is less than 50% of the programmed current limit, or (3) test phase is less than the minimum allowed. Both of the last two conditions indicate a failed test pass. Two failed test passes result in an alarm condition being provided to the operator.

If the value of Peak 1 found during the first cycle of the inverter test was less than 50% of current limit, after some number of cycles of the inverter test procedure as described above, the test phase will generally be reduced to a point at which Peak 1 will be 50% or greater of the programmed current limit. To prevent a deadlock within the software, a control flag is set showing that within this particular test cycle, a value of 50% of the programmed current limit had been reached by Peak 1. The value of Peak 2 at this time is then compared to a value of 25% of the programmed current limit. The 25% limit is an exemplary value selected to provide a substantially reliable indication of inverter failure. It is, of course, possible to use other percentages to express the limits of deviation of the current peaks for the two sides of the inverter. The values of the limits chosen will generally be determined as a compromise between obtaining a excessive number of false-positive determinations of inverter failure versus an unacceptable number of false-negative indications. If Peak 2 is found to be less than the 25% value, this test pass is considered to have failed. If Peak 2 is greater than 25% of the programmed current limit, Peak 2 is tested to determine if it exceeds 75% of the current limit value. If Peak 2 is less than 75%, this test has passed. If Peak 2 is, however, greater than the 75% value, Peak 1 is again tested to determine if it has a value greater than 25% of the current limit value. The inverter test is repeated for additional cycles with the test phase being increased by one increment for each test cycle. If, during any one of these tests, Peak 1 is reduced to less than 25% of the current limit value and Peak 2 remains greater than 75% of the current limit value, then this test pass has failed. As long as Peak 2 is greater than 75% and Peak 1 is greater than 25% of the current limit, the test phase is increased by one test phase increment for each test cycle until proper values of Peak 1 and Peak 2 are found (i.e., Peak 1 greater than 25% while Peak 2 less than 75%) or until the test phase is greater than the maximum test phase. If the values of the peaks never fall into the acceptable range before the maximum test phase is reached, the test has failed.

Referring now to the flow charts of FIGS. 5-30, the operation of the microprocessor, under programs stored in the PROM 1112 relevant to the inverter testing, starts at the occurrence of the 3.84 KHz signal (block 200) by saving the registers and disabling the interrupts (201). The program then determines whether AN0-AN3 are selected (202); if so, AN0-AN3 are stored (block 203). If not, AN4-AN7 are stored (204), and in either case the program continues with normal processing (205) and then restores the registers and enables the interrupts (206) before exiting (207).

Figure 6:
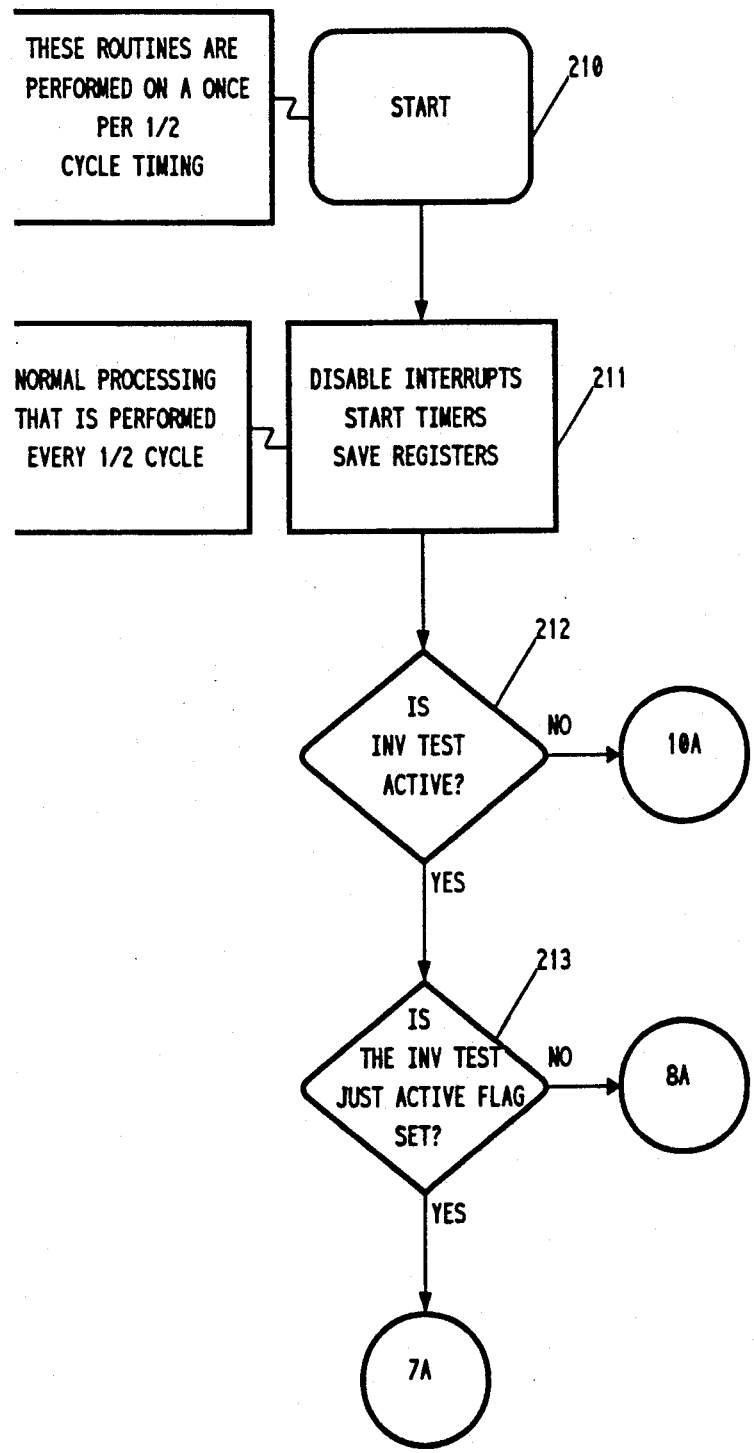
Figure 7:
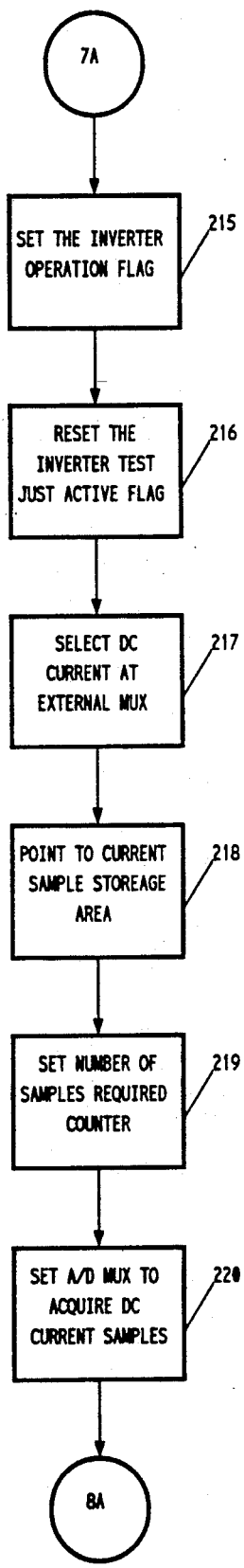
Figure 11:
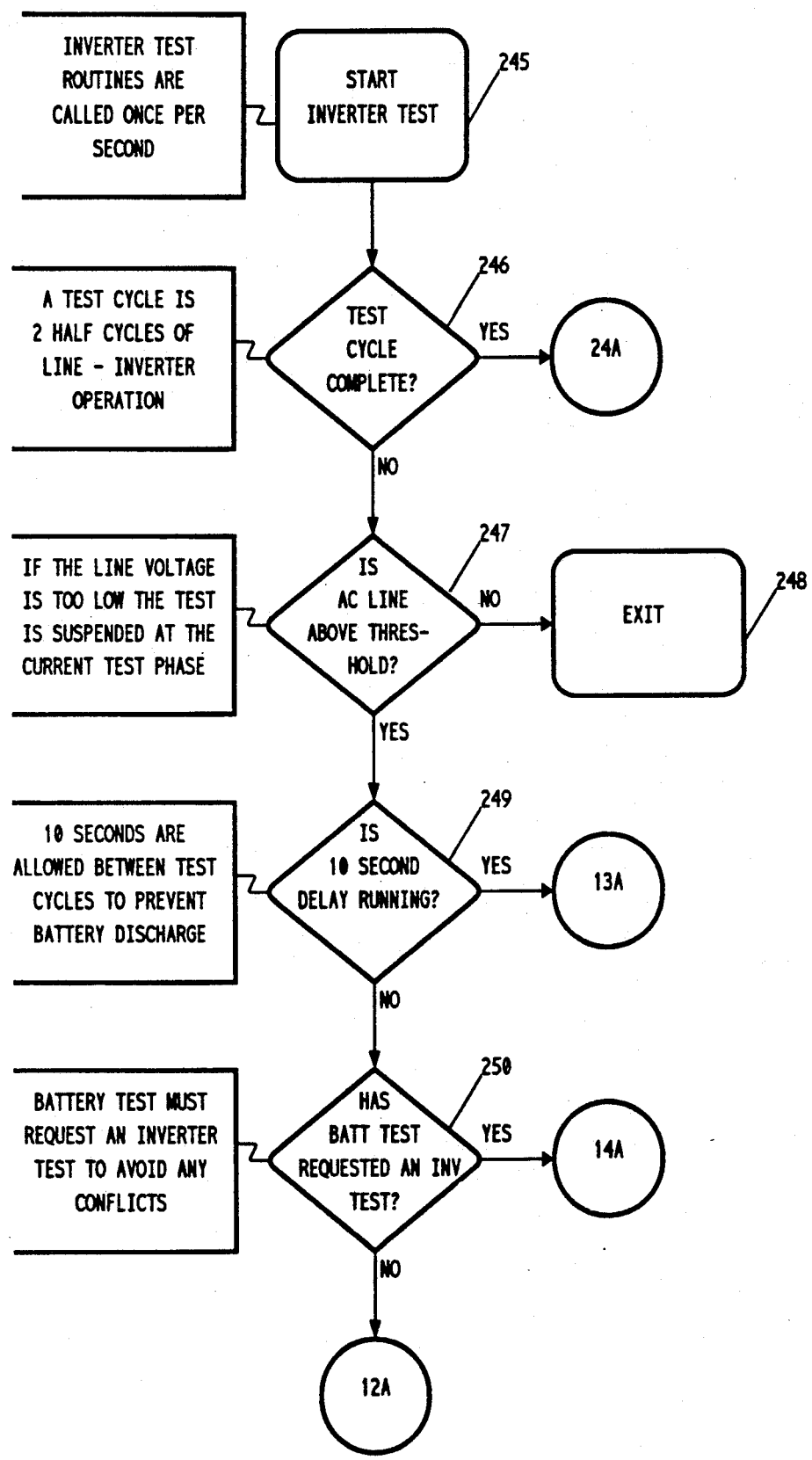

After acquisition of data from the analog-to-digital converter, the inverter testing is carried out based on one-half cycle timing, as illustrated in FIG. 6. The program starts at 210 upon receiving an interrupt from the 120 Hz signal and then disables the interrupts, starts the timers and saves the registers (block 211). The program checks to determine of the inverter test is inactive at 212; if not, the program proceeds to FIG. 10 at 10A; if yes, the program then checks to determine if the inverter test just-active flag has been set at 213. If not, the program proceeds as shown in FIG. 8; and, if yes, the program proceeds as shown in FIG. 7 by setting the inverter operation flag at 215, resetting the inverter test just-active flag at 216, selecting DC current at the multiplexer at 217, pointing to the current sample storage area in the RAM at 218, setting the number of samples required in the counter at 219, and setting the analog-to-digital multiplexer to acquire DC current samples at 220 before proceeding to the program of FIG. 8. The program then determines if two half-cycles have expired at 225; if so, the program proceeds as shown in FIG. 9; if not, the test phase is loaded into the timer and the timer is started at 226, the logic is set to turn-off the inverter gate pulse at the peak of the half-cycle at 227, and the program proceeds as shown in FIG. 10. As illustrated in FIG. 9, the program continues to reset the inverter operation flag at 230, reset the inverter test active flag at 231, set the test cycle complete flag at 232, and switch to normal line delta at 233 before proceeding on to the program as shown in FIG. 11. The program section shown in FIG. 10 enters by performing normal one-half cycle processing at 235, and determining whether one second has elapsed at 236; if not, the program immediately proceeds to restore registers and interrupts at 237; if one second has elapsed, the inverter test routines are called at 238, other once-per-second routines are called at 239, and when these are completed the registers and interrupts are restored at 237 before exiting at 240. This section ensures that the inverter test routines and other once-per-second routines are carried out only once a second.

Figure 12:
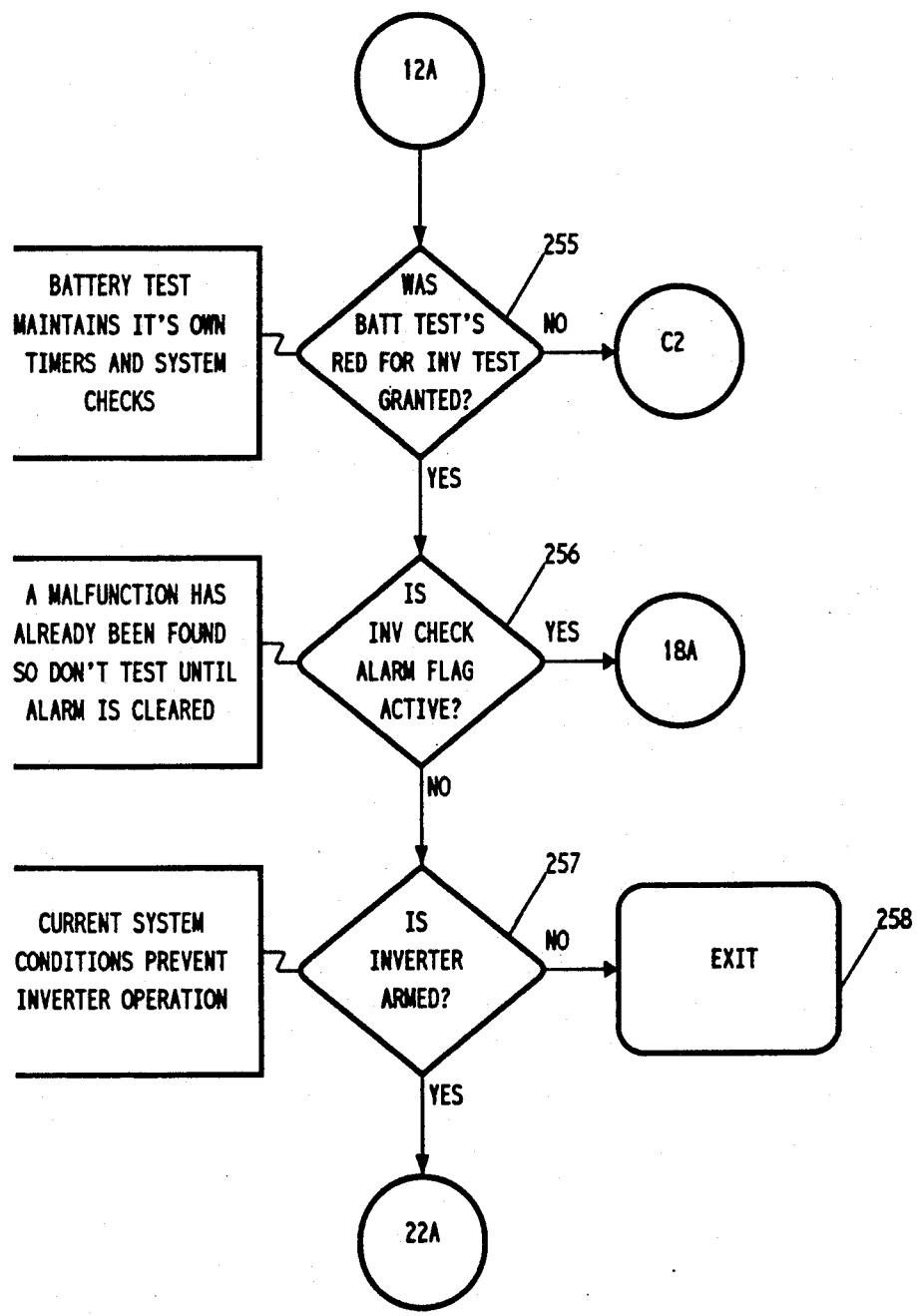
Figure 18:
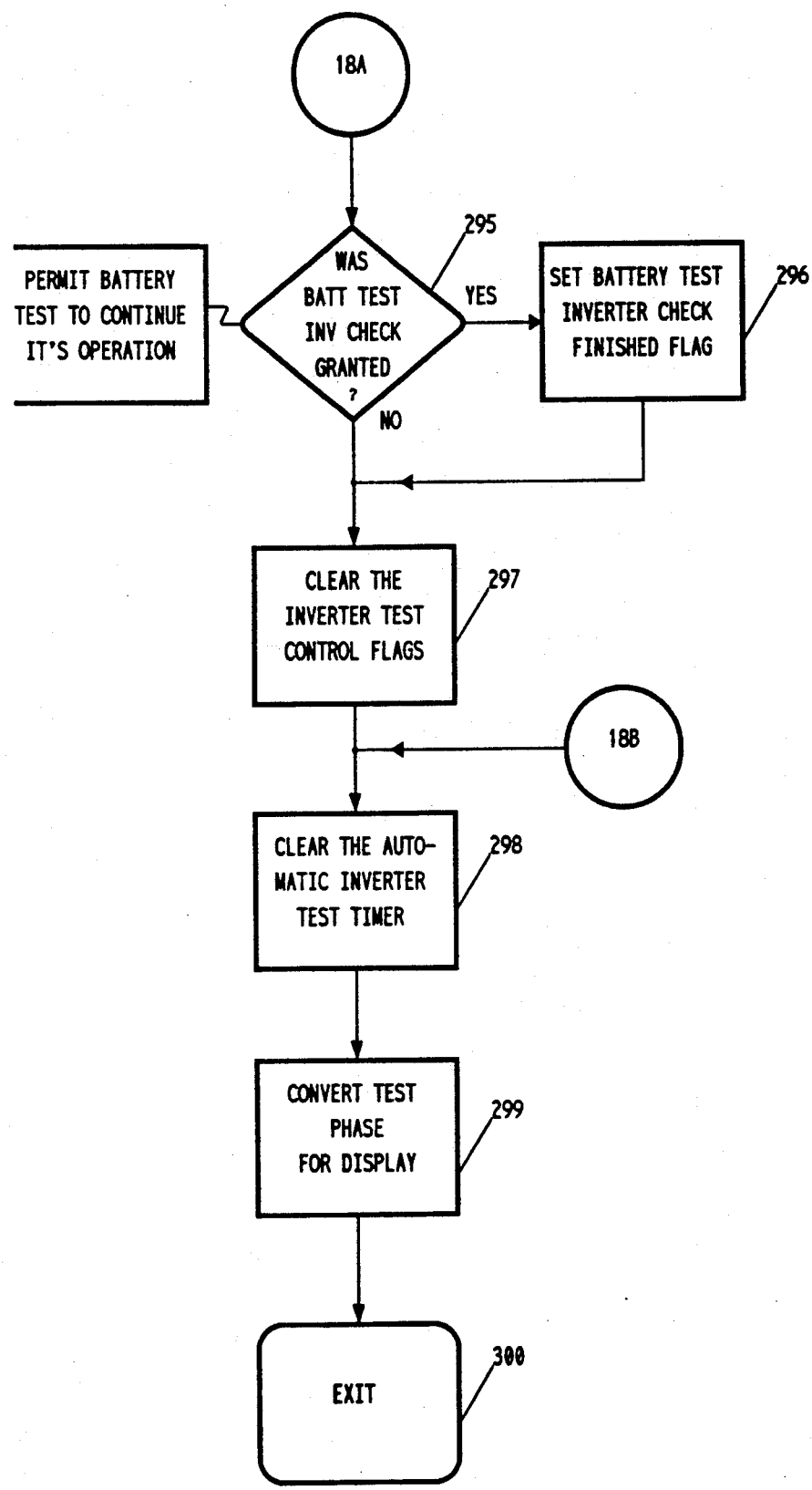
Figures 23, 24:
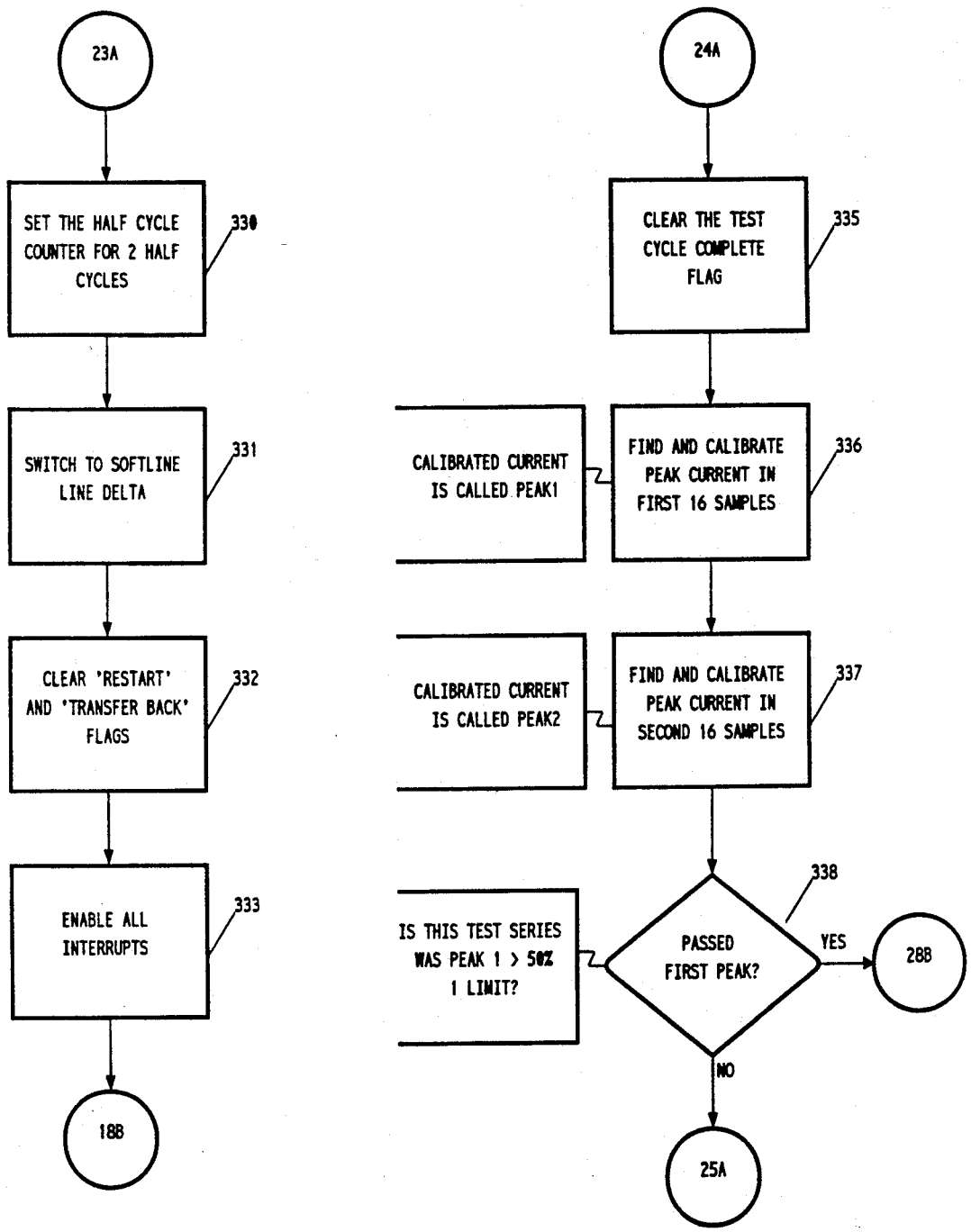

As shown in, FIG. 11, the inverter test starts at 245 and determines first if the test cycle is completed at 246; if so, the program proceeds to that shown in FIG. 24; if not, the program proceeds to determine if the AC line is above threshold at 237; if not, the program exits at 248. If the AC line is above threshold, the program then determines if the 10 second delay is running at 249; if so, the program proceeds to that shown in FIG. 13; and if not, the program determines whether or not the battery test has requested an inverter test at 250. If so, the program proceeds to that shown in FIG. 14; and, if not, the program proceeds to that shown in FIG. 12. As shown in FIG. 12, the program determines whether the battery test request for the inverter test has been granted at 255; if not, the program proceeds to that shown in FIG. 15; and, if so, the program then checks to determine if the inverter check alarm flag is active at 256. If so, the program proceeds as shown in FIG. 18; and, if not, the program determines if the inverter is armed at 257 (for example, the inverter may not be enabled if present system conditions prevent inverter operation). If the inverter is not armed, the program exits, and if it is armed, the program proceeds to that shown in FIG. 22.

Figure 13:
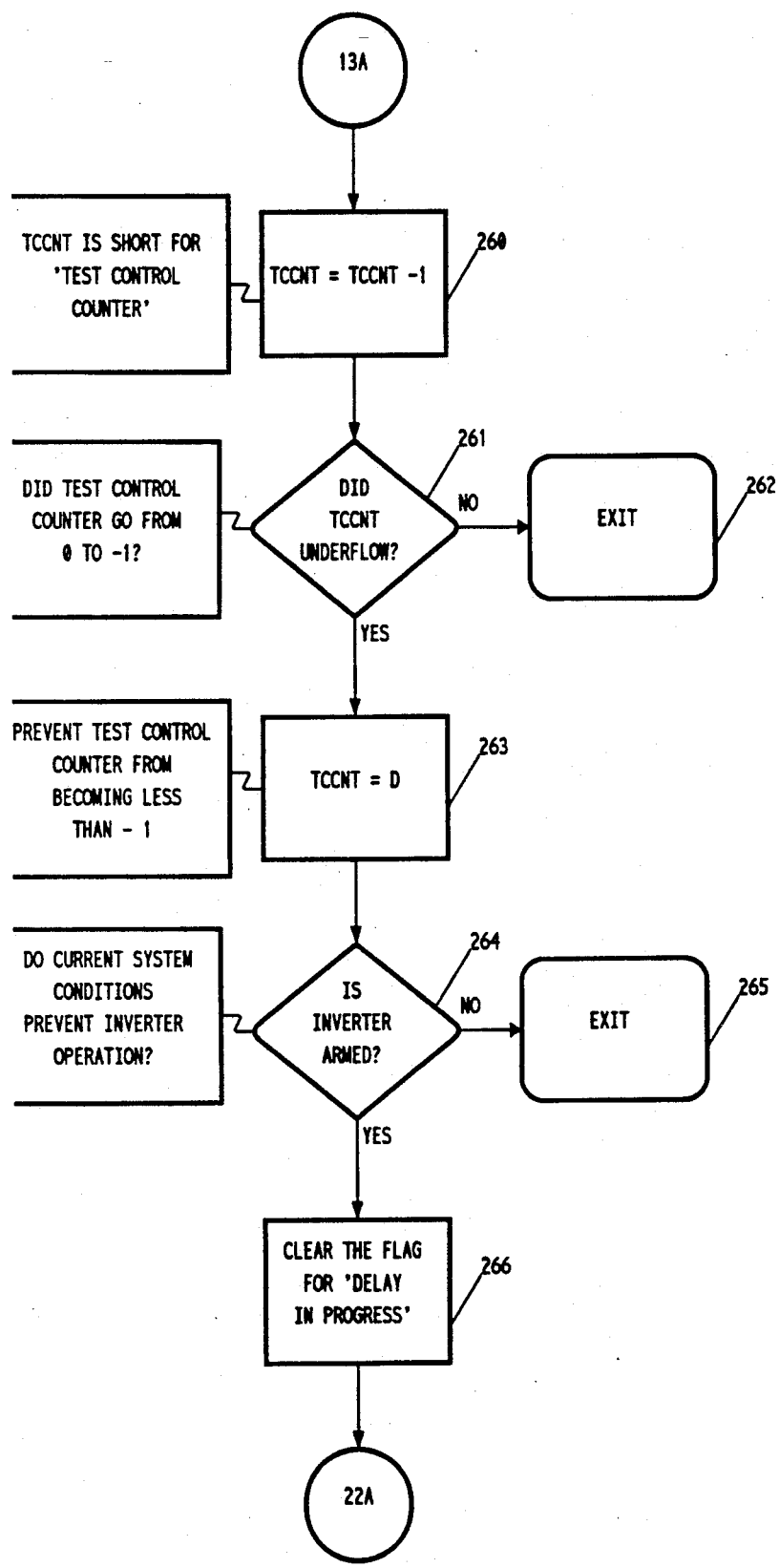
Figures 21, 22:
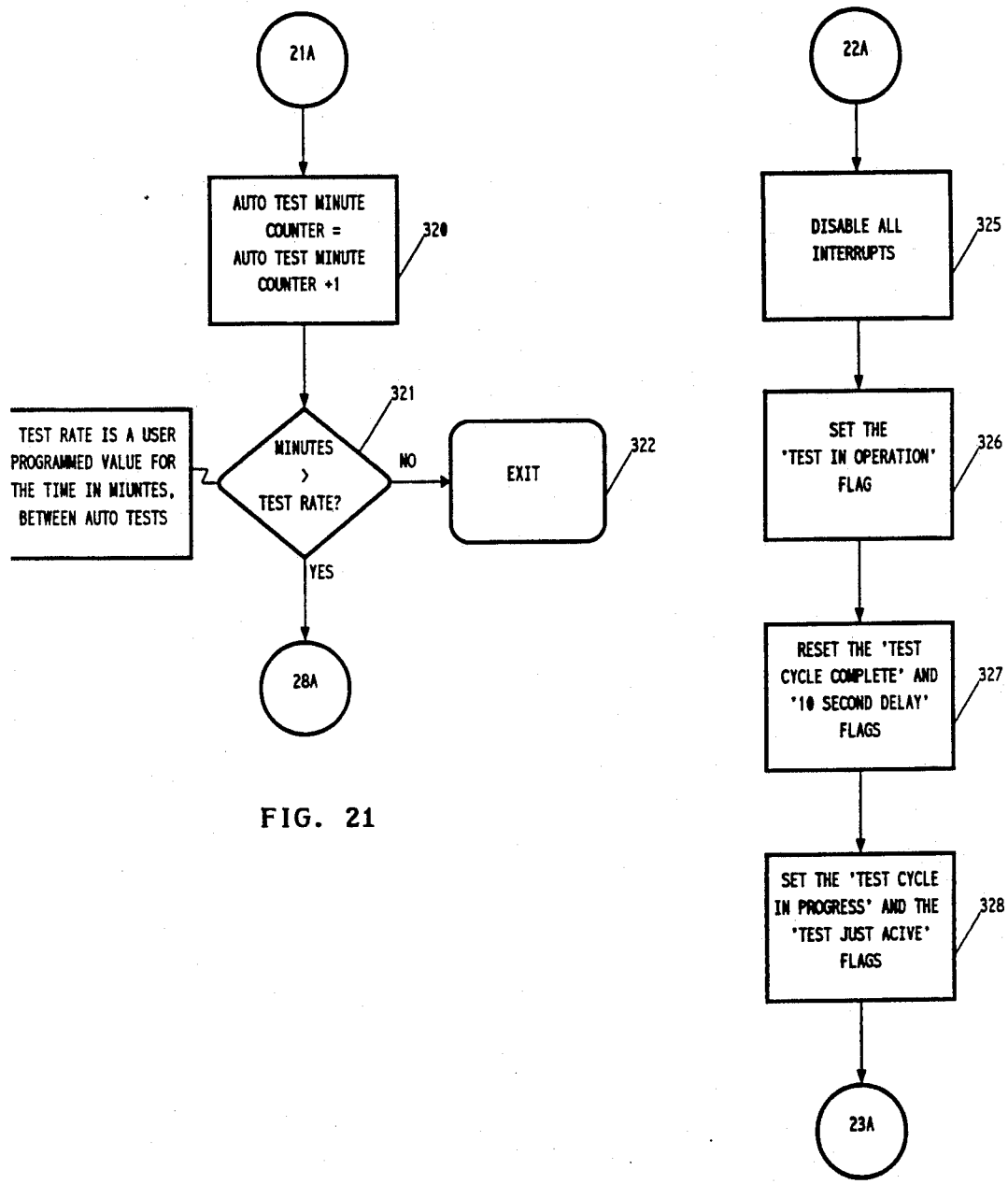

If it is determined at 249 that the 10 second delay is running, the program section shown in FIG. 13 is started by setting the test control counter TCCNT equal to the previous value of TCCNT minus one at 260. It is then determined whether the TCCNT count underflowed at 261 and if not, the program exits at 262. If so, TCCNT is set equal to zero at 263 and it is determined if the inverter is armed at 264. If not, the program exits at 265; if so, the flag is cleared for "DELAY IN PROGRESS" at 266 and the program proceeds on as shown in FIG. 22.

Figure 14:
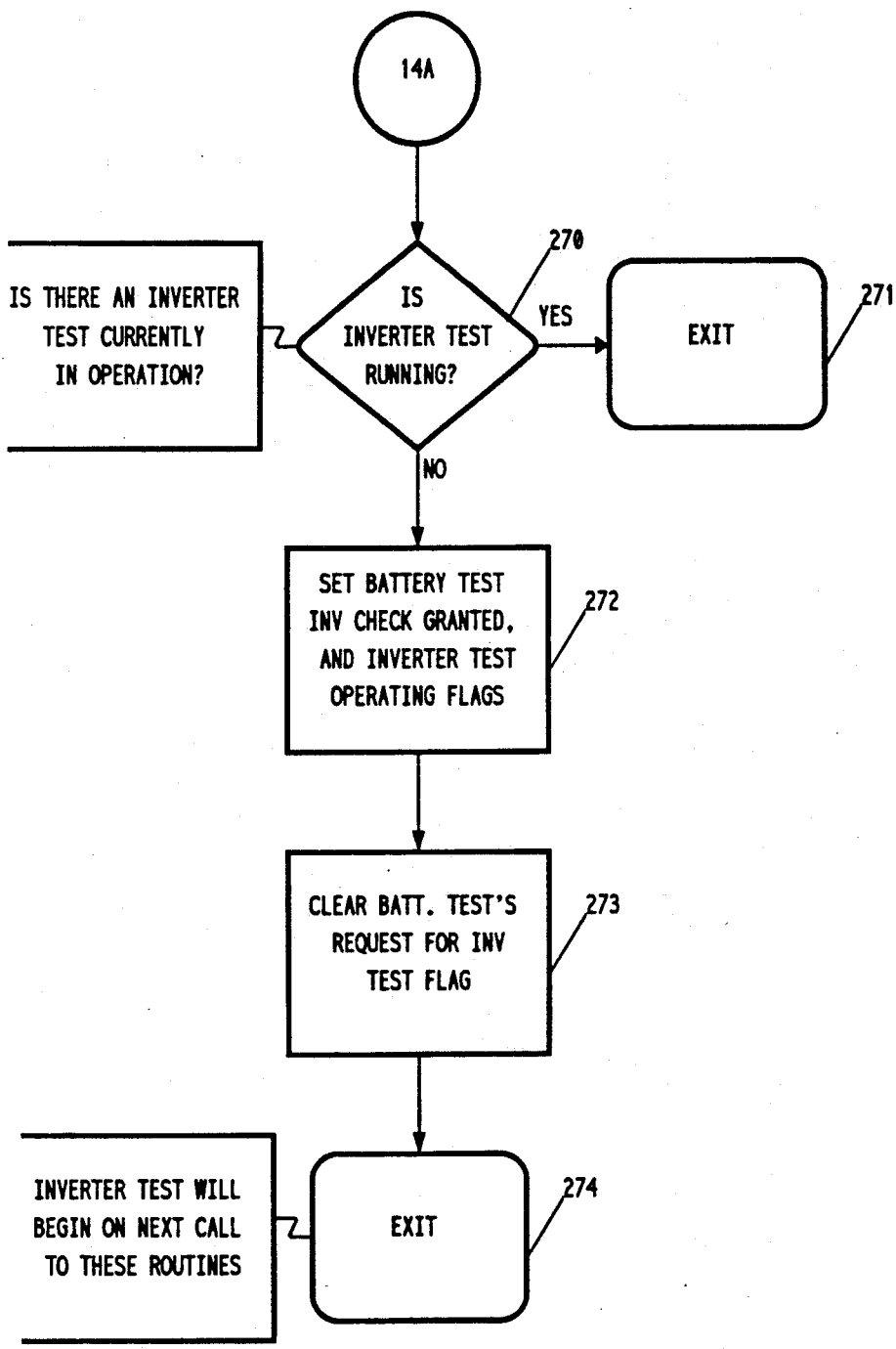
Figure 15:
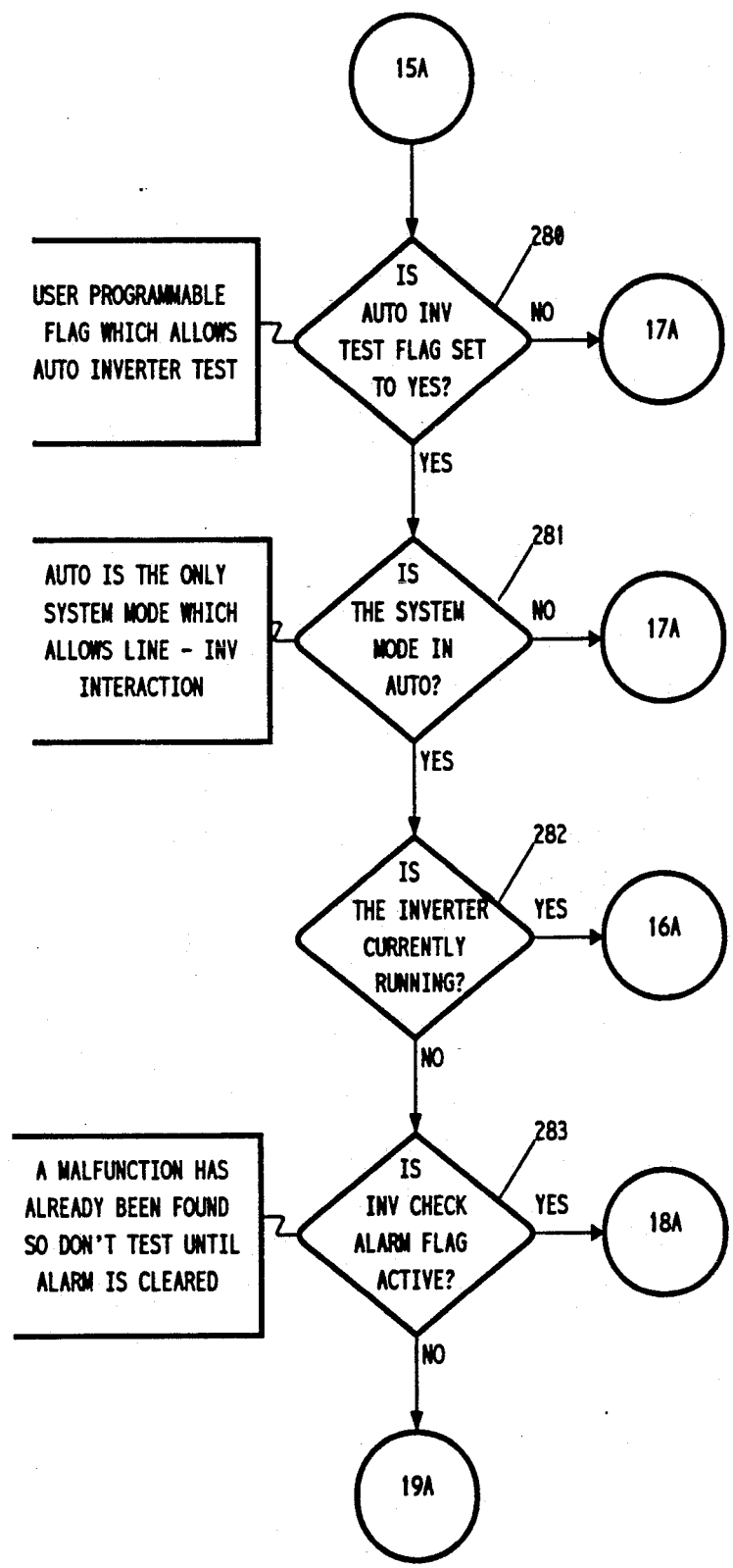
Figure 16:
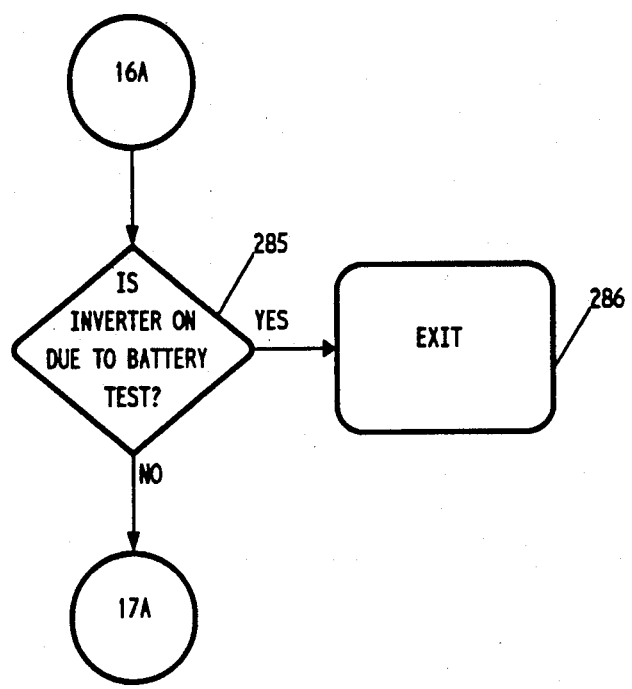
Figure 17:
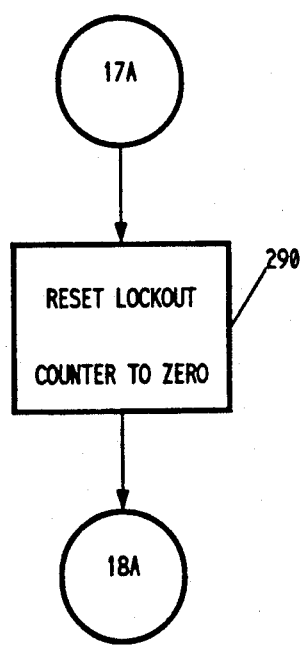
Figure 19:
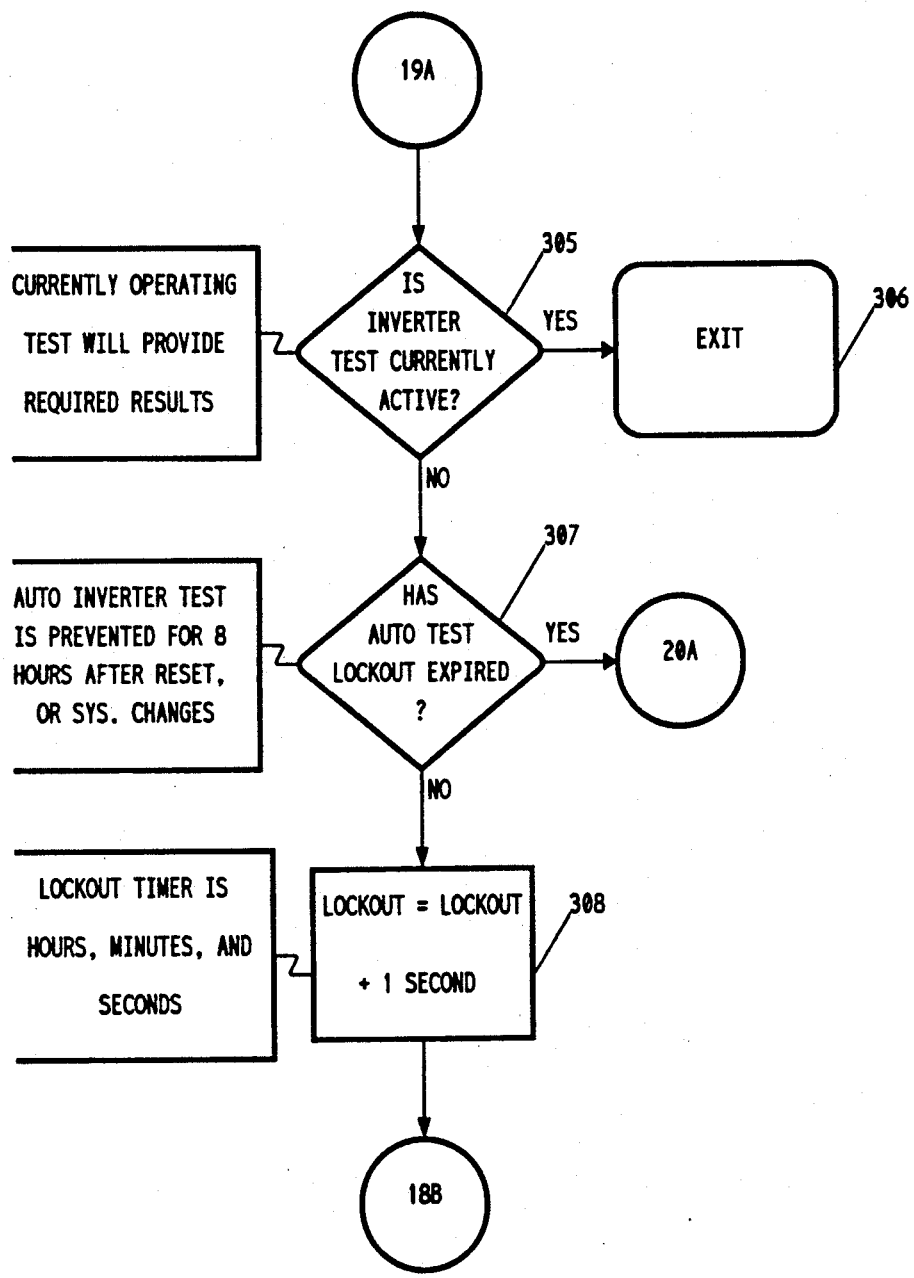

As shown in FIG. 14, the program determines if the inverter test is running at 270 and if so, the program exits at 271; if not, operating flags are set for the battery test, the inverter check granted, and inverter test at 272. The program then clears the battery test request for inverter test flag at 273 and exits at 274. As shown in FIG. 15, the program determines if the auto-inverter test flag is set to "YES" at 280; if not, the program proceeds to FIG. 17, and if so, the program then determines if the system mode is in automatic at 281. If not, the program proceeds as shown in FIG. 17, and if so, the program determines if the inverter is currently running at 282. If so, the program proceeds as shown in FIG. 16; if not, the program checks to determine if the inverter check alarm flag is active at 283; if so, the program proceeds as shown in FIG. 18 and if not, the program proceeds as shown in FIG. 19. When the program enters the portion shown in FIG. 16, a check is made to determine if the inverter is on due to the battery test at 285; if so, the program exits at 286, if not, the program goes on as shown in FIG. 17 to reset the lockout counter to zero at 290 and proceeds as shown in FIG. 18 to determine whether the battery test inverter check was granted at 295. If so, the battery test inverter check finish flag is set at 296; if not, the inverter test control flags are set at 297, the automatic inverter test timer is cleared at 298, the test phase is converted for display at 299 and the program exits at 300.

Figure 20:
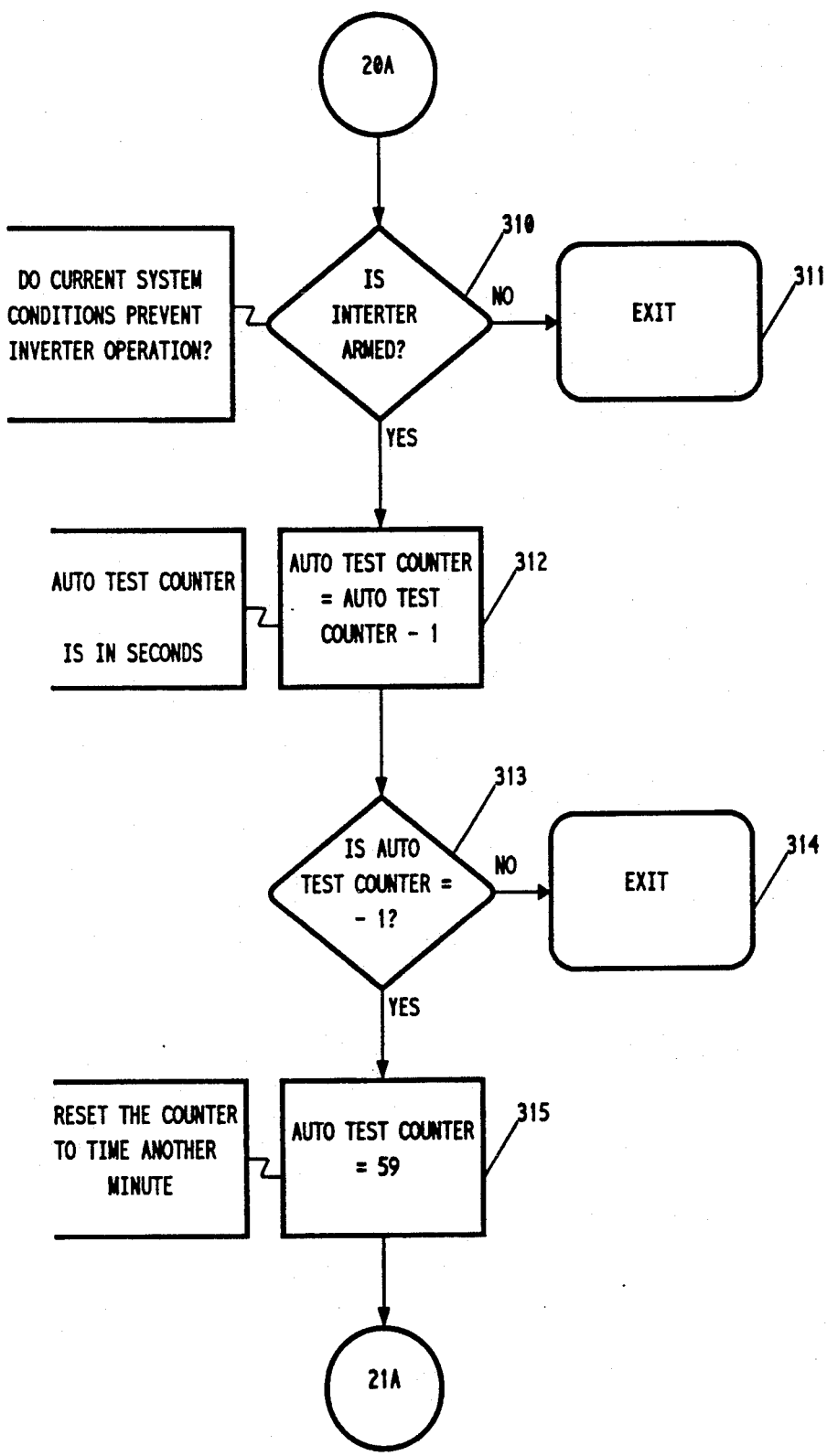

Entering the program section shown in FIG. 19, the inverter test flag is checked to see if it is currently active at 305, if so, the program exits at 306, and if not, it is then determined whether the auto-test lockout has expired at 307. If so, the program proceeds as shown in FIG. 20, and if not, the program sets the term LOCKOUT equal to the previous value of LOCKOUT plus 1 second and then proceeds back to the program of FIG. 18, entering at 18B. Entering the section of the program shown in FIG. 20, a check is made to see if the inverter is armed at 310 and if not, the program exits at 311, and if so, the term AUTO TEST COUNTER is set equal to the previous value of AUTO TEST COUNTER minus one at 312, a check is made to determine if the AUTO TEST COUNTER is equal to minus one at 313, and if not, the program exits at 314; if so, AUTO TEST COUNTER is set equal to 59 at 315 and the program proceeds at shown in FIG. 21 to set AUTO TEST MINUTE COUNTER equal to the previous value of the AUTO TEST MINUTE COUNTER plus 1 at 320, and then checks to determine if the AUTO TEST MINUTES are greater than the TEST RATE value at 321; if not, the program exits at 322 and if so, the program proceeds as shown in FIG. 22 to disable all interrupts at 325, set the "test in operation" flag at 326, reset the "test cycle complete" and "10 second delay" flags at 327 and set the "test cycle in progress" and the "test just active" flags at 328. The program proceeds as shown in FIG. 23 to set the half-cycle counter for two half-cycles at 330, switch to softline line delta at 331, clear the "restart" and "transfer back" flags at 332 and enable all interrupts at 333 before proceeding to enter back into the program section of FIG. 18 at 18B.

Figures 25, 26:
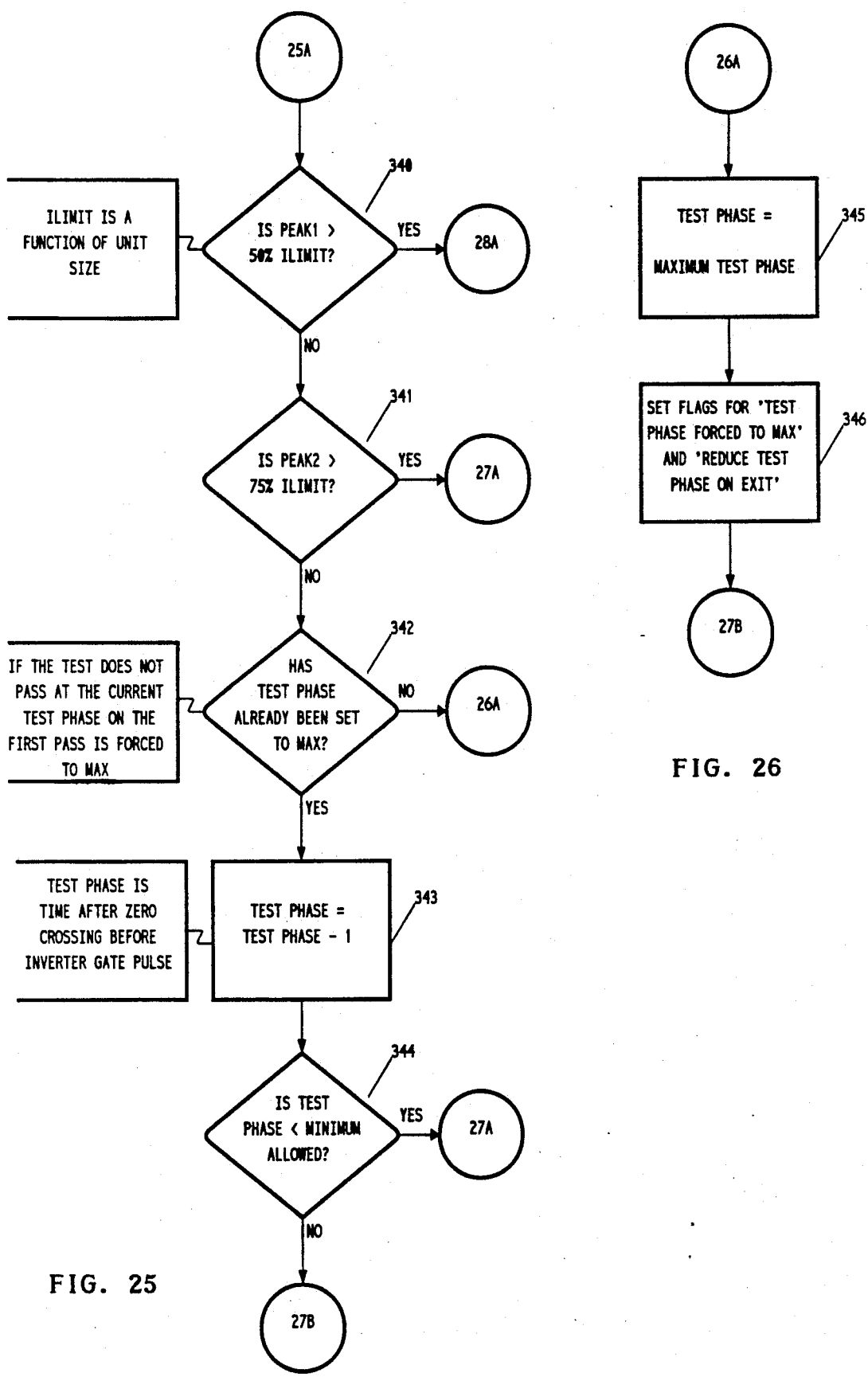
Figure 27:
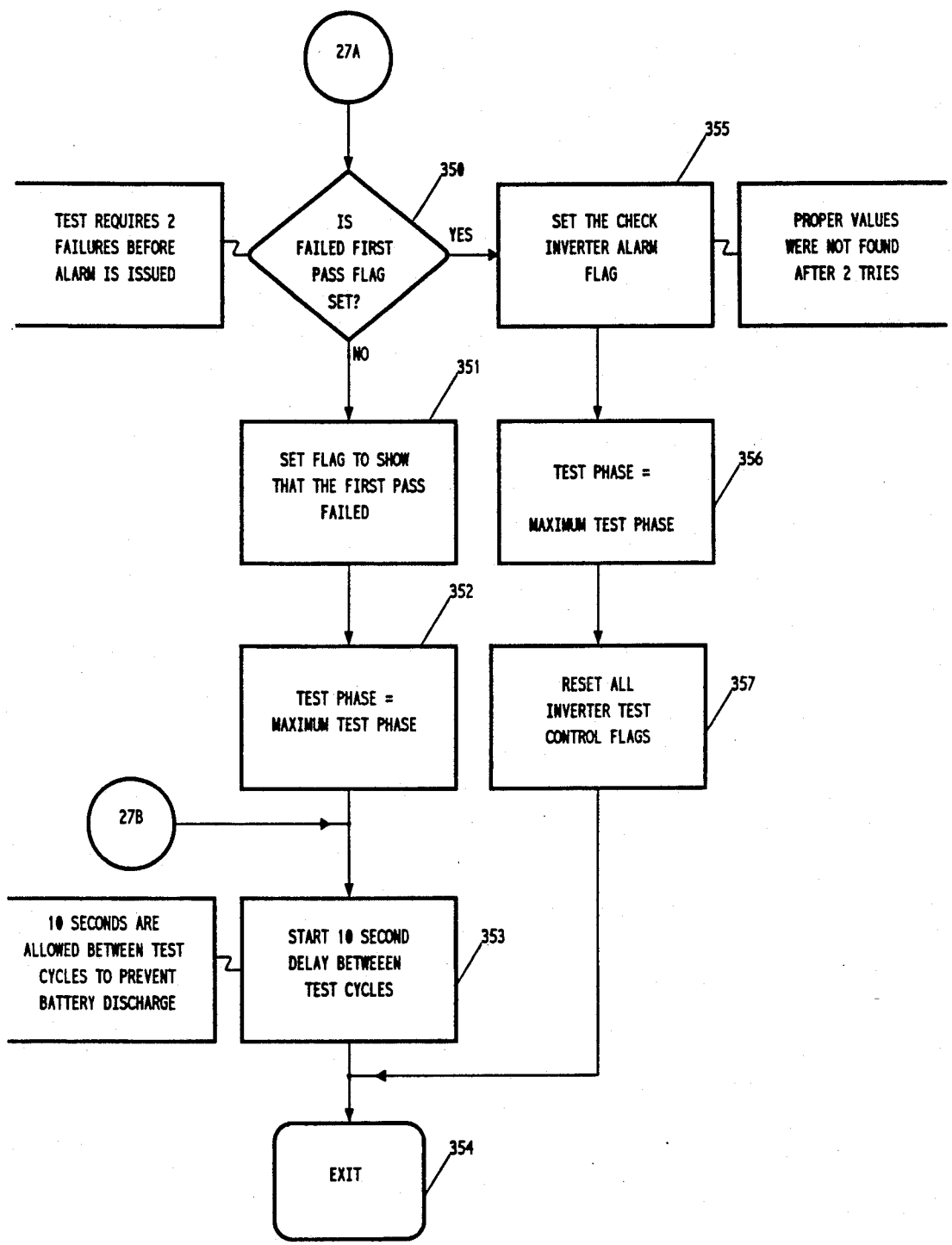
Figure 28:
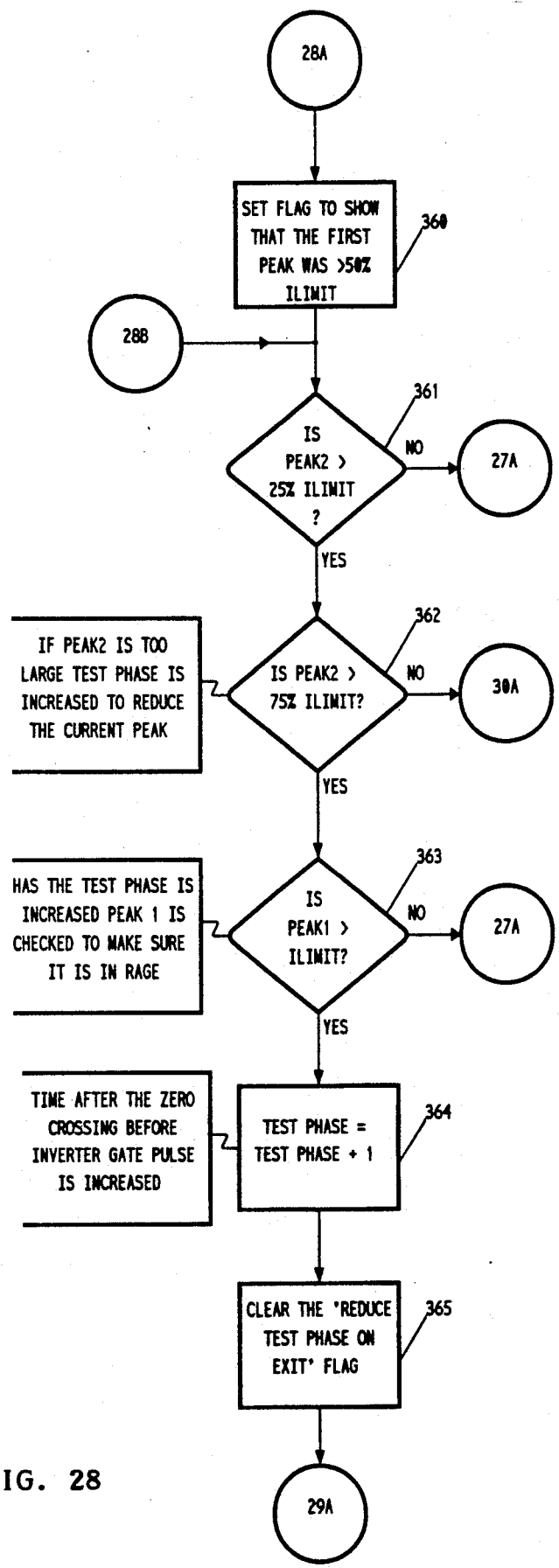

The section of the program shown FIG. 24 begins by clearing the "test cycle complete" flag at 335, finding and calibrating the peak current in the first 16 samples at 336, finding and calibrating the peak current in the second 16 samples at 337, and determining if the first peak has passed at 338, that is, whether the Peak 1 is greater than 50% of the current limit. If so, the program proceeds as shown in FIG. 28, entering at 28B; if not, the program proceeds as shown in FIG. 15 by determining whether Peak 1 is greater than the 50% current limit at 340. If so, the program proceeds as shown in FIG. 28, entering at 28A, and, if not, it is then determined whether Peak 2 is greater than the 75% current limit at 341. If so, the program proceeds as shown in FIG. 27, and if not, it is then determined whether test phase has already been set to the maximum at 342. If not, the program proceeds to FIG. 26 and if so, TEST PHASE is set equal to the previous value of TEST PHASE minus one at 343, and then TEST PHASE is then checked to determine whether it is less than the minimum allowed test phase at 344. If so, the program proceeds as shown in FIG. 27, entering at 27A, and, if not, the program enters at 27B. As shown in FIG. 26, entering at 26A, the program sets TEST PHASE equal to the maximum test phase at 354 and sets flags for "test phase forced to max" and "reduce test phase on exit" at 346 before proceeding on to enter the program section of FIG. 27 at 27B.

With reference to FIG. 27, entering at 27A, the program first checks to determine if the failed first pass flag is set at 350; if not, the flag is set to show that the first passed failed at 351, the test phase is set equal to the maximum test phase at 352, a 10 second delay is started between test cycles at 353 and the program then exits at 354. If at 350 it is found that the failed first pass flag has been set, the check inverter alarm flag is set at 355, the test phase is set equal to the maximum test phase at 356, and all inverter test control flags are reset at 357 before the program exits at 354.

Figure 29:
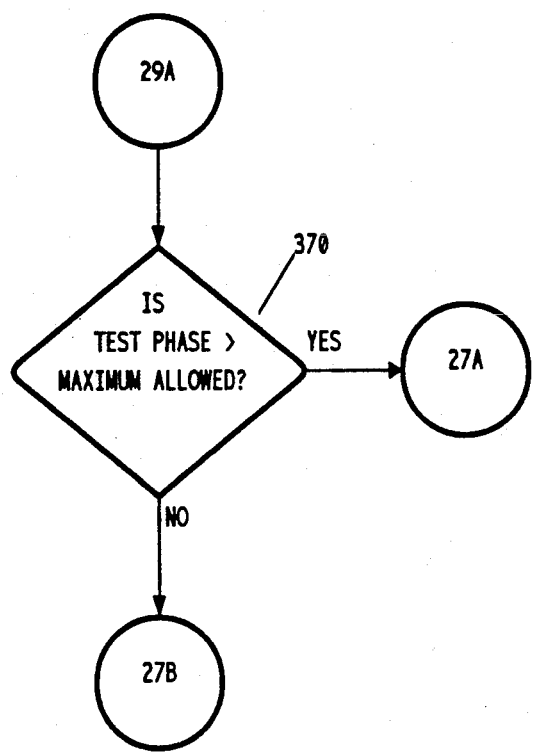
Figure 30:
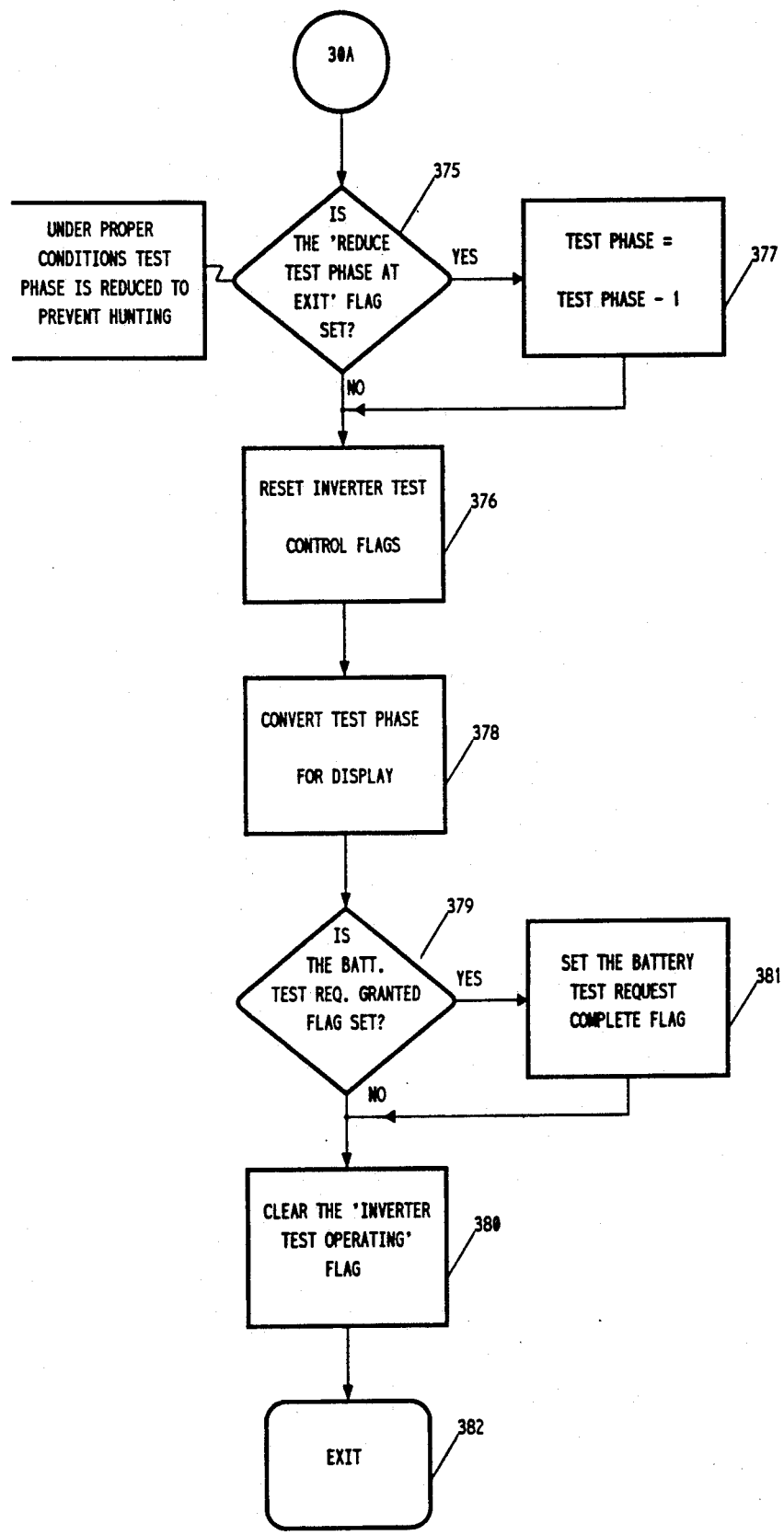

Entering the section of the program shown in FIG. 28, a flag is set to show that the first peak was greater than the 50% current limit at 360, and Peak 2 is then checked to see whether it is greater than 25% of the current limit at 361; if not, the program proceeds as shown in FIG. 27, and if so, Peak 2 is checked to see if it is greater than 75% of the current limit; if not, the program proceeds as shown in FIG. 30, and if so, Peak 1 is checked to see if it is greater than 25% of the current limit at 363. If not, the program proceeds as shown in FIG. 27, and if so, TEST PHASE is set equal to the previous value of TEST PHASE plus one at 364, and the "REDUCE TEST PHASE ON EXIT" is cleared at 365 before proceeding as shown in FIG. 29 to determine if the test phase is greater than the maximum allowed at 370. If so, the program proceeds as shown in FIG. 27, entering at 27A and, if not, the program proceeds by entering at 27B.

When the program enters the section shown in FIG. 30, the program first checks whether the "REDUCED TEST PHASE AT EXIT" flag is set at 375; if not, the inverter test control flags are reset at 376, and, if so, the test phase is set equal to the previous value of TEST PHASE minus one at 377 before resetting the inverter test control flags. The test phase is then converted for display at 378 and a check is made to determine if the battery test request granted flag has been set at 379. If not, the "INVERTER TEST OPERATING" flag is cleared at 380 and, if so, the "BATTERY TEST COMPLETE" flag is set at 381 before the inverter test operating flag is cleared. The program then exits at 382 and the inverter test operation is complete.

Battery Test Procedure

Once the controller 80 has determined that the inverter is operating properly, a battery test procedure may then be carried out to operate the load from the battery without line power to determine the remaining run time of the battery. Preliminary to carrying out the adaptive battery test, the microprocessor under its software direction calculates output load, which is used to determine run time, alarm functions, display functions, and to determine a factor which will be used in the adaptive battery test. The output volts-amperes (VA) is calculated as the product of the true RMS (root mean square) output voltage and the true RMS output current. Output watts are calculated as the sum of the instantaneous product of the output voltage and output current over a cycle divided by the number of instantaneous samples acquired for a line cycle. Once VA and watts have been calculated, power factor can be calculated. The samples used for calculating watts are also analyzed to determine if the power factor is of the distortion or displacement type, and if displacement, whether leading or lagging. By knowing power factor, a VA limit for the unit can be calculated. The present percent of load is then determined as the present value of VA divided by the VA limit times 100.

A run time calculation is used for alarms, displays, and the adaptive battery test. The adaptive battery test uses run time calculations that are performed during inverter operation as follows:

$$T_{IR} = \frac{K \times B_C \times (V_{DC} - V_{BL})^2}{(V_{FC} - V_{DC}) \times (P_{LD} + P_{LS})}$$

where:
$T_{IR}$ is the remaining inverter run time available from the battery,
K is an experimentally determined constant,
$B_C$ is the rated ampere hour capacity of the battery,
$V_{DC}$ is the measured DC output voltage from the battery,
$V_{BL}$ is the predetermined low battery voltage set point at which the battery should no longer provide power,
$V_{FC}$ is the full charge battery voltage,
$P_{LD}$ is the calculated power drawn by the load in watts, and
$P_{LS}$ is the loss in watts in the inverter.

The order of the calculations in the software provides current values to those routines which use those values, ensuring that the results of the routines are accurate. Output load power drawn in watts is calculated before run time because run time ($T_{IR}$) requires the load watts. Both output load and RUN TIME are calculated before the adaptive battery test routine is called so that current values can be used during the test.

The adaptive battery test is performed periodically. The flow charts of the program carried out in the microprocessor to perform the battery test are illustrated in FIGS. 31-46.

Figure 31:
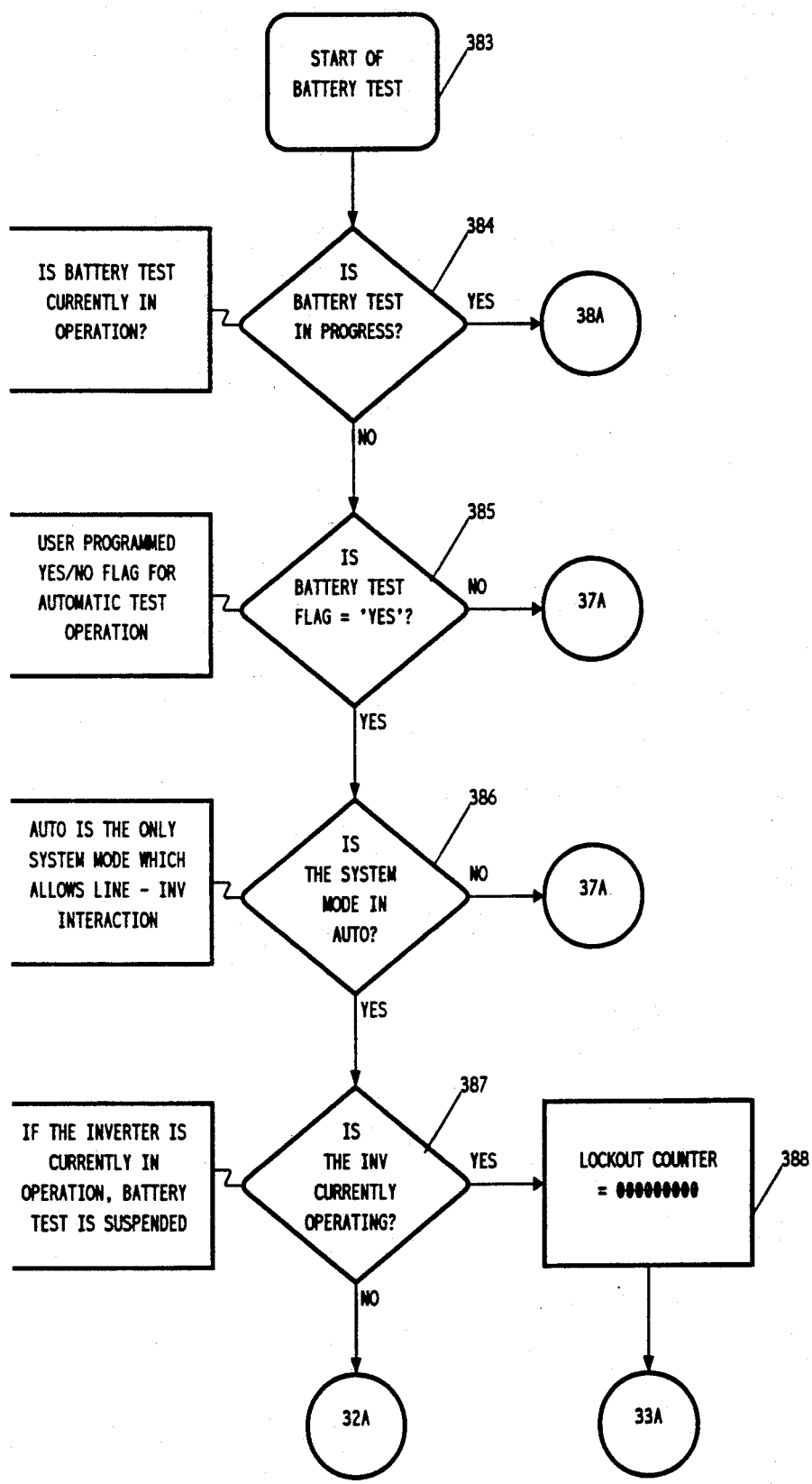
FIGS. 31–46 are illustrative flow charts showing the operation of the microprocessor controller during the battery test of the present invention.
Figure 37:
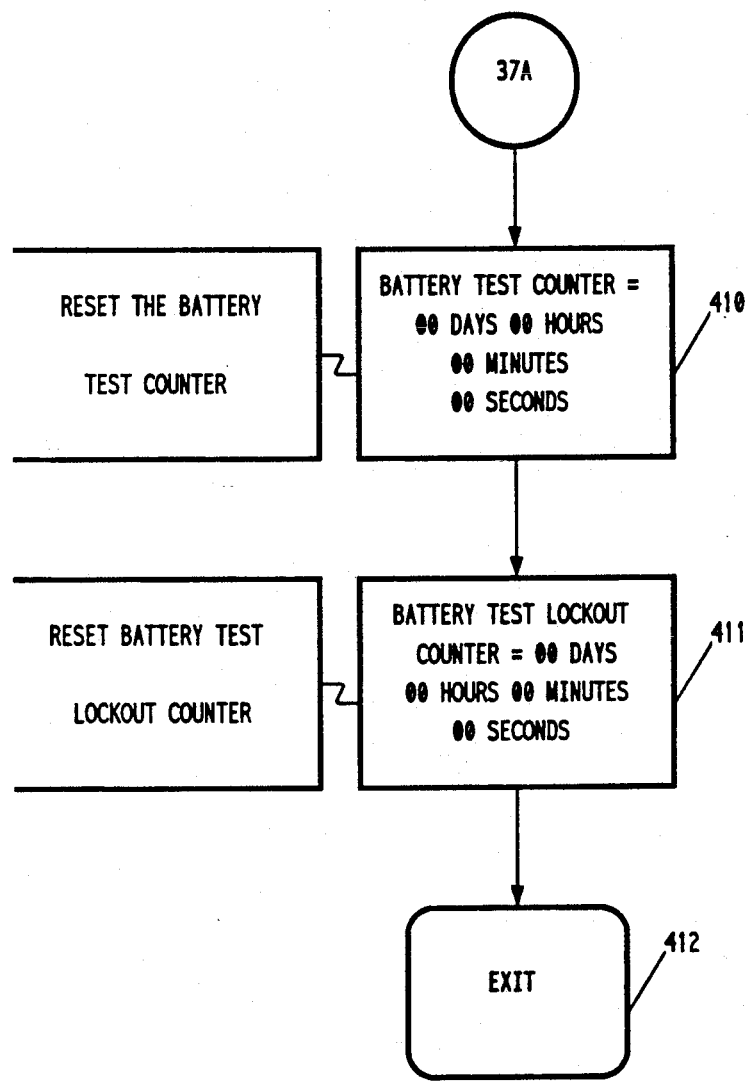
Figure 38:
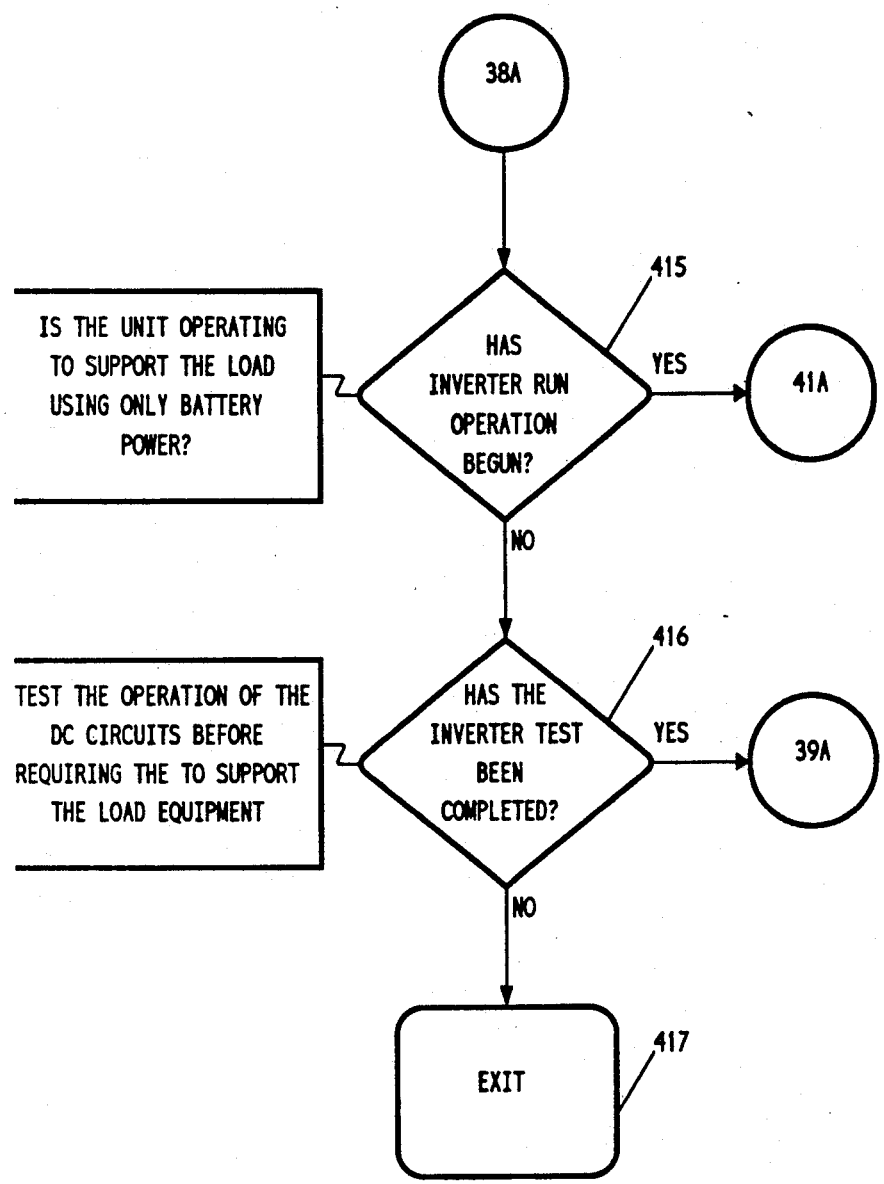

With reference to FIG. 31, the battery test routine is entered at 383 upon an interrupt provided by the 120 Hz signal. After entry a flag is tested at 384 to determine if the battery test is in progress. If so, the program continues as shown in FIG. 38, and if not, a flag which is programmable through the user interface is tested at 385. If this flag is set at "no", then the automatic adaptive battery test is not performed and the program continues as shown in FIG. 37 to clear the control timers. The system may still perform a manual adaptive battery test if instructed to do so by the user through the user interface. The default setting for the battery test flag is YES. If the flag is found to be YES at 385, the system mode control is tested to determine if the current status is AUTO. If not, the program continues as shown in FIG. 37. AUTO is the only system mode which allows line-inverter operation, which is required for the adaptive battery test.

Figure 32:
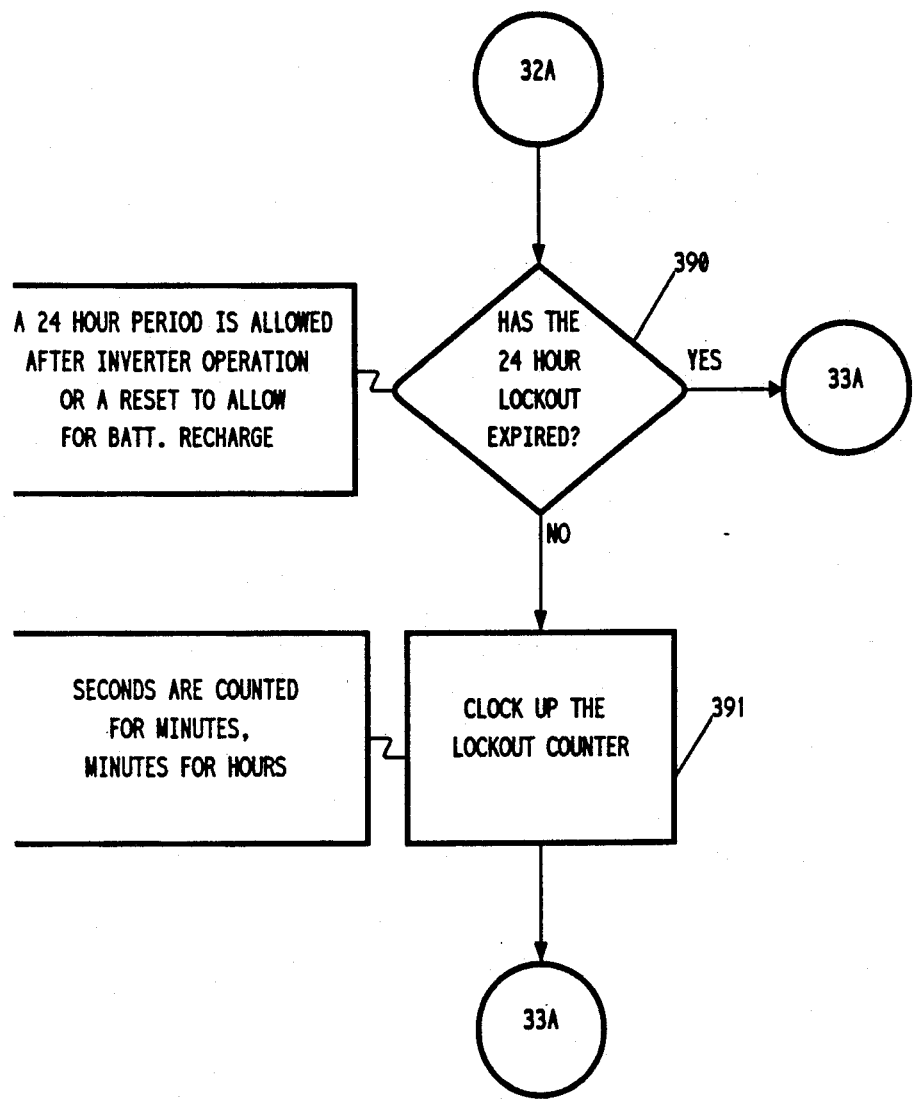

If the system mode is in AUTO, the inverter control flag is tested at 387 to determine if the inverter is currently in operation. If not, the program proceeds as shown in FIG. 32, and if so, a 24 hour lockout counter is cleared at 388. This lockout timer or counter insures that the battery is at a known state of charge provided that the battery charger is operating correctly. If the battery charger does not restore the battery capacity in 24 hours with the 24 lockout counter as shown, the adaptive battery test will fail and an alarm will be issued to the user through the user interface to "CHECK BATTERY". The program will then continue as shown in FIG. 33.

If the inverter control flag is found not to be set at 387, the program continues as shown in FIG. 32. The lockout counter is tested at 390 to determine if 24 hours has passed since the last inverter operation, system mode change or system turn-on (reset). If it has not, the lockout seconds counter is clocked at 391 and, specifically, if it equals one minute, then the minutes are clocked, and if the minutes equal one hour, the hours are clocked.

Figure 33:
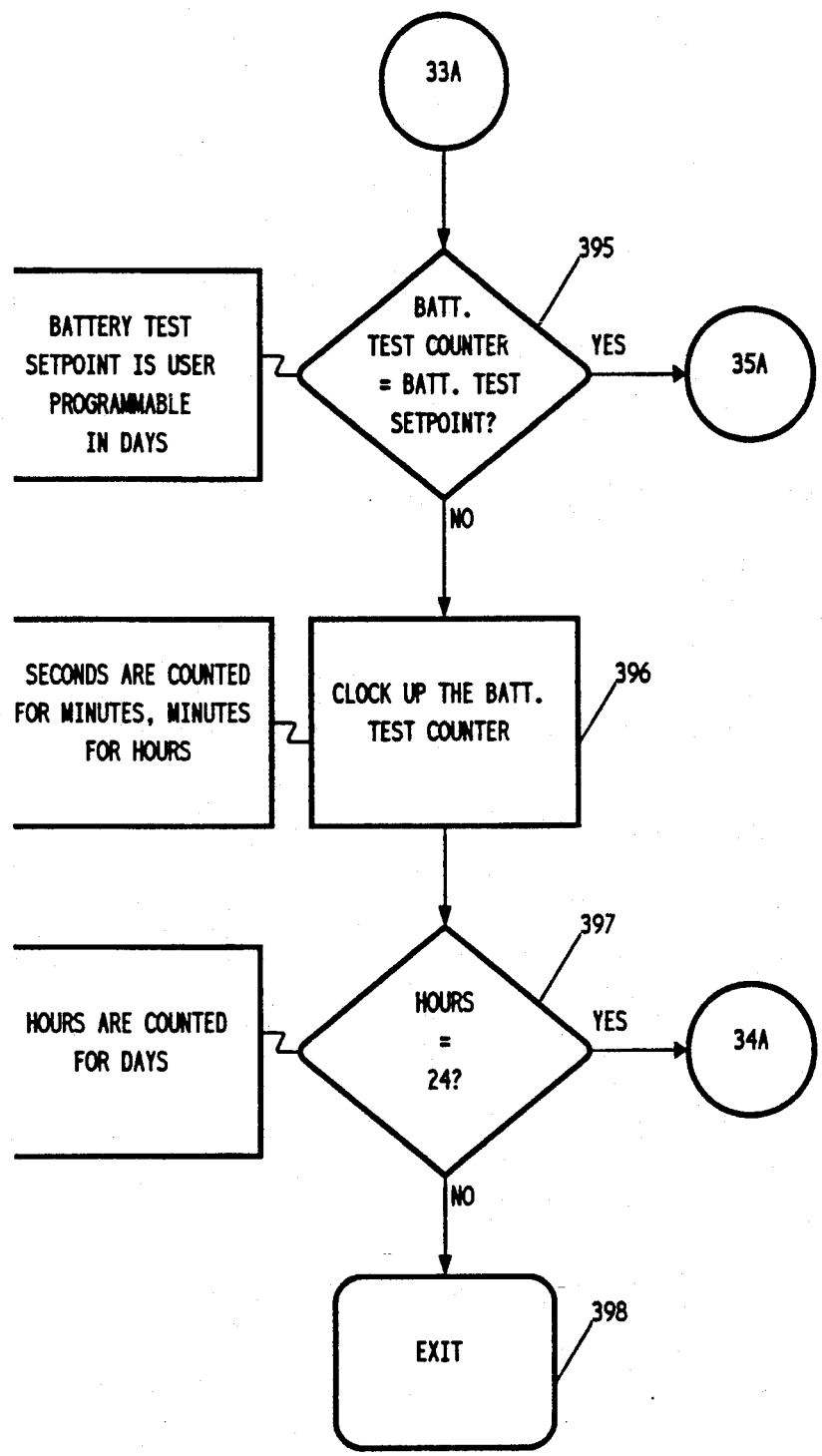
Figure 35:
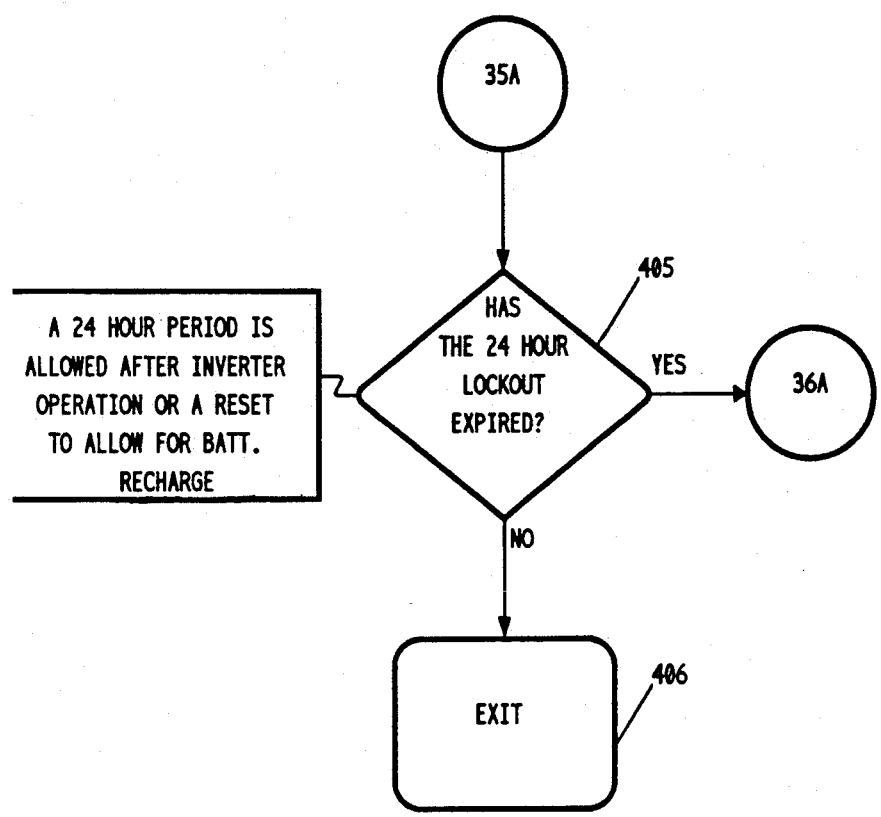

If the lockout counter has either expired (lockout counter=24 hours) or been clocked up by 1 second, the program continues as shown in FIG. 33 with the battery test counter, which controls when the automatic adaptive battery test is performed, tested at 395 to see if a match with the user programmable set point has occurred. The user set point is programmable in days, with a specified default setting if it is not programmed by the user, e.g., thirty days. If the battery test counter matches the set point, the program proceeds as shown in FIG. 35; and, if it does not, the seconds are clocked up at 396 and if the seconds equal one minute, the minute counter is clocked up, and when the minutes equal one hour, the hour counter is clocked up. Hours are tested to find if one day has expired, and if it has, the days counter is clocked up. The hours counter is tested at 397 to determine if it equals one day (24 hours) and if it has not, the routine is exited at 398 and program flow is returned to the 120 Hz interrupt with called the adaptive battery test routine.

Figure 34:
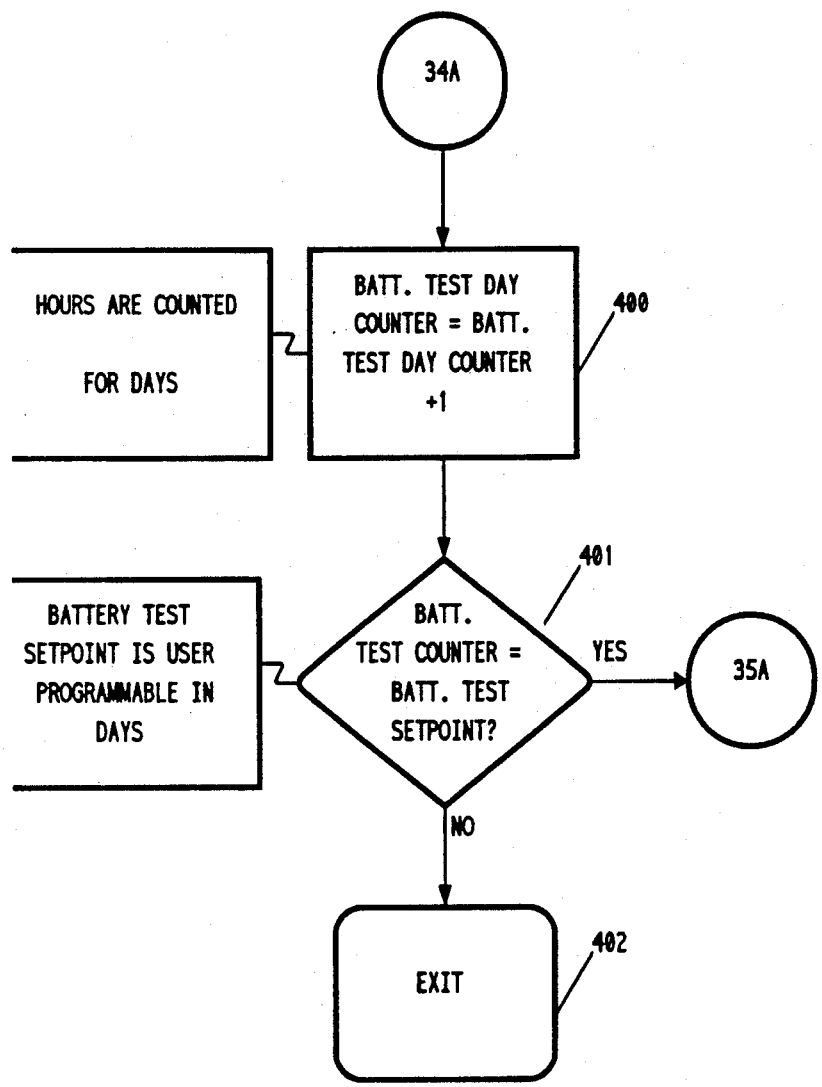
Figure 36:
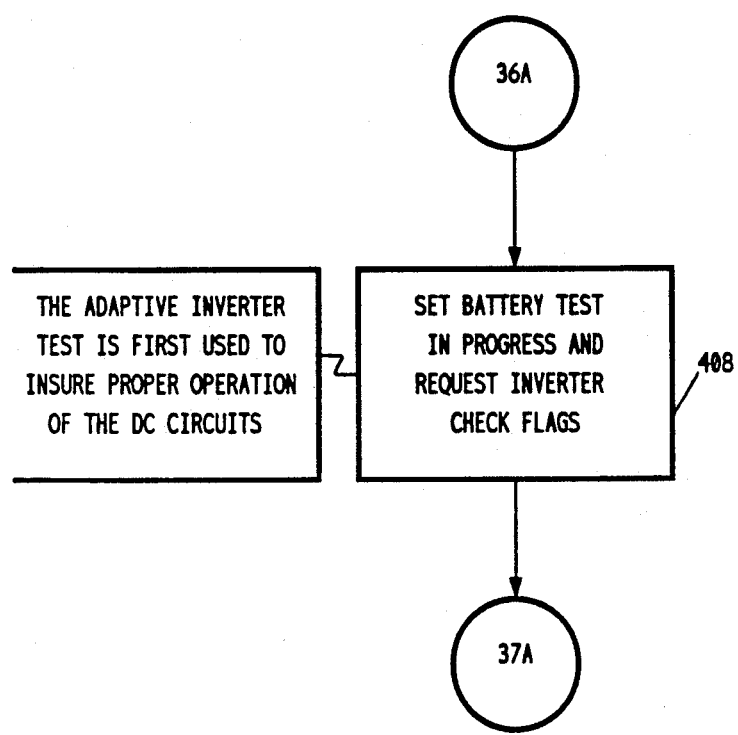

If the hours counter is found at 397 to equal 24, the program proceeds as shown in FIG. 34 to clock up the day counter by 1 at 400. The battery test counter is then compared at 401 to find out if it now equals the user programmed set point. If it does not, the program exits at 402 and the program flows return to the 120 Hz interrupt. If the battery test counter does equal the user programmed set point, the program flow continues as shown in FIG. 35. The lockout counter is tested again at 405 because if it had not expired before, it was clocked and may have now expired. If the lockout counter has not expired, the program exits and program flow returns to the 120 Hz interrupt. If it has expired, the program continues as shown in FIG. 36.

At this point, the adaptive battery test procedure has now determined that the proper conditions have been met to begin an adaptive battery test cycle. A control flag is set at 408 which prevents a manual test from starting at this time, and this flag is used to show other software routines that an adaptive battery test cycle is in progress. A second control flag is also set which is used by the adaptive inverter test routine described above to start an inverter test cycle.

With the control flags having been set, the program flow continues as shown in FIG. 37. The battery test counter is reset at 410 and the lockout counter is reset at 411. The program then exits at 412 and program control is returned to the 120 Hz interrupt.

Figure 39:
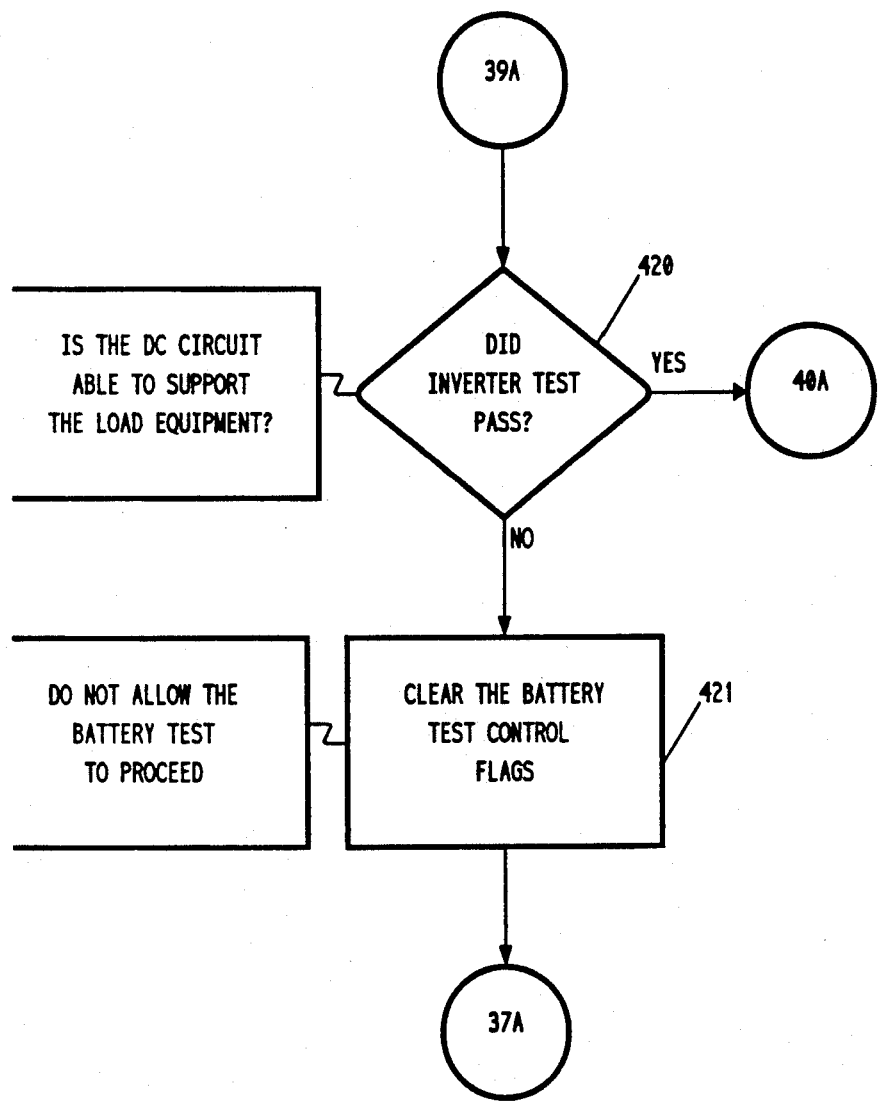

Now at this time, when the adaptive battery test routines are next called, the first decision at 384 in FIG. 31, determining "IS BATTERY TEST IN PROGRESS?" will result in a true or YES answer and the program flow is then redirected to the routine shown on FIG. 38. Because the results of the adaptive inverter test have not been analyzed at this point in time, the decision point at 415 as to "HAS INVERTER RUN OPERATION BEGUN?" will be false or NO; then a control flag is checked at 416 which is set when the adapted inverter test completes the test cycle that adaptive battery test requested is checked. If the flag was found not be set at 416, the program exits at 417 and program control is returned to the 120 Hz interrupt. If the flag is set at 416, program flow continues as shown in FIG. 39.

When the adaptive inverter test is carried out as described previously, a failure of the test will result in an alarm flag being set which will alert the user to a failure mode. The adaptive battery test routine first checks at 420 to determine whether the inverter test was passed by checking for this alarm flag. If the inverter check flag is set, the adaptive battery test control flag is reset at 421 and the adaptive battery test is transferred to the program flow as shown in FIG. 37 to abort the battery test cycle. This is done to prevent switching the output load to battery power when the inverter circuit is not functioning properly. Having aborted the adaptive battery test cycle, program flow is directed as shown in FIG. 37 to clear the control timers or counters, and program flow is returned to the 120 Hz interrupt.

Figure 40:
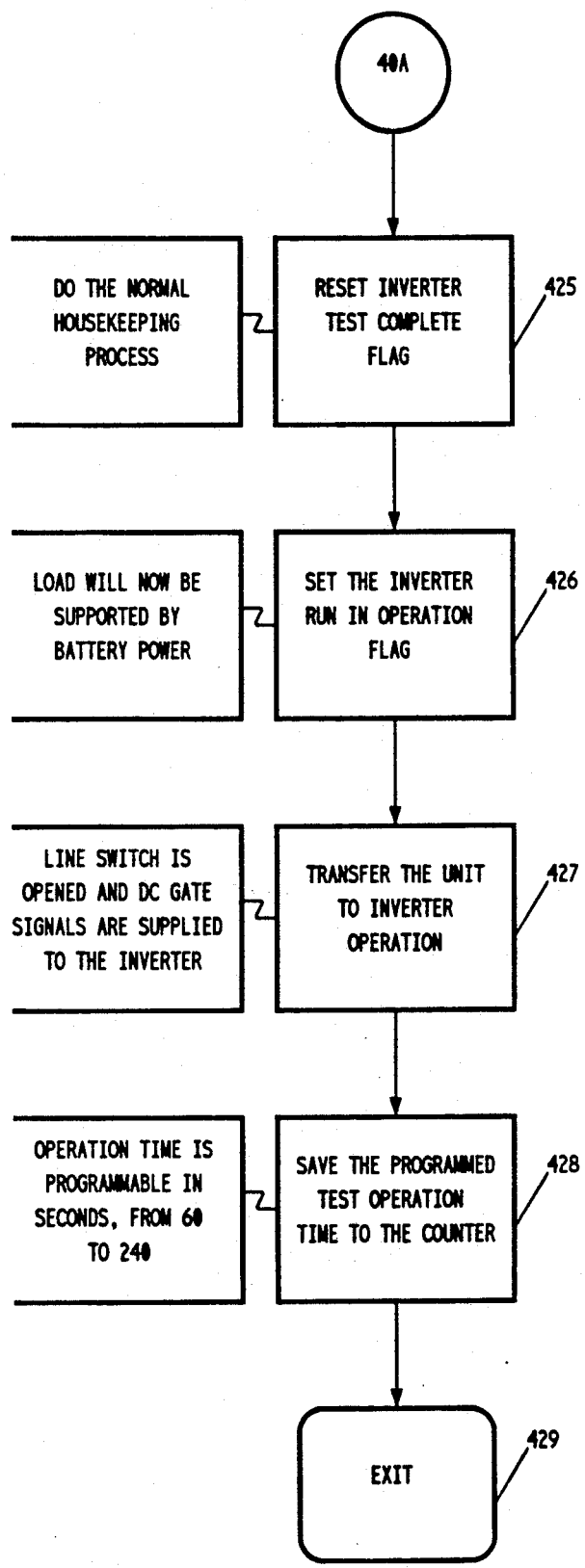

Under normal conditions, the inverter check alarm flag will not be set when tested at 420 and program flow will continue as shown in FIG. 40. First the inverter test complete flag is reset at 425, which is a flag used to signal that the adaptive inverter test cycle that was requested by the adaptive battery test has been completed. Next, the control flag that is used by the adaptive battery test to determine that the inverter run cycle has begun is set at 426. The UPS 50 is then transferred to inverter operation, that is, the power from the AC power line is disconnected from the transformer by opening the switch 82, and full inverter operation supplying power from the battery is used to provide the power requirements for the load. A user programmable value which controls the number of seconds that the test will operate is then copied to the test operation counter at 428, and program flow then exits and returns to the 120 Hz interrupt routine.

After another second has elapsed the 120 Hz interrupt will again call the adaptive battery test routines, with program flow beginning as shown in FIG. 31. Because the adaptive battery test is in operation, program flow is redirected to the routine as shown in FIG. 38. The control flag which indicates that the inverter run operation cycle has begun is set, which again redirects the program flow, this time to the routine shown in FIG. 41.

Figure 41:
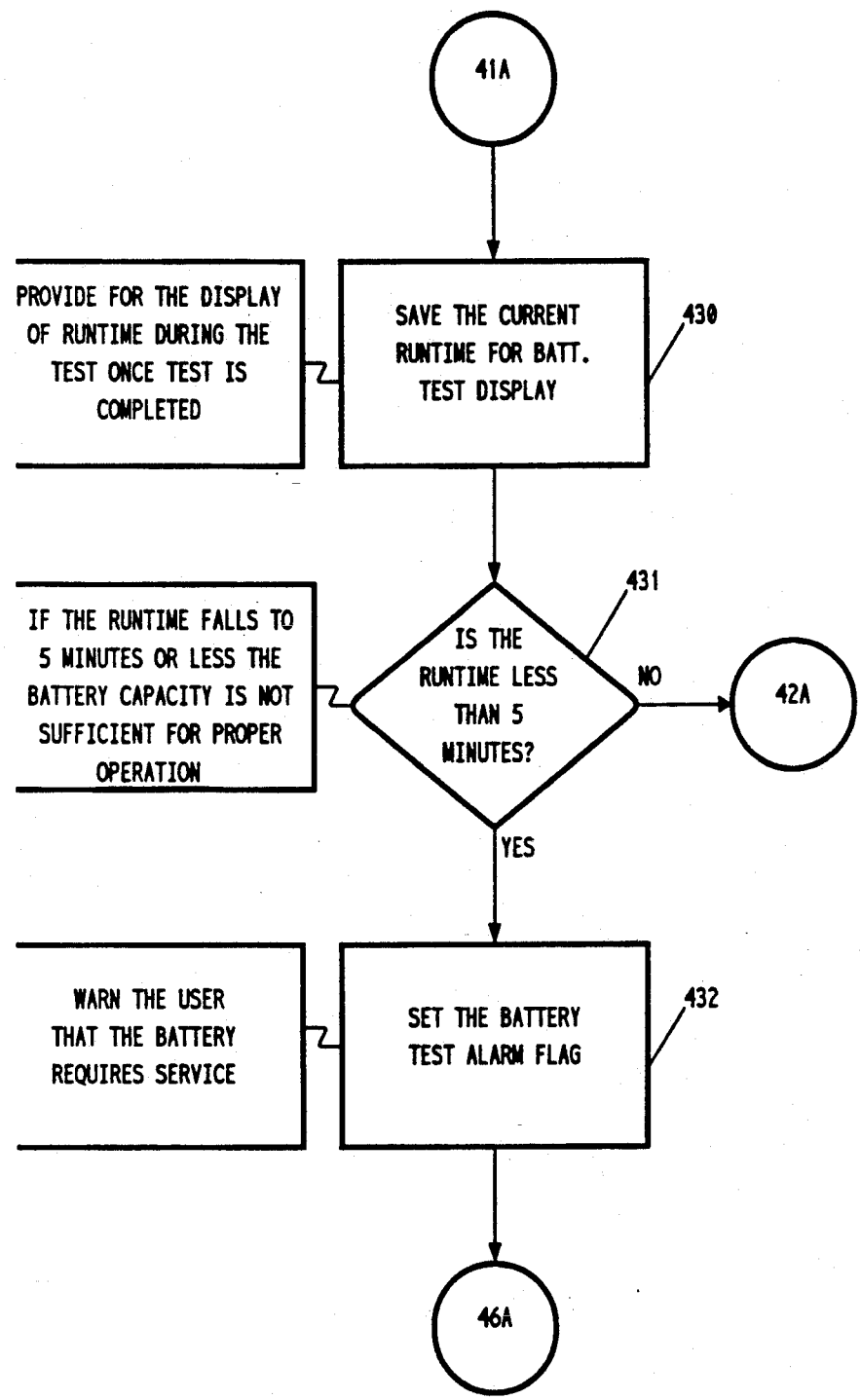
Figure 42:
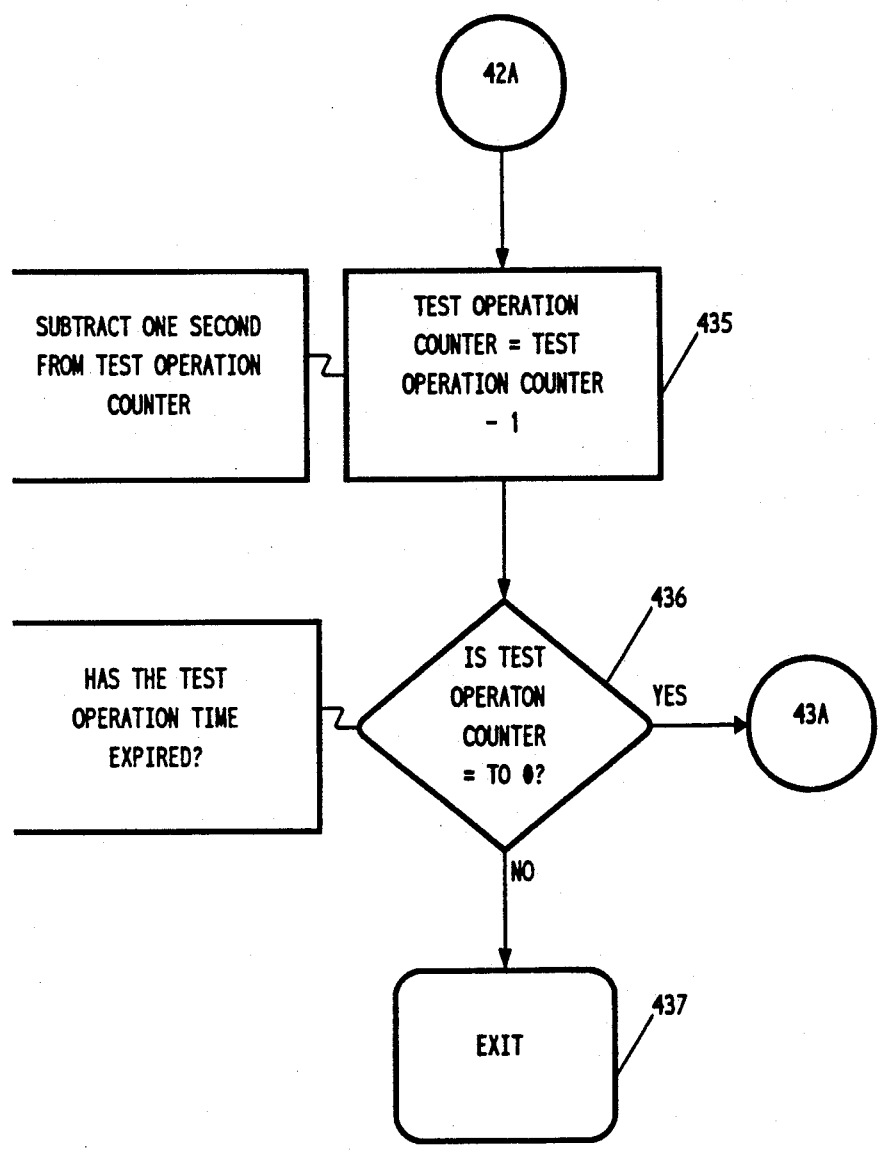
Figure 43:
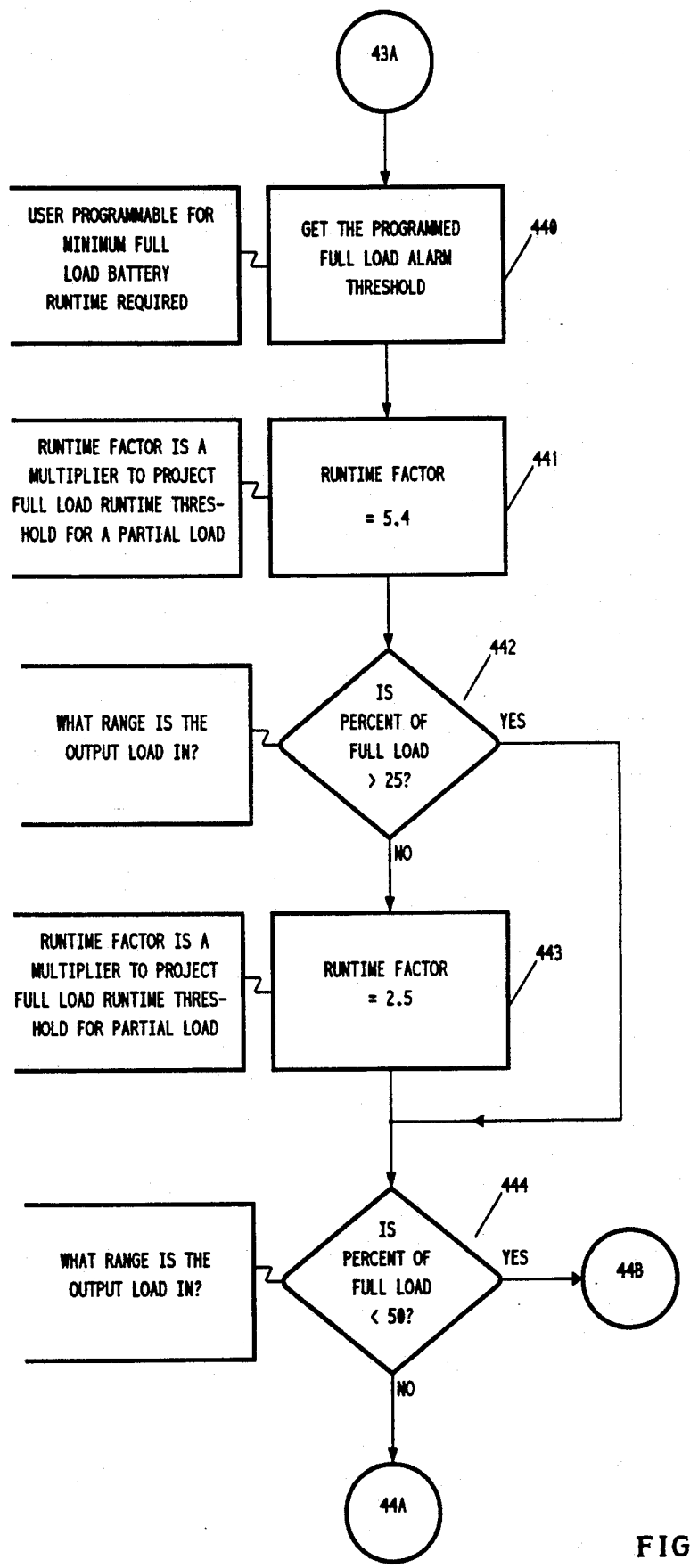

The first operation performed by the microprocessor as shown in FIG. 41 is to save the dynamic run time value which was calculated just prior to entering the adaptive battery test routines; this run time value is saved to a RAM location which is only updated by the adaptive battery test routines. This function is carried out at the block 430 in FIG. 1 so that the run time at the end of the test cycle may be displayed through the user interface. Next, the current run time is compared against the minimum allowable value, which may be, for example, 5 minutes, as shown at block 431. If the current run time is equal to or less than 5 minutes the test cycle has failed and the battery test alarm flag is set at 432. This alarm flag alerts the user that the battery requires service, and software control is transferred to the routine shown in FIG. 46. If the current run time is greater than the 5 minute minimum, software flow control continues with routines as shown in FIG. 42. The test operation counter, which controls how long the inverter operation is carried out, is decremented by 1 second at 435. The test operation counter value is then compared to a value of zero at 436, which, if it is found to equal zero, indicates that the operation time has expired and the program control continues on as shown in FIG. 43. If the test operation counter has not reached zero, the program exits and program control is returned to the 120 Hz interrupt routine set forth in FIG. 37.

Figure 44:
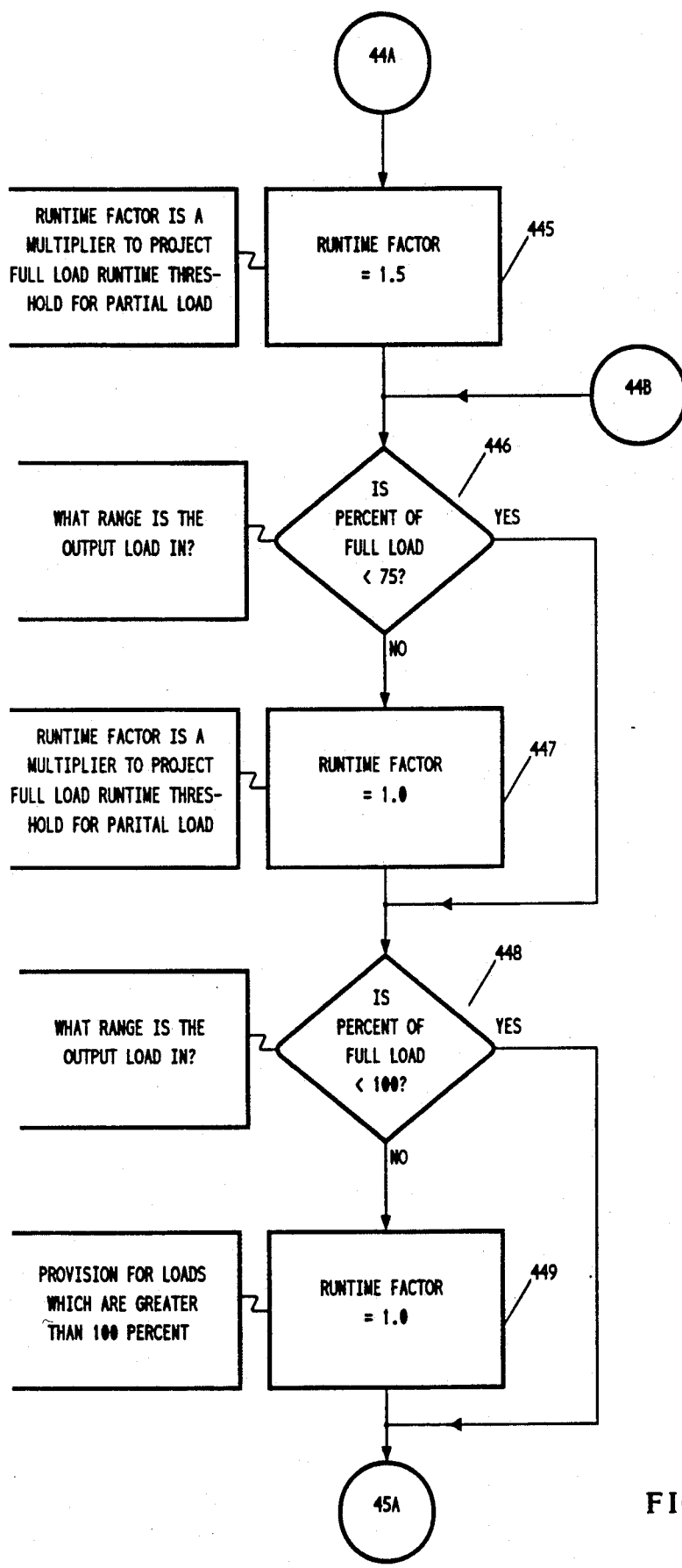
Figure 45:
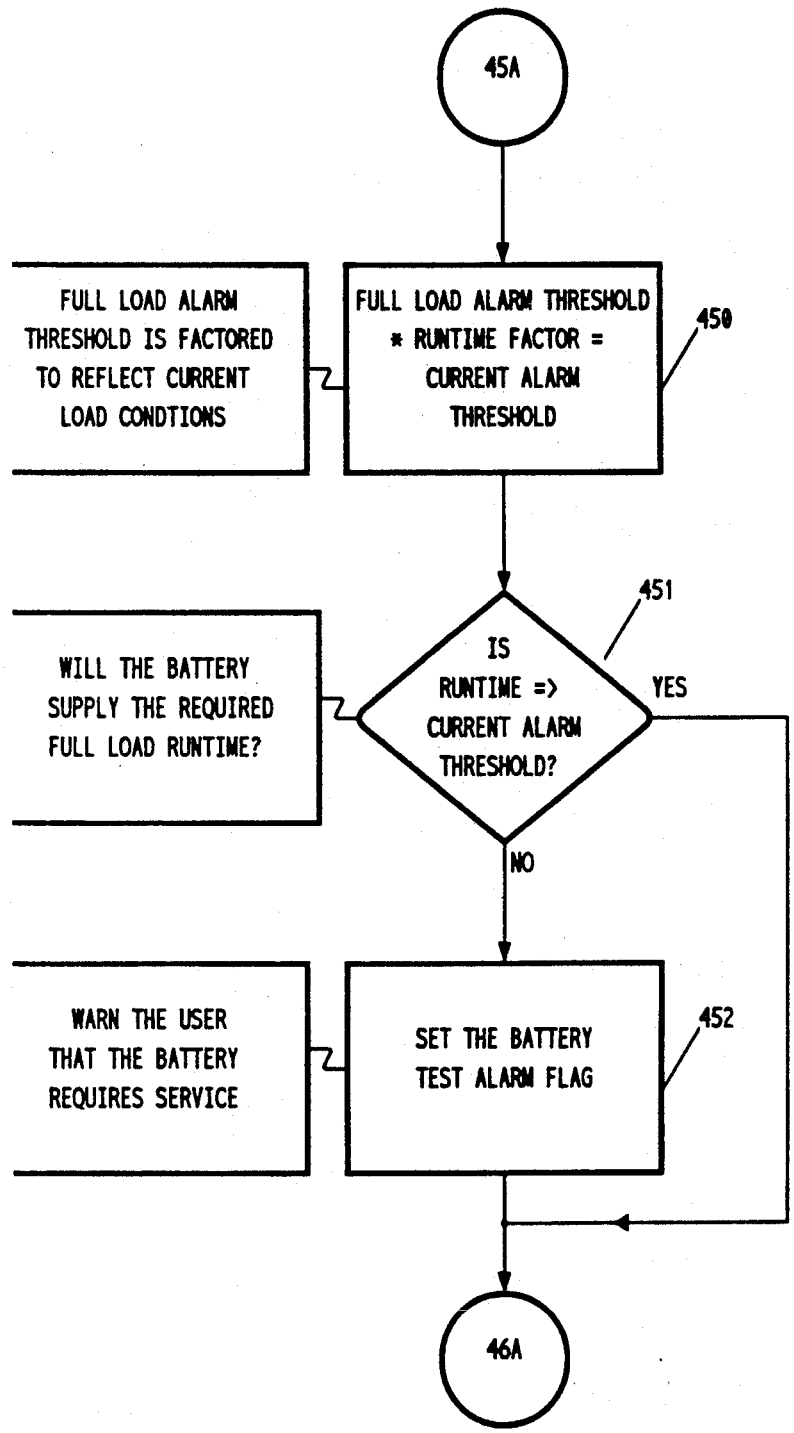

When the test operation counter reaches zero, as shown in FIG. 43, the user programmed full output alarm threshold is retrieved from RAM at 440. The threshold is the minimum required battery operation time at full output load. A typical preset default value may be 70% of the three year old battery capacity. The present output load for the UPS unit is then used to find a value which is the full load run time threshold value scaled for an output load which is less than full load. A scale factor is also provided if the load is greater than 100%. This is done as illustrated in FIGS. 43 and 44 by initially setting the run time factor to a predetermined number, e.g., 5.4, as shown in 441 and then testing to determine whether the percent of full load is less than 25% at 442. If not, the run time factor is set equal to 2.5 and in both cases, the program then continues to determine whether the percent of full load is less than 50% at 444. If so, program control enters the flow diagram of FIG. 44 at 44B and if not, it enters the routine at 44A. Entering at 44A, the run time factor is set equal to 1.5 at 445. If the program enters at 44B, the run time factor is left at 2.5. The program then checks to determine if the percent of full load is less than 75% at 446 and if not, the run time factor is set equal to 1.0 at 447. In either case the program thereafter goes on to determine if the percent of full load is less than 100% at 448 and if so, the run time factor is set equal to 1.0 and in either case the program then continues as shown in FIG. 45. At this point, the proper scaling factor for the load has been determined.

Figure 46:
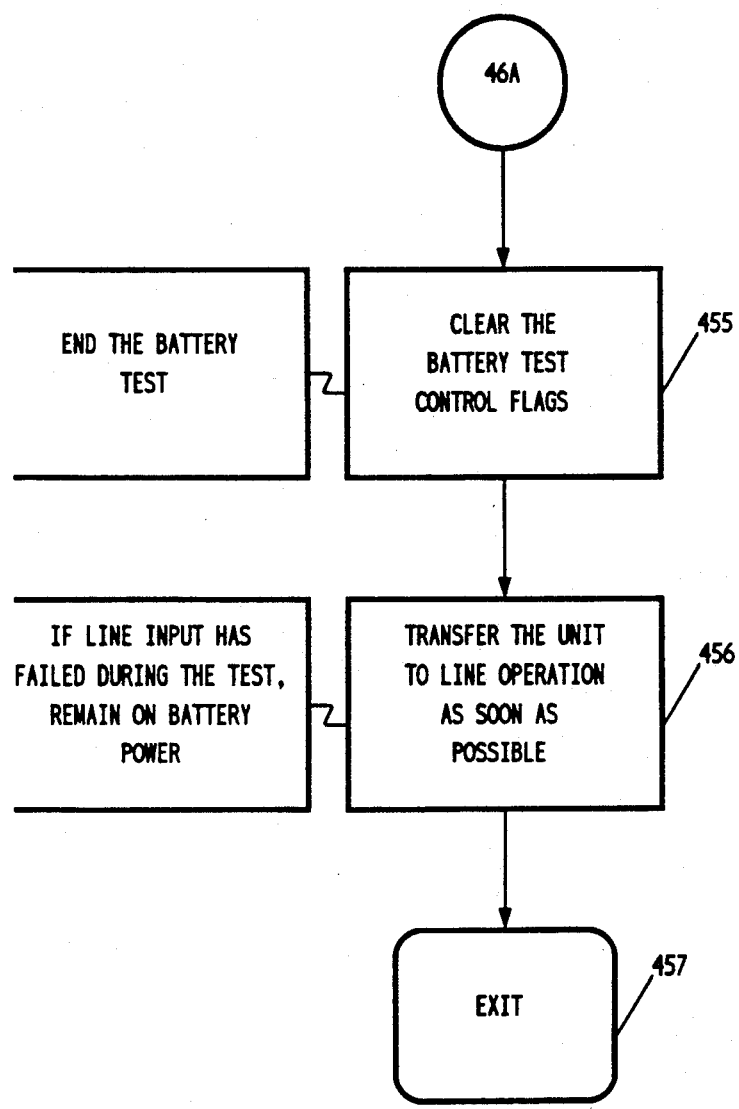

Once the proper scaling factor is determined, the product of it and the alarm threshold can be used to determine the actual alarm point, as shown at 450 in FIG. 45. The current value of run time is the compared at 451 to the actual scaled alarm point to determine if the test has passed or failed. If the run time is equal to or greater than the scaled alarm point, the test is passed and program flow continues as shown in FIG. 46. If the current run time is found at 451 to be less than the scaled alarmed set point, the test has failed. A flag in the alarm register is then set at 452 which will alert the user to the battery service requirement. Thereafter the program continues as shown in FIG. 46. Upon entering the procedure shown in FIG. 46, the battery test control flags are cleared or reset at 455 and an inverter to line transfer is forced to occur at 456 as soon as possible. If the current line conditions are such that the inverter operation must continue, the line transfer will be delayed until proper conditions are met. If the line did not fail during the test cycle, the phase locked loop remains locked to the line input and the transfer to line power is no more than one second after the test cycle has ended. At this point, the battery test is complete and the program is exited at 457.

It is understood that the invention is not confined to the particular embodiments set forth herein as illustrative, but embraces such modified forms thereof as come within the scope of the following claims.

What is claimed is:

1. A method for testing an inverter which receives power from a DC source such as a battery and which is adapted to provide an AC output voltage from the inverter by switching the polarity of the voltage from the DC source, comprising the steps of:

(a) coupling the output of the inverter to a power system which provides an AC voltage to a load so that the voltage provided from the inverter can be applied against the AC voltage waveform from the power system;

(b) turning on the inverter at a test phase corresponding to a chosen point in time after the start of a half-cycle of the AC power system voltage to apply a voltage coupled to the power system which is of the same polarity as the AC voltage waveform at that time and turning off the inverter at a selected point thereafter in the half-cycle of the waveform; and (c) measuring the current flowing from the inverter during the time it is on such that the measured current can be compared with acceptable values of current to determine whether the inverter is properly functioning.

2. The method of claim 1 wherein the peak current is measured and including the step of comparing the measured peak current to a selected maximum allowable peak value and, if the measured peak is greater than the maximum allowable peak value, providing an indication that a failure has occurred.

3. The method of claim 1 wherein the peak current is measured and including the step of comparing the measured peak to a selected maximum allowable peak value, providing a failure indication if the measured peak is above the maximum allowable peak value and if the measured peak is below the maximum allowable peak value, repeating steps (b)–(c) of claim 1 on subsequent waveform cycles of the input waveform with the test phase being decreased by a selected amount for each subsequent repetition of these steps until the measured peak meets or exceeds the selected peak value, and thereafter halting the test, or until the test phase is below a selected minimum test phase and then providing an indication of an inverter failure.

4. The method of claim 1 wherein steps (b) and (c) of claim 1 are carried out at the same test phase in both the positive half-cycle and the negative half-cycle of a cycle of the AC power system waveform and the peak inverter current is measured for each half-cycle, and further including the steps of comparing the peak values from the two half-cycles to determine if they are within a selected range of each other, and if not, providing an indication that the inverter test has failed.

5. The method of claim 4 wherein the step of comparing the measured peaks to each other in the two half-cycles is carried out by repeating the steps of (b)–(c) of claim 1 and reducing the test phase for each repetition until the peak in the first half-cycle (Peak 1) is at or near a selected value and then determining if the peak in the second half-cycle (Peak 2) is inside or outside a chosen range about that selected value, and if outside, providing an indication that the inverter test has failed.

6. The method of claim 5 wherein the selected value for Peak 1 is about 50% of the maximum rated current for the inverter and the range for Peak 2 is between about 25% and 75% of the maximum rated inverter current.

7. The method of claim 1 further including the step of testing the AC voltage from the power system to determine if the voltage is at at least a minimum allowable voltage level which will allow the inverter test to operate properly before the step of turning on the inverter.

8. The method of claim 3 wherein after steps (b) and (c) are carried out during a particular waveform cycle of the AC power system voltage waveform, if the test is to be repeated, delaying the repetition of steps (b)–(c) of claim 1 for a selected period of time spanning many cycles of the AC input waveform.

9. The method of claim 1 wherein, if the inverter has been operated to provide power from the DC source to a load, the carrying out of steps (b)–(c) is prevented for a period of time selected such that a DC source such as a battery can be recharged.

10. A method for testing an inverter which receives power from a DC source such as a battery and which is adapted to provide an AC output voltage from the inverter by switching the polarity of the voltage from the DC source, comprising the steps of:

(a) coupling the output of the inverter to a power system which provides an AC voltage to a load so that the voltage provided from the inverter can be applied against the AC voltage waveform from the power system;

(b) turning on the inverter at a test phase corresponding to a chosen point in time after the start of a half-cycle of the AC power system voltage to apply a voltage coupled to the power system which is of the same polarity as the AC voltage waveform at that time and turning it off at a selected point thereafter in the half-cycle of the waveform, and turning on the inverter during the second half-cycle of the waveform at the same test phase after the start of the second half-cycle of the AC power system warverform to apply a voltage coupled to the power system which is of the same polarity as the AC voltage waveform at that time and turning it off at a selected point thereafter in the second half-cycle of the waveform;

(c) measuring the peak current flowing from the inverter during the time that it is on in each half-cycle to determine a first peak current and a second peak current;

(d) then, determining whether a limit condition has occurred, the limit condition selected from the group consisting of (i) the first peak exceeding a selected maximum allowable peak value, (ii) the second peak exceeding a maximum allowable peak value, (iii) the first and second peaks deviating in value from each other by greater than a selected maximum deviation, (iv) the test phase being smaller than a selected minimum test phase, (v) combinations of limit conditions (i) through (iv), and (vi) the first peak being substantially at a selected value and the second peak being within a selected range about that value of the first peak, and if any of the limit conditions (i) through (v) are found, providing an indication of inverter test failure;

(e) if any limit condition is found, then terminating the inverter test;

(f) if a limit condition is not found, delaying for a selected period of time which spans several cycles of the AC voltage input waveform, then reducing the value of the test phase by a selected amount; and (g) then, repeating steps (b) through (f) until a limit condition is reached.

11. The method of claim 10 wherein the selected maximum allowable peak value for limit condition (i) is about 50% of the maximum rated current for the inverter.

12. The method of claim 10 wherein in the limit condition (vi) at which the first peak is at a selected value and the second peak is within a selected range of the first peak, the selected value for the first peak is about 50% of the maximum rated current for the inverter and the range for the second peak is between about 25% and 75% of the maximum rated inverter current.

13. The method of claim 10 wherein, before the step (b) of turning on the inverter, the additional step of testing the AC line voltage from the power system to determine if it is at at least a minimum allowable voltage level which will allow the inverter test to operate properly, and, if so, proceeding with the remaining steps, and, if not, delaying the further steps until the AC voltage is at the minimum allowable voltage level.

14. The method of claim 10 wherein the period of time between repetitions of the inverter test steps (b) through (f) of claim 10 is selected to be a sufficient to allow a DC source such as a battery to be recharged.

15. The method of claim 10 wherein the steps of measuring the peak current flowing from the inverter includes the steps of sampling the inverter current at periodic points in time during each cycle of inverter test and providing digital data corresponding to the sampled current, and searching the data samples to find the peak value of the data in each half-cycle.

16. The method of claim 10 wherein the initial test phase is set at a point in time which is less than a quarter-cycle from the zero crossing starting the first half-cycle and less than a quarter-cycle from the zero crossing starting the second half-cycle of the waveform, and wherein the inverter is turned off at the quarter-cycle point of the first half-cycle and at the three-quarter cycle point in the second half-cycle.

17. The method of claim 10 wherein the output of the inverter is coupled to the power system through a transformer, the power system connected to the primary of the transformer, the inverter connected to an auxiliary primary of the transformer which is coupled to the power system primary, and wherein the transformer further includes a secondary connected to the load such that power from either the power system or the inverter will be coupled through the transformer to the load.

18. The method of claim 17 wherein the transformer has a split primary connected to the inverter and the inverter has two switches, one connected to each side of the inverter primary, the switches being operable to turn-on to provide alternating polarity of DC voltage to the transformer as reflected to the primary connected to the power system and to the secondary connected to the load.

19. The method of claim 10 wherein the DC power source is a battery and further including the step of recharging the battery between repetitions of steps (b) through (f) of claim 10.

20. A method of testing a battery supplying power to an inverter for an uninterruptible power system which can be selectively coupled to a load, the load also receiving power coupled thereto from an AC power system, comprising the steps of:
(a) disconnecting power from the power system to the load and turning on the inverter to provide power from the battery through the inverter to the load;
(b) while the inverter is running, measuring the battery voltage;
(c) then, turning off the inverter and reconnecting power from the power system to the load;
(d) calculating the remaining run time of the battery based on the measured battery voltage, the rated ampere hour capacity of the battery, the full charge voltage of the battery, and the minimum allowable battery voltage at which power can be provided from the battery to the load; and
(e) providing a low battery indication if the calculated remaining run time is less than a selected value.

21. The method of claim 20 wherein the power being drawn through the inverter from the battery during the time the inverter is turned on is measured and compared to a selected full load power level, and providing a run time value for the battery that is corrected to indicate the length of the battery run time if the battery is required to operate at full load, and comparing the full load battery run time value with a full load battery run time threshold to determine if the remaining battery run time exceeds the threshold, and, if not, providing an indication of low battery run time.

22. The method of claim 20 wherein the remaining inverter run time which can be provided from the battery under load conditions is calculated in accordance with the following expression:

$$T_{IR} = \frac{K \times B_C \times (V_{DC} - V_{BL})^2}{(V_{FC} - V_{DC}) \times (P_{LD} + P_{LS})}$$

where;
$T_{IR}$ is the calculated remaining run time of the inverter,
K is an experimentally determined constant,
$B_C$ is the rated ampere hour capacity of the battery,
$V_{DC}$ is the measured DC output voltage from the battery,
$V_{BL}$ is the predetermined low battery voltage set point at which the battery should no longer provide power,
$V_{FC}$ is the full charge battery voltage,
$P_{LD}$ is a calculated power drawn by the load in watts, and
$P_{LS}$ is the loss in watts in the inverter.

23. The method of claim 20 wherein steps (a) through (e) of claim 20 are carried out repetitively at periodic points in time which are sufficiently far apart to allow substantial recharge of the battery between tests, and including the step of recharging the battery between tests, and wherein before each repetition, the additional step of testing the inverter is carried out to determine whether or not there is an inverter failure, and, if so, the battery test sequence is delayed until the inverter is subsequently tested and found to be operating properly.

24. The method of claim 23 wherein the step of testing the inverter is carried out by:
(a) coupling the output of the inverter to the power system while it is providing an AC voltage to the load so that the voltage provided from the inverter can be applied against the AC voltage waveform from the power system;
(b) turning on the inverter at a test phase corresponding to a chosen point in time after the start of a half-cycle of the AC power system voltage to apply a voltage coupled to the power system which is of the same polarity as the AC voltage waveform at that time and turning it off at a selected point thereafter in the half-cycle of the waveform, and turning on the inverter during the second half-cycle of the waveform at the same test phase after the start of the second half-cycle of the AC power system waveform to apply a voltage coupled to the power system which is of the same polarity as the AC voltage waveform at that time and turning it off at a selected point thereafter in the second half-cycle of the waveform;

(c) measuring the peak current flowing from the inverter during the time that it is on in each half-cycle to determine a first peak current and a second peak current;

(d) then, determining whether a limit condition has occurred, the limit condition selected from the group consisting of (i) the first peak exceeding a selected maximum allowable peak value, (ii) the second peak exceeding a maximum allowable peak value, (iii) the first and second peaks deviating in value from each other by greater than a selected maximum deviation, (iv) the test phase being smaller than a selected minimum test phase, (v) combinations of limit conditions (i) through (iv), and (vi) the first peak being substantially at a selected value and the second peak being within a selected range about that value of the first peak, and, if any of the limit conditions (i) through (v) are found, providing an indication of inverter test failure;

(e) if any limit condition is found, then terminating the inverter test;

(f) if a limit condition is not found, delaying for a selected period of time which spans several cycles of the AC voltage input waveform, then reducing the value of the test phase by a selected amount; and (g) then, repeating steps (b) through (f) until a limit condition is reached.

25. The method of claim 24 wherein the selected maximum allowable peak value for limit condition (i) is about 50% of the maximum rated current for the inverter.

26. The method of claim 24 wherein in the limit condition (vi) at which the first peak is at a selected value and the second peak is within a selected range of the first peak, the selected value for the first peak is about 50% of the maximum rated current for the inverter and the range for the second peak is between about 25% and 75% of the maximum rated inverter current.

27. The method of claim 24 wherein, before the step (b) of turning on the inverter, the additional step of testing the AC line voltage from the power system to determine if it is at at least a minimum allowable voltage level which will allow the inverter test to operate properly, and, if so, proceeding with the remaining steps, and, if not, delaying the further steps until the AC voltage is at the minimum allowable voltage level.

28. The method of claim 24 wherein the period of time between repetitions of the inverter test steps (b) through (f) of claim 24 is selected to be a sufficient to allow a DC source such as a battery to be recharged.

29. The method of claim 24 wherein the initial test phase is set at a point in time which is less than a quarter-cycle from the zero crossing starting the first half-cycle and less than a quarter-cycle from the zero crossing starting the second half-cycle of the waveform, and wherein the inverter is turned off at the quarter-cycle point of the first half-cycle and at the three-quarter cycle point in the second half-cycle.

30. An improved uninterruptible power system of the type having a transformer with a primary connectable to an AC power system, a secondary connectable to a load, and an auxiliary primary, an inverter connected to the auxiliary primary and a battery supplying DC power to the inverter, the inverter adapted to switch to provide alternating polarity of the battery voltage across the auxiliary primary to provide AC output power at the secondary to supply the load when power from the AC power system is not available, the improvement comprising:

(a) control means for turning on the inverter to test the inverter while AC power is available from the AC power source at a test phase corresponding to a chosen point in time after the start of a half-cycle of the AC power system voltage to apply a voltage across the transformer which is of the same polarity as the AC voltage waveform at that time and turning off the inverter at a selected point thereafter in the half-cycle of the waveform; and (b) means for measuring the current flowing from the inverter during the time that it is on, the control means comparing the measured current with acceptable values of current to determine whether the inverter is properly functioning.

31. The uninterruptible power system of claim 30 wherein the transformer is a ferroresonant transformer having a secondary connected in a ferroresonant circuit.

32. The uninterruptible power system of claim 30 wherein the inverter includes two switches connected to opposite sides of the auxiliary primary and the battery is connected to a center tap of the auxiliary primary, the switches being connected so that when turned on each will provide current from the battery flowing through the auxiliary primary in opposite directions to provide an AC voltage across the secondary as the switches are alternately turned on and off.

33. The uninterruptible power system of claim 32 including a shunt resistance in series with the battery through which the battery current flows and wherein the means for measuring the current measures the voltage across the shunt resistance and determines the peak value of the voltage to thereby determine the peak value of the current.

34. The uninterruptible power system of claim 30 further including means responsive to the control means for selectively disconnecting the AC power system voltage from the primary of the transformer, and wherein the control means periodically disconnects the power from the AC power system to the transformer and turns on the inverter to provide power from the battery to the load for a selected period of time, and thereafter reconnects the AC power system power to the primary to supply the load, and including means for measuring the voltage across the battery while the inverter is operating, and the control means determining from this voltage the remaining run-time of the battery at a selected load condition.

35. The uninterruptible power system of claim 34 wherein the control means tests the inverter to determine if it is properly functioning before a battery test is carried out and allows the battery test to be carried out only if the inverter has passed the inverter test.

36. The uninterruptible power system of claim 30 wherein the control means compares the peak of the measured current to a selected maximum allowable peak value and, if the measured peak is greater than the maximum allowable peak value, provides an indication that a failure has occurred.

37. The uninterruptible power system of claim 30 wherein the control means compares the peak of measured current to a selected maximum allowable peak value, provides a failure indication if the measured peak is above the maximum allowable peak value, and if the measured peak is below the maximum allowable peak value, repeats the turn on of the inverter and measuring of peak current on subsequent waveform cycles of the input waveform with the test phase being decreased by a selected amount for each subsequent repetition of these steps until the measured peak meets or exceeds the selected maximum allowable peak value, and thereafter halts the test, or until the test phase is below a selected minimum test phase and then provides an indication of an inverter failure.

38. The uninterruptible power system of claim 30 wherein the control means turns on the inverter at the same test phase in both the positive half-cycle and the negative half-cycle of a cycle of the AC power system waveform and the peak inverter current is measured for each half-cycle, and further compares the peak values from the two half-cycles to determine if they are within a selected range, and if not, provides an indication that the inverter test has failed.

39. The uninterruptible power system of claim 38 wherein the control means repeats the turn on and off of the inverter for additional AC input waveform cycles and reduces the test phase for each repetition until the peak in the first half-cycle (Peak 1) is at or near a selected value and then determines if the peak in the second half-cycle (Peak 2) is inside or outside a chosen range, and if outside, provides an indication that the inverter test has failed.

40. The uninterruptible power system of claim 39 wherein the selected value for Peak 1 is about 50% of the maximum rated current for the inverter and the range for Peak 2 is between about 25% and 75% of the maximum rated inverter current.

41. The uninterruptible power system of claim 30 further including means for testing the AC voltage from the power system to determine if the voltage is at at least a minimum allowable voltage level which will allow the inverter test to operate properly before the step of turning on the inverter.

42. The uninterruptible power system of claim 37 wherein during a particular waveform cycle of the AC power system voltage waveform, if the test is to be repeated, the control means delays the repetition of the test for a selected period of time spanning many cycles of the AC input waveform.

43. The uninterruptible power system of claim 30 wherein, if the inverter has been operated to provide power from the DC source to a load, the control means delays a repetition of the turn-on of the inverter, to test the inverter, for a period of time selected such that a DC source such as a battery can be recharged.

* * * * *